United States Patent
Bae et al.

(10) Patent No.: US 9,269,720 B1
(45) Date of Patent: Feb. 23, 2016

(54) METHODS OF FABRICATING SEMICONDUCTOR DEVICES

(71) Applicant: Samsung Electronics Co., Ltd., Suwon-si, Gyeonggi-do (KR)

(72) Inventors: Jin-woo Bae, Yongin-si (KR); Byoung-ho Kwon, Hwaseong-si (KR); Jong-hyuk Park, Hwaseong-si (KR); Hye-sung Park, Anyang-si (KR); Jun-seok Lee, Suwon-si (KR); Ki-vin Im, Seongnam-si (KR); Hee-sook Cheon, Suwon-si (KR); In-seak Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/729,111

(22) Filed: Jun. 3, 2015

(30) Foreign Application Priority Data

Sep. 16, 2014 (KR) .......................... 10-2014-0122939

(51) Int. Cl.
| | | |
|---|---|---|
| *H01L 27/10* | (2006.01) | |
| *H01L 27/115* | (2006.01) | |
| *H01L 29/66* | (2006.01) | |
| *H01L 21/768* | (2006.01) | |
| *H01L 21/3105* | (2006.01) | |
| *H01L 21/311* | (2006.01) | |
| *H01L 21/31* | (2006.01) | |
| *H01L 21/3213* | (2006.01) | |
| *H01L 21/3205* | (2006.01) | |

(Continued)

(52) U.S. Cl.
CPC .......... *H01L 27/11573* (2013.01); *H01L 21/31* (2013.01); *H01L 21/31053* (2013.01); *H01L 21/31138* (2013.01); *H01L 21/32051* (2013.01);

(Continued)

(58) Field of Classification Search
CPC ............ H01L 21/31144; H01L 21/764; H01L 21/76807; H01L 21/76834; H01L 21/02123; H01L 21/02164; H01L 21/02222; H01L 21/02271; H01L 21/02282; H01L 21/31116; H01L 21/31122; H01L 21/31138; H01L 21/312
USPC ................... 257/E21.256, E21.257, E21.259, 257/E21.263, E21.575, E21.579, E21.627, 257/E21.641, E21.648, E21.65, E21.658, 257/316, 401, 506; 438/233, 241, 259, 397, 438/404, 523, 533, 586, 597, 618, 624, 626, 438/631, 634, 666, 781, 791, 98

See application file for complete search history.

(56) References Cited

U.S. PATENT DOCUMENTS

| | | | |
|---|---|---|---|
| 6,168,992 B1 * | 1/2001 | Lee ................... | H01L 27/10852 257/E21.019 |
| 6,656,532 B2 | 12/2003 | Forester | |

(Continued)

FOREIGN PATENT DOCUMENTS

| | | |
|---|---|---|
| JP | 10-116908 | 5/1998 |
| KR | 1020070060347 A | 6/2007 |

(Continued)

*Primary Examiner* — Stephen W Smoot
*Assistant Examiner* — Edward Chin
(74) *Attorney, Agent, or Firm* — Myers Bigel Sibley, P.A.

(57) ABSTRACT

A method of fabricating a semiconductor device includes providing a substrate having a cell region and a peripheral circuit region. A plurality of bit line structures are formed on the substrate in the cell region, and a gate structure having the same structure as each of the bit line structures is formed on the substrate in the peripheral circuit region. A spacer is formed on sidewalls of the bit line structures and the gate structure. The bit line structures extend in a first direction and are spaced apart from each other in a second direction that is perpendicular to the first direction by first grooves that extend in the first direction. A sacrificial layer is formed to fill the first grooves and to cover top surfaces of the bit line structures and the gate structure. The sacrificial layer is planarized until the top surfaces of the bit line structures and the gate structure are exposed.

20 Claims, 53 Drawing Sheets

(52) U.S. Cl.
CPC .... *H01L 21/32135* (2013.01); *H01L 21/76834* (2013.01); *H01L 21/76877* (2013.01); *H01L 21/76895* (2013.01); *H01L 27/11582* (2013.01); *H01L 29/66833* (2013.01)

(56) References Cited

U.S. PATENT DOCUMENTS

| | | | |
|---|---|---|---|
| 7,265,007 B2 * | 9/2007 | Harter | H01L 21/76813 257/E21.507 |
| 7,928,003 B2 | 4/2011 | Naik | |
| 8,637,364 B2 | 1/2014 | Ueda | |
| 8,642,464 B2 | 2/2014 | Kagawa | |
| 2007/0158688 A1 * | 7/2007 | Caspary | H01L 27/10 257/208 |
| 2014/0061757 A1 | 3/2014 | Kim et al. | |
| 2014/0084384 A1 | 3/2014 | Choi et al. | |

FOREIGN PATENT DOCUMENTS

| | | |
|---|---|---|
| KR | 1020070088866 A | 8/2007 |
| KR | 1020080004211 A | 1/2008 |
| KR | 1020140030501 A | 3/2014 |
| KR | 1020140032238 A | 3/2014 |

* cited by examiner

A-A'

A-A'

C-C'

A-A'

A-A'

C-C'

A-A'

A-A'

A-A'

A-A'

A-A'

A-A'

C-C'

A-A'

A-A'

METHODS OF FABRICATING SEMICONDUCTOR DEVICES

CROSS-REFERENCE TO RELATED APPLICATION

This application claims the benefit of Korean Patent Application No. 10-2014-0122939, filed on Sep. 16, 2014, in the Korean Intellectual Property Office, the disclosure of which is incorporated herein in its entirety by reference.

BACKGROUND

The inventive concepts disclosed herein relate to methods of fabricating a semiconductor device, and more particularly, to methods of fabricating a semiconductor device including a cell region and a peripheral circuit region are formed, and that have buried contacts and a plurality of intersecting interconnection lines.

As semiconductor devices become more highly integrated, the design rule of semiconductor devices has been reduced. That is, as the sizes of semiconductor devices are scaled down, processes for forming interconnection lines and buried contacts between the interconnection lines have become more complicated, which makes it increasingly more difficult to fabricate semiconductor devices. For example, if the integration density of semiconductor devices increases, a level difference between a cell region and a peripheral circuit region may also increase, which may cause abnormal patterns to be formed in subsequent processes.

SUMMARY

The inventive concept provides methods of fabricating a semiconductor device.

According to an aspect of the inventive concept, there is provided a method of fabricating a semiconductor device. The method includes providing a substrate having a cell region and a peripheral circuit region. A plurality of bit line structures are formed on the substrate in the cell region, and a gate structure having the same structure as each of the bit line structures is formed on the substrate in the peripheral circuit region. The plurality of bit line structures are formed to extend in a first direction and are spaced apart from each other in a second direction perpendicular to the first direction. The plurality of bit line structures are separated from each other by first grooves that extend in the first direction. Spacers are formed on sidewalls of the bit line structures and sidewalls of the gate structure. A sacrificial layer is formed in the first grooves and covers top surfaces of the bit line structures and the gate structure. The sacrificial layer is planarized until the top surfaces of the bit line structures and the gate structure are exposed.

In some embodiments, the sacrificial layer may be planarized by a chemical mechanical polishing (CMP) process.

In some embodiments, the CMP process may be performed with a slurry composition used to polish an organic material layer, and the slurry composition may include an abrasive agent having a weight ratio of about 0.001 wt % to about 5 wt %, an oxidizer having a weight ratio of about 0.1 wt % to about 5 wt %, an abrasive adjuster having a weight ratio of about 0 wt % to about 5 wt %, a surfactant having a weight ratio of about 0 wt % to about 3 wt %, a pH adjuster having a weight ratio of about 0 wt % to about 3 wt %, and de-ionized water having a weight ratio of about 79 wt % to about 99.889 wt %.

In some embodiments, the slurry composition may have a pH of about 2.0 to about 5.0.

In some embodiments, the sacrificial layer may be an organic compound material that includes a hydrocarbon compound material containing an aromatic ring or includes a derivative of the hydrocarbon compound material.

In some embodiments, the sacrificial layer may have a carbon content of about 85 wt % to about 99 wt % on the basis of a total weight of the organic compound material constituting the sacrificial layer.

In some embodiments, the forming the sacrificial layer may include coating a spin-on hardmask (SOH) material with a spin coating process to form an SOH layer and curing the SOH layer using a baking process.

In some embodiments, the baking process may be performed at a temperature of about 300 degrees Celsius to about 550 degrees Celsius.

In some embodiments, the spacer may include a first spacer formed on sidewalls of the bit line structures and a second spacer formed on the first spacer. The first spacer may be formed of a nitride material, and the second spacer may be formed of an oxide material.

In some embodiments, the method may further include patterning the planarized sacrificial layer to form a plurality of second grooves which are arrayed to separate from each other in the first direction, forming fence insulation layers on sidewalls of the second grooves, and removing the planarized sacrificial layer to form a plurality of third grooves between the fence insulation layers. The plurality of third grooves may be formed to separate from each other in the first direction and in the second direction.

In some embodiments, the removing the planarized sacrificial layer may be performed using an ashing process or a strip process.

In some embodiments, the method may further include forming a doped polysilicon layer on the resultant including the third grooves and in the third grooves, etching back the doped polysilicon layer to form polysilicon patterns in the third grooves, and forming a metal layer that covers the bit line structures, the spacer and the fence insulation layers. The doped polysilicon layer may be electrically connected to the substrate.

According to another aspect of the inventive concept, there is provided a method of fabricating a semiconductor device. The method includes preparing a substrate having a cell region and a peripheral circuit region. A plurality of bit line structures are formed on the substrate in the cell region and a gate structure having the same structure as each of the bit line structures is formed on the substrate in the peripheral circuit region. The plurality of bit line structures extend in a first direction and are spaced apart from each other in a second direction perpendicular to the first direction. The plurality of bit line structures are separated from each other by first grooves that extend in the first direction. A multi-layered spacer is formed on sidewalls of the bit line structures and the gate structure. An organic material layer is formed to fill the first grooves and to cover top surfaces of the bit line structures and the gate structure. The organic material layer is planarized using a chemical mechanical polishing (CMP) process to remove a level difference between the cell region and the peripheral circuit region.

In some embodiments, the forming the organic material layer may include coating a spin-on hardmask (SOH) material using a spin coating process to form an SOH layer and curing the SOH layer using a baking process.

In some embodiments, the CMP process may be performed with a slurry composition having a pH of about 2.0 to about 5.0. The slurry composition may include an abrasive agent having a weight ratio of about 0.001 wt % to about 5 wt %, an oxidizer having a weight ratio of about 0.1 wt % to about 5 wt %, an abrasive adjuster having a weight ratio of about 0 wt % to about 5 wt %, a surfactant having a weight ratio of about 0 wt % to about 3 wt %, a pH adjuster having a weight ratio of about 0 wt % to about 3 wt %, and de-ionized water having a weight ratio of about 79 wt % to about 99.889 wt/%.

A method of fabricating a semiconductor device according to further embodiments includes providing a substrate having a cell region and a peripheral circuit region; forming a plurality of bit line structures on the substrate in the cell region and a plurality of gate structures in the peripheral circuit region, wherein the plurality of bit line structures are separated by a plurality of grooves extending in a same direction as the plurality of bit line structures, and wherein the plurality of gate structures have a same height and a different pitch as the plurality of bit line structures; forming a sacrificial layer in the plurality of grooves, wherein the sacrificial layer is on top surfaces of the bit line structures and the gate structure; and planarizing the sacrificial layer until the top surfaces of the bit line structures and the gate structure are exposed.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF-THE EMBODIMENTS

Figure 1:
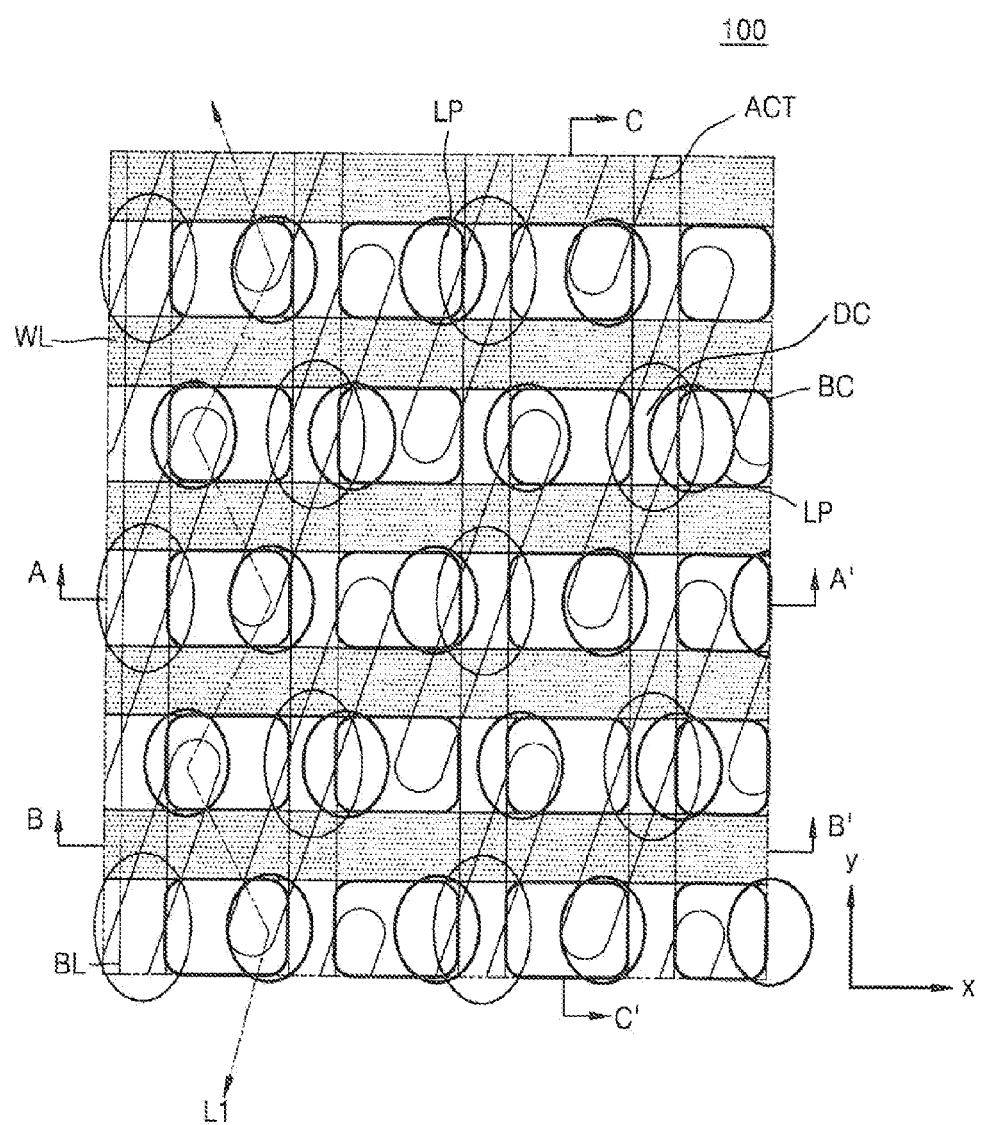
FIG. 1 is a layout diagram of a semiconductor device fabricated according to an embodiment of the inventive concept.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the inventive concept to those skilled in the art. The same reference numerals or the same reference designators denote the same elements throughout the specification. Further, various elements and various regions in the drawings are schematically illustrated. Thus, the inventive concept is not limited to relative sizes or relative spaces of elements illustrated in the accompanying drawings.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept or vice versa.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes", "including", "has" and/or "having," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

FIG. 1 is a layout diagram of a semiconductor device 100 fabricated according to an embodiment of the inventive concept.

Referring to FIG. 1, the semiconductor device 100 may include a plurality of active regions ACT. The active regions ACT may be defined by an isolation layer (see '114' of FIG. 2A) formed in a substrate (see '110' of FIG. 2A). As illustrated in FIG. 1, each of the active regions ACT may be disposed in a bar-shaped form in parallel with a diagonal line or an oblique line.

A plurality of parallel word lines WL or a plurality of gate lines may be disposed to intersect the active regions ACT and to extend in a second direction (i.e., an X-axis direction). The word lines WL may be spaced apart from each other in a first direction (i.e., a Y-axis direction) at equidistant intervals. A width of each word line WL and a distance between the word lines WL may be determined by a design rule. A plurality of parallel bit lines BL may be disposed to extend in the first direction (i.e., the Y-axis direction) perpendicular to the word lines WL. The bit lines BL may be spaced apart from each other by equidistant intervals in the second direction. A width of each bit line BL and a distance between the bit lines BL may be determined by a design rule.

In some embodiments, the bit lines BL may be disposed to be parallel with each other and to have a pitch of 3F, where 'F' refers to a minimum lithographic feature size. In addition, the word lines WL may be disposed to be parallel with each other and to have a pitch of 2F. If the bit lines BL and the word lines WL are disposed to have the aforementioned pitches, the semiconductor device 100 may include a plurality of memory cells, each of which has a unit cell size of $6F^2$.

The semiconductor device 100 may include various contact arrays, for example, direct contacts DC, buried contacts BC and landing pads LP. The direct contacts DC may correspond to contacts for connecting the active regions ACT to the bit lines BL, and the buried contacts BC may correspond to contacts for connecting the active regions ACT to lower electrodes of cell capacitors.

In general, it may be difficult to increase a contact area between the buried contact BC and the active region ACT. Thus, the conductive landing pads LP may be used to increase a contact area between the active region ACT and the buried contact BC as well as a contact area between the buried contact BC and the lower electrode of the cell capacitor. The landing pads LP may be disposed between the active regions ACT and the buried contacts BC. The landing pads LP may also be disposed between the buried contacts BC and the lower electrodes of the cell capacitors. In the present embodiment, the landing pads LP may be disposed between the buried contacts BC and the lower electrodes of the cell capacitors. Accordingly, if the landing pads LP are introduced into the memory cells, a contact resistance value between the active regions ACT and the lower electrodes of the cell capacitors may be reduced.

In the semiconductor device 100, the direct contacts DC may be disposed on central regions of the active regions ACT, and the buried contacts BC may be disposed on both ends of the active regions ACT. Since the buried contacts BC are disposed on both ends of the active regions ACT, the landing pads LP may be disposed to be adjacent to both ends of the active regions ACT and to overlap with portions of the buried contacts BC.

The word lines WL may be buried in the substrate of the semiconductor device 100 and may be disposed to cross the active regions ACT between the direct contacts DC and the buried contacts BC. As illustrated in FIG. 1, the word lines WL may be disposed so that each of the active regions ACT intersects two of the word lines WL. In such a case, because the active regions ACT are parallel with a diagonal line or an oblique line in FIG. 1, the word lines WL may intersect the active regions ACT at a non-right angle. It will be appreciated, however, that the layout shown is exemplary in nature only, and that the semiconductor device 100 may have other layouts.

The direct contacts DC may be line symmetric with respect to the X-axis or the Y-axis. In addition, the buried contacts BC may also be line symmetric with respect to the X-axis or the Y-axis. Thus, the direct contacts DC and the buried contacts BC may be disposed on straight lines which are parallel with the first direction (i.e., the Y-axis direction) or the second direction (i.e., the X-axis direction). However, the buried contacts BC and the direct contacts DC may have other peripheral shapes. Unlike the direct contacts DC and the buried contacts BC, the landing pads LP may be arrayed in a zigzag fashion along the first direction (i.e., the Y-axis direction) in which the bit lines BI, extend. In addition, the landing pads LP arrayed in each of rows parallel with the second direction (i.e., the X-axis direction) may be located at the same sides of the bit lines BL, respectively. For example, the landing pads LP arrayed in each of odd rows may overlap with left sidewalls of the bit lines BL, and the landing pads LP arrayed in each of even rows may overlap with right sidewalls of the bit lines BL.

In some embodiments, when an etch process for forming buried contact openings is performed, a spin on hard mask (SOH) material may be used as a sacrificial layer to increase an etch selectivity during the etch process for forming the buried contact openings. In general, an oxide material may be used as a sacrificial layer during the etch process for forming the buried contact openings. In such a case, the buried contact openings may be formed to have separate hole-shaped openings, respectively. However, according to some embodiments of the inventive concepts, since an SOH material may be used as a sacrificial layer during the etch process for forming the buried contact openings, the buried contact openings may be formed to have line-shaped configurations. Thus, according to the inventive concept, an open failure rate of final buried contact holes may be reduced and a recession incidence rate of the final buried contact holes may also be reduced.

Figure 17:
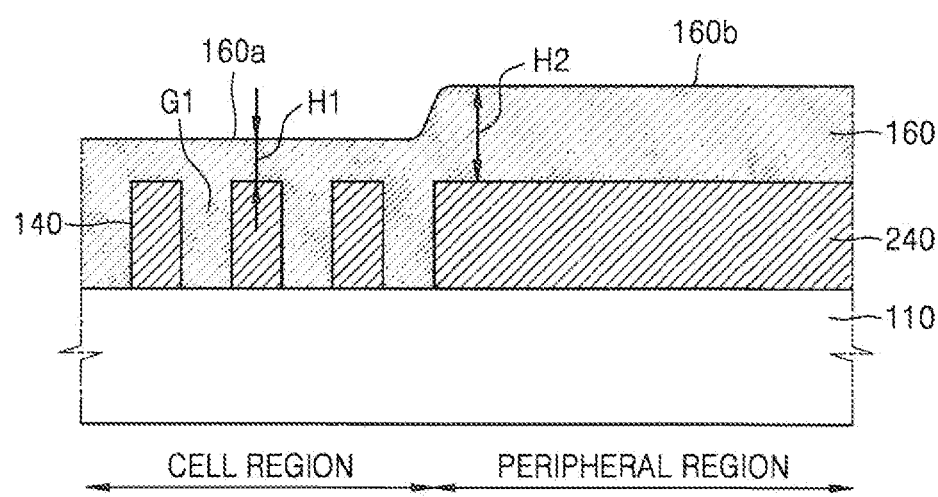
FIG. 17 is a cross-sectional view of a semiconductor device fabricated according to an embodiment of the inventive concept.

As illustrated in FIG. 1, a semiconductor device 100 may include bit line structures arranged in a first direction with a predetermined pitch in a cell region thereof. The semiconductor device 100 may also include transistors formed in a peripheral region that include transistors having gate structures with similar structures as the bit line structures. However, the gate structures in the peripheral region may have a different pitch and/or different spacing between gate structures. Referring to FIG. 17, a semiconductor device 100 may include a plurality of bit line structures 140 in a cell region and at least one gate structure 240 in a peripheral region.

During the formation of the semiconductor device, a sacrificial layer 160 may be formed on the bit line structures 140 and the gate structure 240. If the sacrificial layer 160 in the cell region is formed to have a first thickness H1 on the top surfaces of the bit line structures 140, the sacrificial layer 160 in the peripheral circuit region may be formed to have a second thickness H2, which is greater than the first thickness H1, on the top surface of the gate structure 240. Accordingly, there may be a surface level difference between the sacrificial layer 160 in the cell region and the sacrificial layer 160 in the peripheral circuit region, whereby an upper surface 160a of the sacrificial layer 160 in the cell region is lower than an upper surface 160b of the sacrificial layer 160 in the peripheral region.

The surface level difference between the sacrificial layer 160 in the cell region and the sacrificial layer 160 in the peripheral circuit region may be reduced if the sacrificial layer 160 is formed using a spin coating process, as compared with a case that the sacrificial layer 160 is formed using a chemical vapour deposition (CVD) process. However, even though the sacrificial layer 160 is formed using a spin coating process, the surface level difference between the sacrificial layer 160 in the cell region and the sacrificial layer 160 in the peripheral circuit region may still exist in a highly integrated semiconductor device. This is because the number of the first grooves G1, which are filled with the sacrificial layer 160 in the cell region, increases if the integration density of the semiconductor device increases. In contrast, spaces between the gate structures 240 in the peripheral circuit region may be filled with an insulation layer, for example, an interlayer insulation layer. Thus, a volume of the spaces filled with the sacrificial layer 160 in the peripheral circuit region may be less than a volume of the spaces (i.e., the first grooves G1) filled with the sacrificial layer 160 in the cell region. Accordingly, a surface level of the sacrificial layer 160 in the cell region may be lower than a surface level of the sacrificial layer 160 in the peripheral circuit region.

For the reason described above, a surface level of the sacrificial layer 160 in the cell region may be lower than a surface level of the sacrificial layer 160 in the peripheral circuit region by a difference between the first and second thicknesses H1 and H2. Even if a blanket etch process is applied to the sacrificial layer 160 using a dry etch process, the surface level difference between the cell region and the peripheral circuit region may still exist. This is because an entire surface level of the sacrificial layer 160 may be uniformly lowered by the dry etch process used as the blanket etch process. In addition, if the sacrificial layer 160 remains only in the peripheral circuit region, some patterns in the cell region may be lifted in a subsequent process, which can result in the generation of abnormal patterns.

Figure 2A:
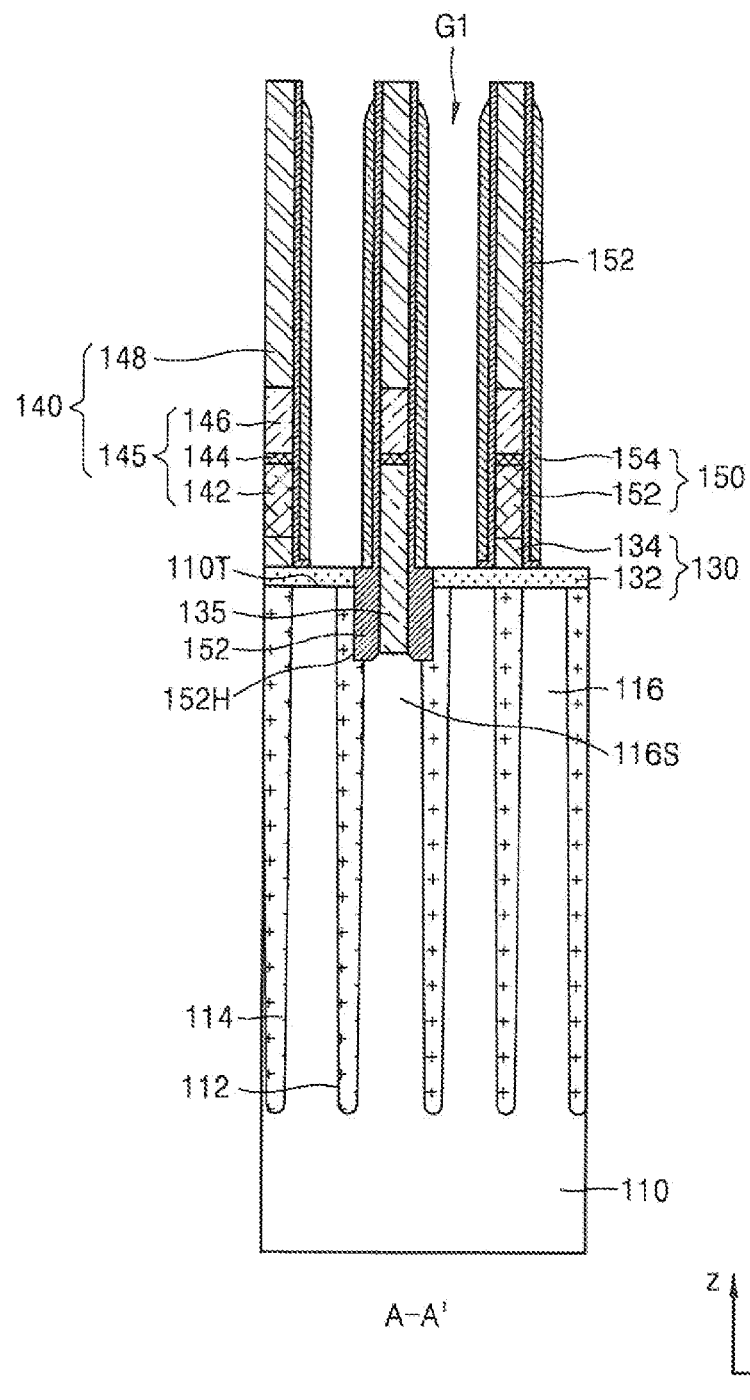
FIGS. 2A to 13C are cross-sectional views illustrating methods of fabricating a semiconductor device according to embodiments of the inventive concept.
Figure 2B:
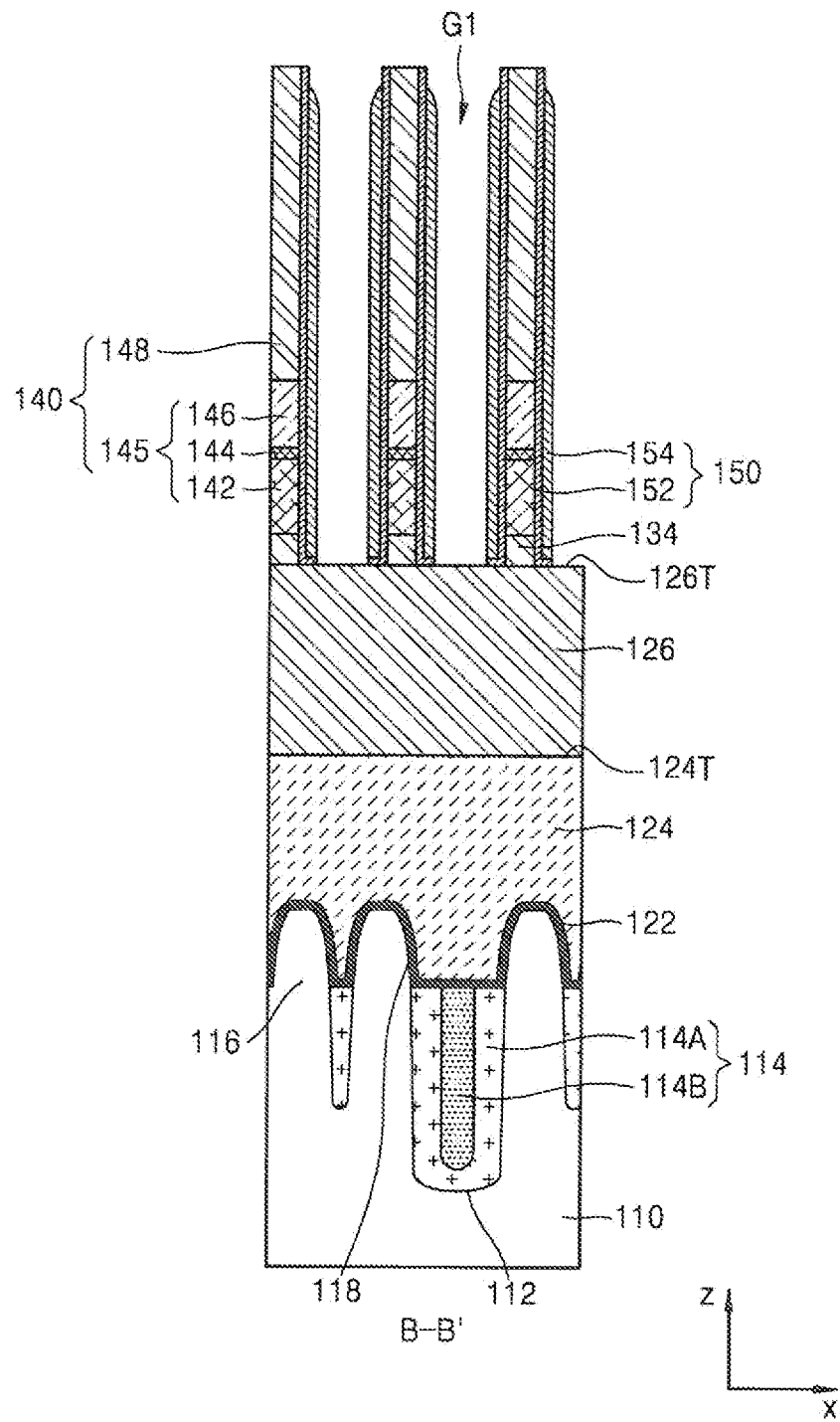
Figure 2C:
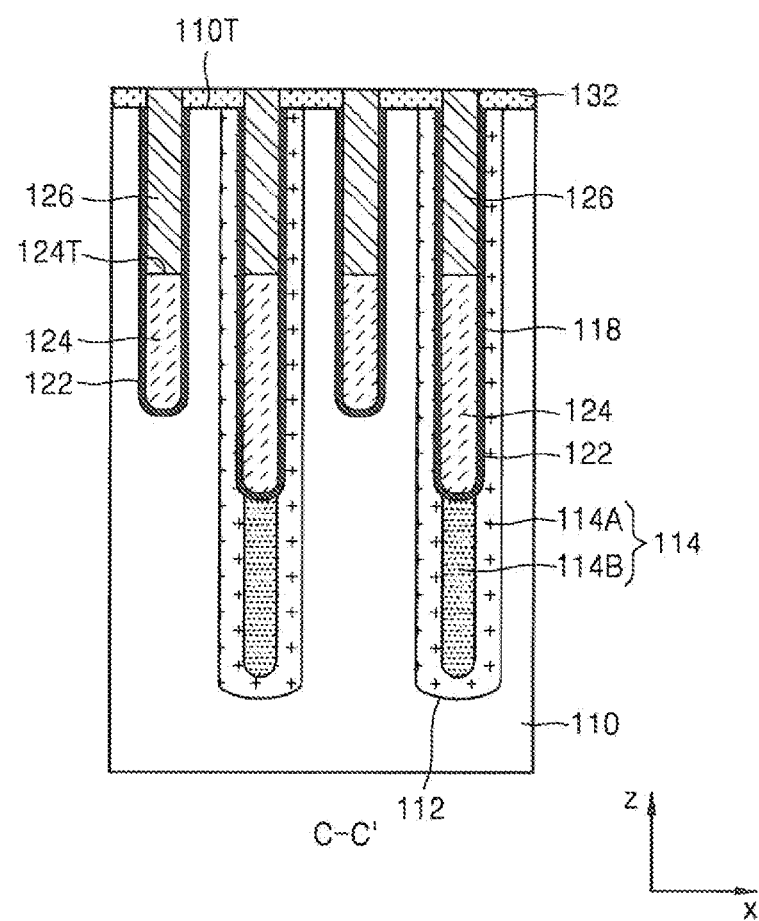
Figure 2D:
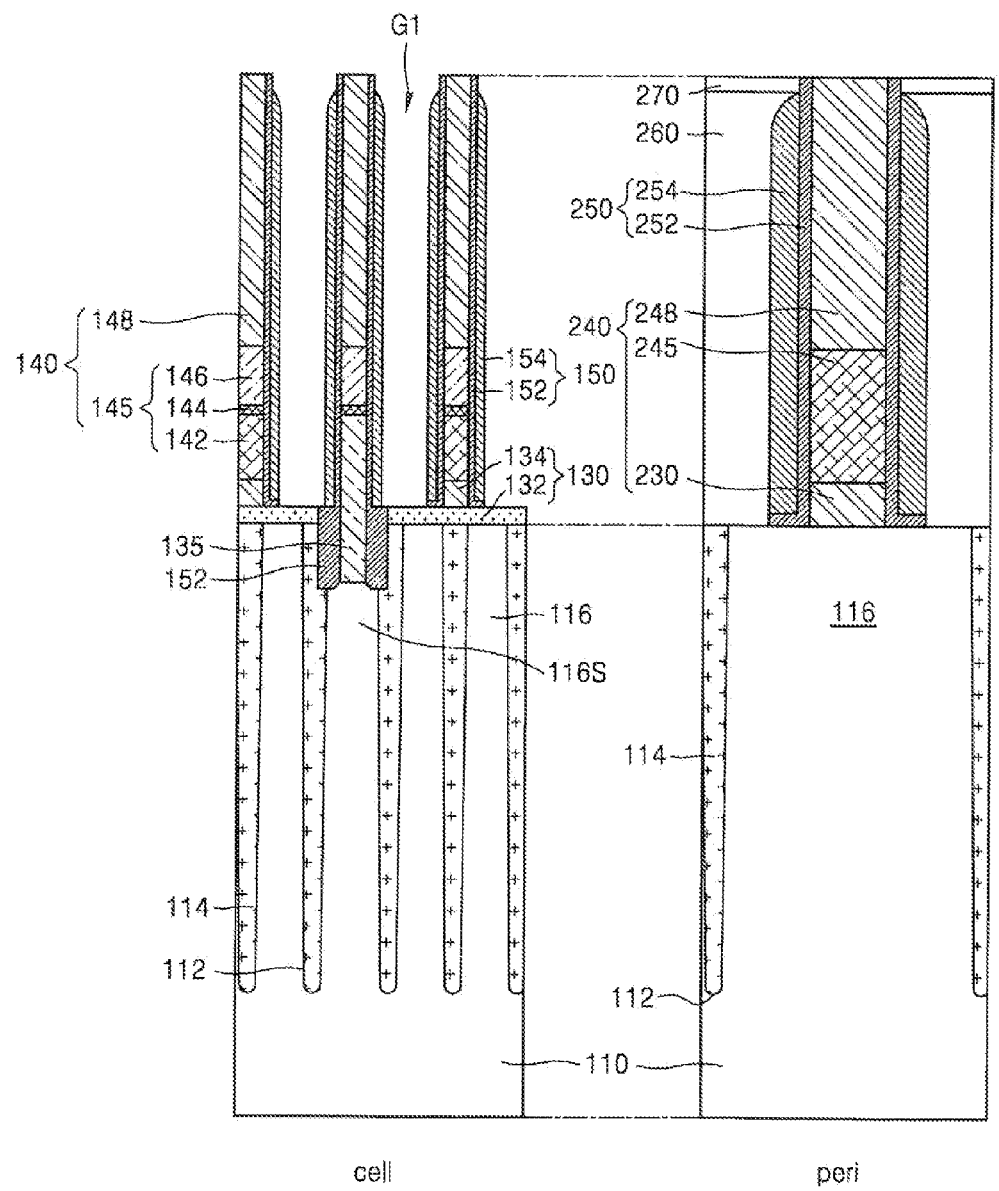
Figure 3A:
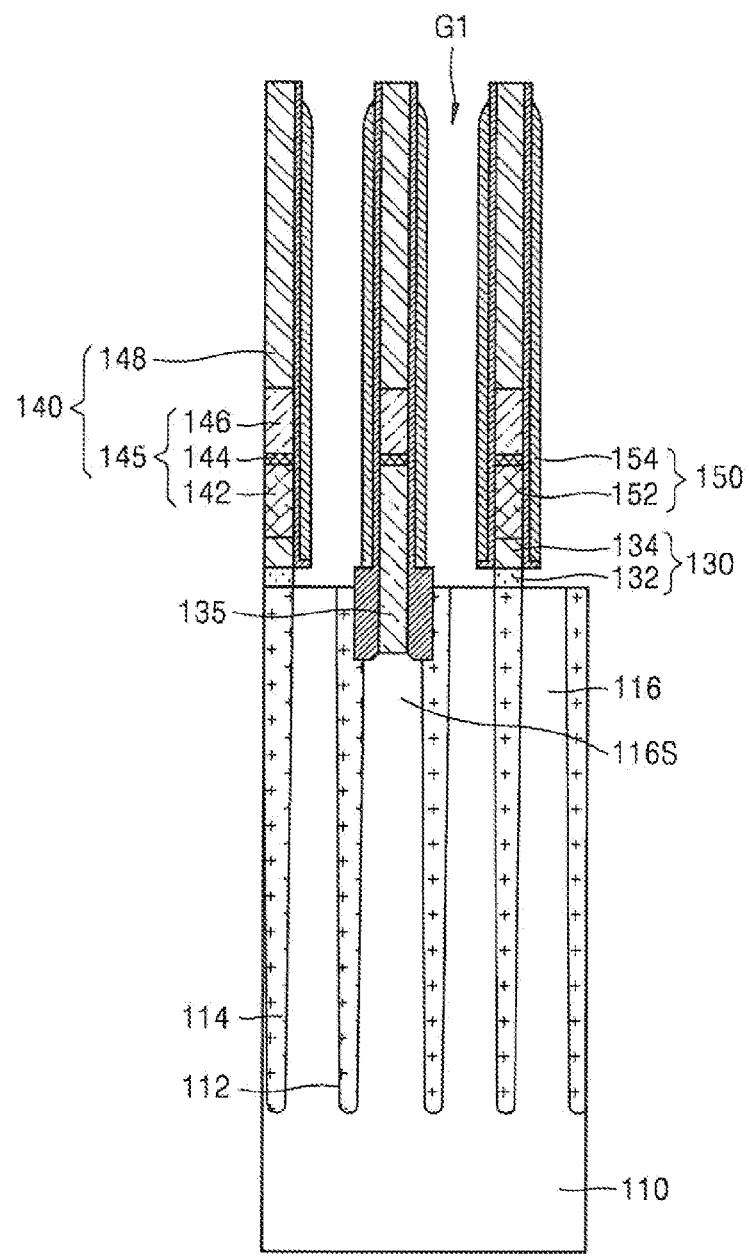
Figure 3B:
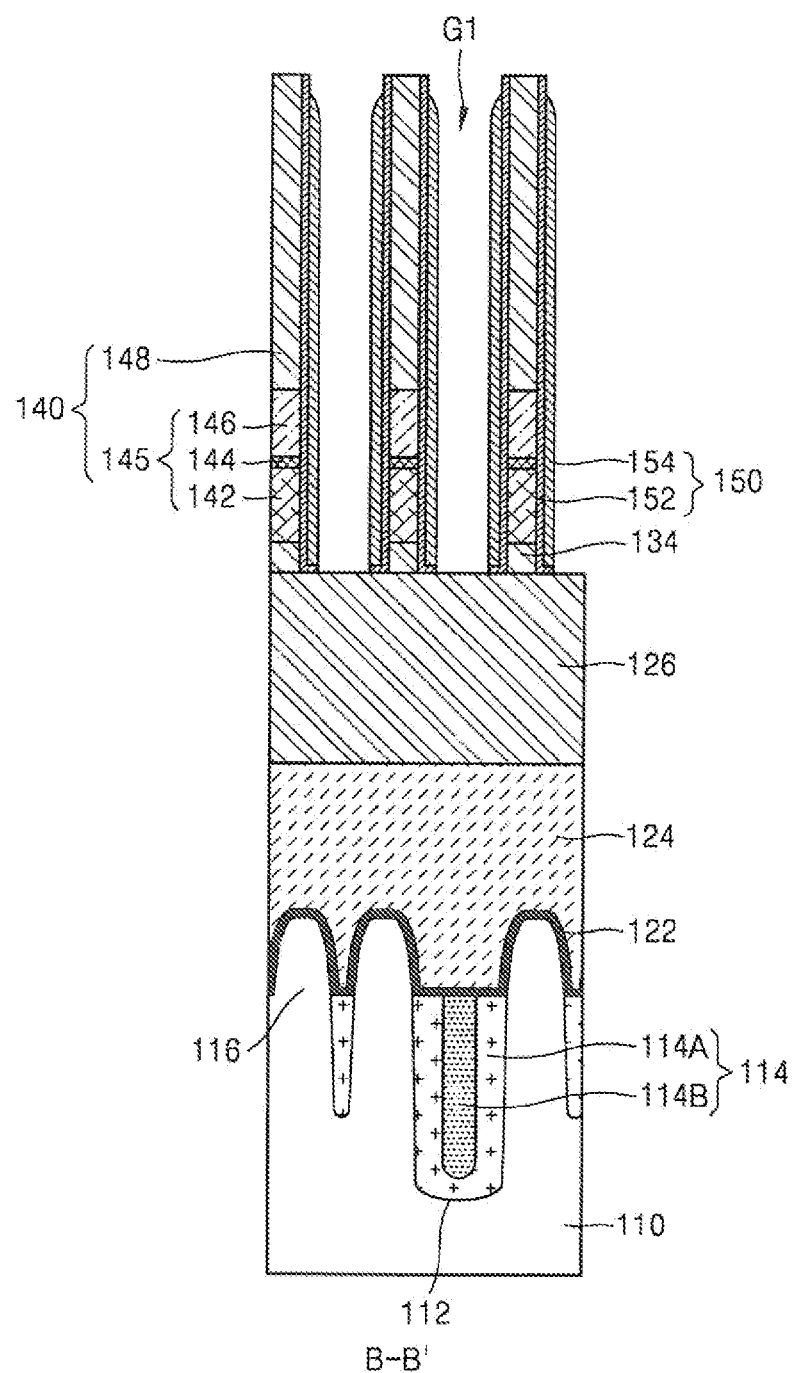
Figure 3C:
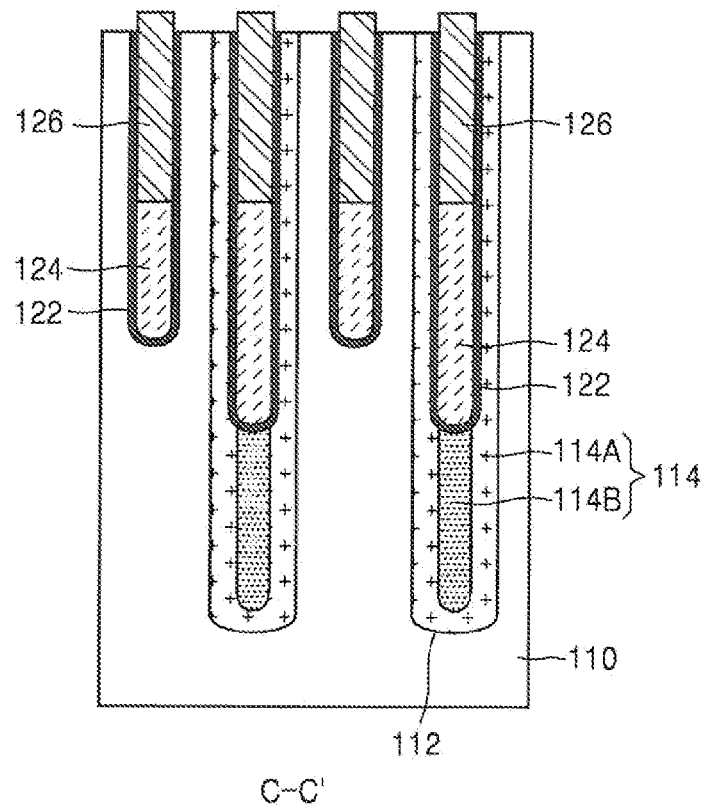
Figure 3D:
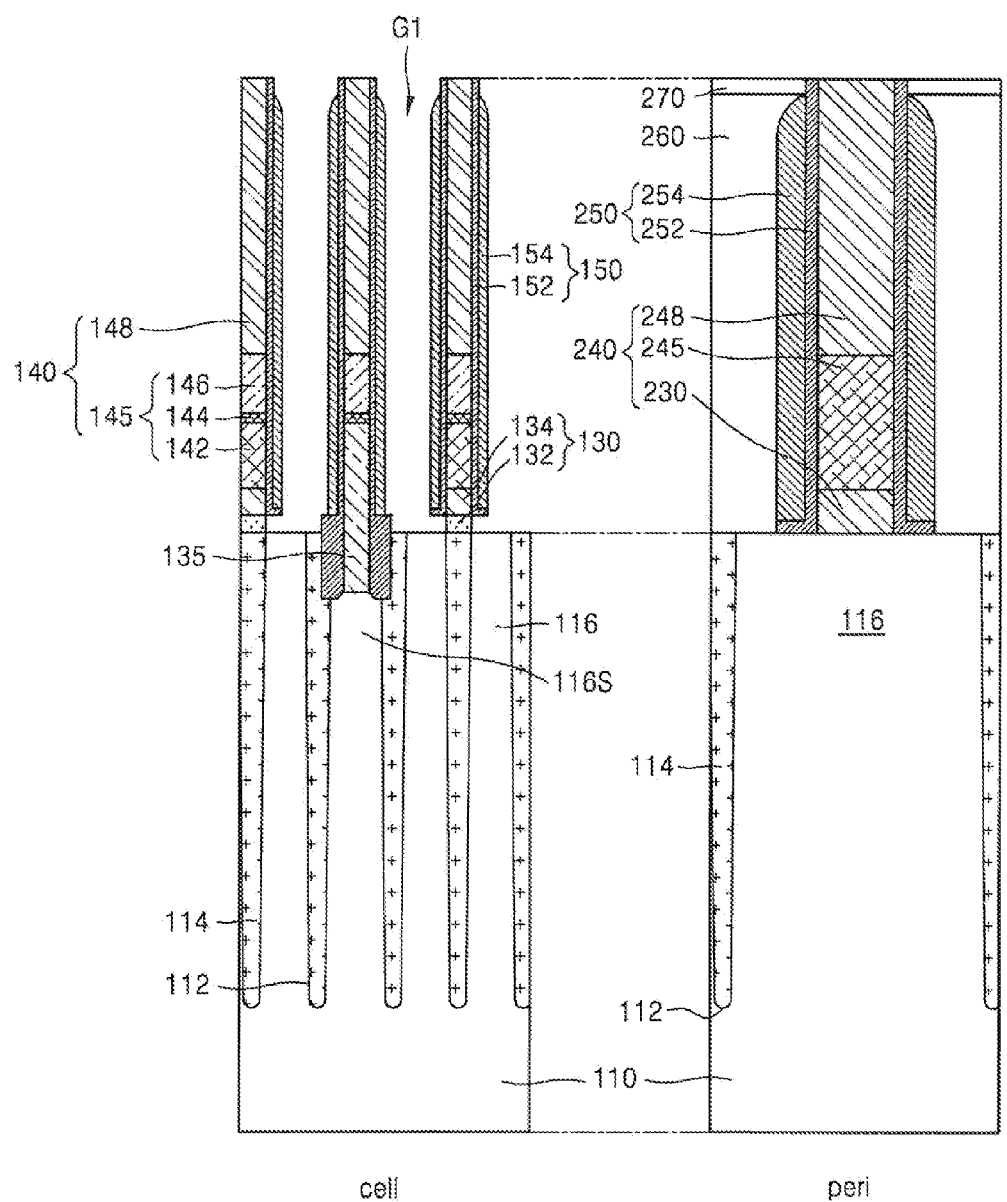

FIGS. 2A to 13C are cross-sectional views illustrating methods of fabricating a semiconductor device according to embodiments of the inventive concepts. FIGS. 2A, 3A, . . . and 13A are cross-sectional views taken along a line A-A' of FIG. 1, FIGS. 2B, 3B, . . . and 13B are cross-sectional views taken along a line B-B' of FIG. 1, and FIGS. 2C, 3C, . . . and 13C are cross-sectional views taken along a line C-C' of FIG. 1. FIGS. 2D, 3D, . . . and 9D are cross-sectional views illustrating a cell region with a peripheral circuit region, and FIGS. 6E, 7E, 8E and 9E are plan views for illustrating some process steps.

Referring to FIGS. 2A, 2B, 2C and 2D, an isolation trench 112 may be formed in a substrate 110, and an isolation layer 114 may be formed in the isolation trench 112. Active regions 116 may be defined in the substrate 110 by the isolation layer 114. Each of the active regions 116 may be formed to have a major axis and a minor axis, as illustrated in FIG. 1. That is, each of the active regions 116 may be formed to have an island-shaped bar configuration. The active regions 116 may be parallel with an oblique line in a plan view. Thus, the active regions 116 may intersect word lines 124, which are formed in a subsequent process, at a non-right angle in plan view.

The substrate 110 may include a silicon (Si) material, for example, a single crystalline silicon material, a polycrystalline silicon (also, referred to as 'polysilicon') material, or an amorphous silicon material. In some embodiments, the substrate 110 may include a germanium (Ge) material or a compound semiconductor material such as a silicon germanium (SiGe) material, a silicon carbide (SiC) material, a gallium arsenide (GaAs) material, an indium arsenide (InAs) material, or an indium phosphide (InP) material. In some embodiments, the substrate 110 may include a conductive region, for example, a well region doped with impurities or a conductive structure doped with impurities.

The isolation layer 114 may be formed of a single insulation layer. Alternatively, the isolation layer 114 may be formed to include an outer insulation layer 114A and an inner insulation layer 114B, as illustrated in FIGS. 2B and 2C. The outer insulation layer 114A and the inner insulation layer 114B may be formed of different materials. For example, the outer insulation layer 114A may be formed of an oxide layer, and the inner insulation layer 114B may be formed of a nitride layer. However, a configuration of the isolation layer 114 is not limited to the above examples. For example, the isolation layer 114 may be formed of a multi-layered material including at least three insulation layers.

A plurality of word line trenches 118 may be formed in the substrate 110. The word line trenches 118 may be parallel with each other and may cross the active regions 116.

As illustrated in FIG. 2B, each of the word line trenches 118 may have an uneven bottom surface. In order to form the word line trenches 118 having uneven bottom surfaces, the isolation layer 114 and the substrate 110 may be independently etched using two different etch processes to differently control depths of the word line trenches 118 in the isolation layer 114 and the substrate 110.

After the resultant including the word line trenches 118 is cleaned, a gate dielectric layer 122, a word line 124 and a buried insulation layer 126 may be sequentially formed in each of the word line trenches 118.

In some embodiments, after the word lines 124 are formed, impurity ions may be implanted into the active regions 116 using the word lines 124 as implantation masks to form source regions 116S (see FIG. 2A) and drain regions in the active regions 116. The source regions 116S may be electrically connected to direct contacts (DC) which are formed in a subsequent process. In some other embodiments, an ion implantation process for forming the source and drain regions may be performed prior to formation of the word lines 124.

Top surfaces 124T of the word lines 124 may be lower than a top surface 110T of the substrate 110. Bottom surfaces of the word lines 124 may be formed to have uneven surface profiles, as illustrated in FIG. 2B. Saddle fin field effect transistors (fin-FET) may be formed in the active regions 116. In some embodiments, the word lines 124 may be formed of at least one selected from the group consisting of a titanium (Ti) material, a titanium nitride (TiN) material, a tantalum (Ta) material, a tantalum nitride (TaN) material, a tungsten (W) material, a tungsten nitride (WN) material, a titanium silicon nitride (TiSiN) material, and a tungsten silicon nitride (WSiN) material.

The gate dielectric layer 122 may be formed of at least one selected from the group consisting of a silicon oxide layer, a silicon nitride layer, a silicon oxynitride layer, an oxide/nitride/oxide (ONO) layer, and a high-k dielectric layer having a dielectric constant higher than that of a silicon oxide layer. For example, the gate dielectric layer 122 may have a dielectric constant of about 10 to about 25. In some embodiments, the gate dielectric layer 122 may be formed of at least one selected from the group consisting of a hafnium oxide (HfO) material, a hafnium silicon oxide (HfSiO) material, a hafnium oxynitride (HfON) material, a hafnium silicon oxynitride (HfSiON) material, a lanthanum oxide (LaO) material, a lanthanum aluminium oxide (LaAlO) material, a zirconium oxide (ZrO) material, a zirconium silicon oxide (ZrSiO) material, a zirconium oxynitride (ZrON) material, a zirconium silicon oxynitride (ZrSiON) material, a tantalum oxide (TaO) material, a titanium oxide (TiO) material, a barium strontium titanium oxide (BaSrTiO) material, a barium titanium oxide (BaTiO) material, a strontium titanium oxide (SrTiO) material, an yttrium oxide (YO) material, an aluminium oxide (AlO) material, and a lead scandium tantalum oxide (PbScTaO) material. Alternatively, the gate dielectric layer 122 may be formed of at least one selected from the group consisting of a hafnium dioxide ($HfO_2$) material, an aluminium oxide ($Al_2O_3$) material, a hafnium aluminium oxide ($HfAlO_3$) material, a tantalum oxide ($Ta_2O_3$) material, or a titanium dioxide ($TiO_2$) material.

Top surfaces 126T of the buried insulation layers 126 may be substantially or nearly coplanar with the top surface 110T of the substrate 110. The buried insulation layers 126 may be formed of a silicon oxide layer, a silicon nitride layer, a silicon oxynitride layer, or a combination thereof.

A silicon nitride layer 134 may be formed on the substrate 110. More specifically, a silicon oxide layer 132 may be formed on an entire surface of the substrate 110, and the word line trenches 118 may be formed in the substrate 110. Subsequently, the word lines 124 and the buried insulation layers 126 may be formed in the word line trenches 118. The buried insulation layers 126 may be formed by depositing an insulation layer and by planarizing the insulation using a chemical mechanical polishing (CMP) process. After forming the buried insulation layers 126, a silicon nitride layer 134 may be formed on an entire surface of the resultant structure including the buried insulation layers 126. In some embodiments, the silicon oxide layer 132 may be formed after the buried insulation layers 126 are formed. Referring to FIG. 2A, the silicon oxide layer 132 and the silicon nitride layer 134 may constitute an interlayer insulation pattern 130. The interlayer insulation pattern 130 may be formed to have a thickness of about 200 angstroms to about 400 angstroms. In some embodiments, the interlayer insulation pattern 130 may be formed of a single layer of silicon oxide. For example, the interlayer insulation pattern 130 may be formed of a tetra-ethyl-ortho-silicate (TEOS) layer, a high density plasma (HDP) oxide layer, or a boro-phospho-silicate glass (BPSG) layer.

The interlayer insulation pattern 130 may be formed to have a plurality of openings 152H that expose the source regions 116S formed in the active regions 116. Spacers may be formed on sidewalls of the openings 152H. The spacers may be formed of a material which is different from the isolation layer 114. For example, if the isolation layer 114 is formed of a silicon oxide layer, the spacers may be formed of a silicon nitride layer. After the spacers are formed, a conductive layer may fill the openings 152H to form a plurality of direct contacts 135 electrically connected to the source regions 116S in the active regions 116.

Subsequently, a plurality of parallel bit line structures 140 may be formed on the interlayer insulation pattern 130 and the direct contacts 135 to be arrayed in the second direction (i.e., the X-axis direction of FIG. 1). The bit line structures 140 may be formed to extend in the first direction (i.e., the Y-axis direction of FIG. 1). Each of the bit line structures 140 may be formed to include a bit line 145 and an insulation capping line 148 covering a top surface of the bit line 145. The bit lines 145 may be electrically connected to the direct contacts 135.

In some embodiments, the bit lines 145 may be formed of at least one of a doped semiconductor layer, a metal layer, a metal nitride layer, and/or a metal silicide layer. Each of the bit lines 145 may be formed of a single-layered material. Alternatively, each of the bit lines 145 may be formed of a multi-layered material, as illustrated in FIGS. 2A and 2B. For example, each of the bit lines 145 may include a doped polysilicon layer 142, a tungsten nitride layer 144 and a tungsten layer 146 which are sequentially stacked.

In some embodiments, the insulation capping lines 148 may be formed of a silicon nitride layer. The insulation capping lines 148 may have a vertical thickness that is greater than a vertical thickness of the bit lines 145.

In some embodiments, in order to form the bit line structures 140, a conductive layer for forming the bit lines 145 and an insulation layer for forming the insulation capping lines 148 may be sequentially stacked on the interlayer insulation pattern 130. A vertical thickness of the insulation layer for forming the insulation capping lines 148 may be greater than a vertical thickness of the conductive layer for forming the bit lines 145. The insulation layer for forming the insulation capping lines 148 may then be patterned to form the insulation capping lines 148, and the conductive layer for forming the bit lines 145 may be etched using the insulation capping lines 148 as etch masks to form the bit lines 145.

In some embodiments, when the bit lines 145 are formed, the interlayer insulation pattern 130 may be over-etched to form a stepped top surface profile thereof. For example, when the bit lines 145 are formed, the silicon nitride layer 134 of the interlayer insulation pattern 130 may be etched to expose the silicon oxide layer 132. In addition, while the bit lines 145 are formed, the spacers formed of a silicon nitride layer may be removed to expose the sidewalls of the openings 152H that surround the direct contacts 135.

As illustrated in FIGS. 2A and 2B, line-shaped spaces, that is, first grooves G1 may be provided between the bit line structures 140. That is, the bit line structures 140 may be separated from each other by the first grooves G1. Accordingly, the bit line structures 140 may be spaced apart from each other by the first grooves G1 extending in the first direction and may be arrayed in the second direction perpendicular to the first direction, when viewed from a plan view of FIG. 1.

An insulation liner 152 may be formed in the openings 152H surrounding the direct contacts 135 and may cover top surfaces and sidewalls of the bit line structures 140 and the exposed surfaces of the interlayer insulation pattern 130. The insulation liner 152 may correspond to a first spacer formed on sidewalls of the bit line structures 140. In some embodiments, the insulation liner 152 may be used as an etch stop layer in a subsequent process. In addition, the insulation liner 152 may be used as a protection layer for protecting the bit line structures 140.

In some embodiments, the insulation liner 152 may be formed of a silicon nitride layer. The insulation liner 152 may be formed to have a thickness of about 30 angstroms to about 80 angstroms.

Subsequently, an insulation layer may be formed on the resultant structure including the insulation liner 152, and the insulation layer may be etched back using the insulation liner 152 as an etch stop layer to form a plurality of second spacers 154 that cover the insulation liner 152 on sidewalls of the bit line structures 140. In some embodiments, the second spacers 154 may be formed of a silicon oxide layer (also, referred to as an oxide layer), a silicon germanium (SiGe) layer, or a polymer layer. However, a material of the second spacers 154 is not limited to the aforementioned layers.

The second spacers 154 may be formed of a material having an etch selectivity with respect to the insulation liner 152. For example, the second spacers 154 may be formed of an insulation layer or a conductive layer. In the present embodiment, the second spacers 154 may be formed of a silicon oxide layer. The insulation liner 152 and the second spacers 154 may constitute a multi-layered spacer 150 that surrounds the sidewalls of the bit line structures 140.

As illustrated in FIGS. 2A and 2B, during the etch-back process for forming the second spacers 154, the insulation liner 152 may be over-etched to expose top surfaces of the bit line structures 140, the interlayer insulation pattern 130 and the buried insulation layer 126. However, if an etched amount of the insulation layer for forming the second spacers 154 is appropriately controlled, the top surfaces of the bit line structures 140, the interlayer insulation pattern 130 and the buried insulation layer 126 may be still covered with the insulation liner 152 even after the second spacers 154 are formed.

After the second spacers 154 are formed using an etch-back process, a portion of the interlayer insulation pattern 130 under the first grooves G1 may be exposed. For example, during the etch-back process for forming the second spacers 154, the insulation liner 152 and the insulation layer for forming the second spacers 154, which are disposed under the first grooves G1 may be removed to expose the silicon oxide layer 132 of the interlayer insulation pattern 130.

As described above, portions of the active regions 116 may be exposed when the multi-layered spacer 150 is formed. Thus, portions of the active regions 116 may be exposed by line-shaped openings. More specifically, the bit line structures 140 may have line-shaped configurations, and the first grooves G1 between the bit line structures 140 may also have line-shaped configurations. Accordingly, even after the multi-layered spacer 150 surrounding the bit line structures 140 is formed, each of the first grooves G1 may also have a line-shaped configuration. As a result, both ends of each of the active regions 116 may be exposed by line-shaped openings which are formed by etching the silicon oxide layer 132 under the first grooves G1 using the multi-layered spacer 150 as an etch mask.

As such, because portions of the active regions 116 are exposed by line-shaped openings, an open failure rate of the active regions 116 may be substantially reduced as compared with a case in which portions of the active regions 116 are exposed using separate hole-shaped openings. In addition, if portions of the active regions 116 are exposed by line-shaped openings, an amount of loss of an etch mask may also be reduced when an etch process for exposing the active regions 116 is performed. A horizontal cross-section of each hole exposing a portion of the active region 116 may have a polygonal shape or a circular shape.

The etch mask used in formation of hole-shaped openings may be formed of a nitride layer or an oxide layer, and a large amount of the etch mask may be etched away when the hole-shaped openings are formed using an etch process. Thus, in consideration of the large amount of loss of the etch mask, a thickness of the etch mask should be increased or a diameter (or a width) of the hole-shaped openings should be increased. However, in such a case, there may be a limitation in scaling down or shrinking the semiconductor device to increase the integration density of the semiconductor device.

As a result, if the portions of the active regions 116 are exposed by the line-shaped openings provided while the multi-layered spacer 150 is formed, planar areas of the exposed portions of the active regions 116 may be increased with a stable etch process. That is, according to the present embodiment, an open failure rate of both ends of each of the active regions 116 may be reduced, and an amount of loss of the etch mask (i.e., the multi-layered spacer 150) may also be reduced. Moreover, according to the present embodiment, a recession incidence rate of bottom surfaces of the final buried contact holes may also be reduced.

As illustrated in FIG. 2D, a plurality of gate structures 240 having the same/similar configuration as the bit line structures 140 in the cell region may be formed in the peripheral circuit region. That is, each of the gate structures 240 may be formed to include a gate insulation layer 230, a gate electrode 245, and an insulation capping layer 248 which are sequentially stacked. In some embodiments, the gate structures 245 may be formed of the same materials as the bit line structures 140. However, the gate structures 240 may have a different pitch, gate width and/or spacing than the bit line structures 140. In the present embodiment, the gate electrodes 245 may be formed of a doped polysilicon material, and top surfaces of the bit line structures 140 may be coplanar with a top surface of the gate structure 240. A multi-layered gate spacer 250 may be formed on sidewalls of the gate structures 240. The multi-layered gate spacer 250 may be formed to include gate spacers 252 and 254. After the multi-layered gate spacer 250 is formed, a planarized interlayer insulation layer 260 may be formed on the substrate 110 to cover the multi-layered gate spacer 250. An etch stop layer 270 may be formed on the planarized interlayer insulation layer 260.

Referring to FIGS. 3A, 3B, 3C and 3D, after the second spacers 154 are formed, portions of the silicon oxide layer 132 under the first grooves GI may be etched using the second spacers 154 as etch stop layers to expose corresponding portions of the active regions 116. In such a case, portions of the isolation layer 114 adjacent to the active regions 116 may also be exposed. After top surfaces of both ends of the active regions 116 are exposed, a wet etch process for etching the silicon oxide layer 132 may be additionally performed to increase a surface area of each of the exposed portions of the active regions 116. If the surface area of each of the exposed portions of the active regions 116 increases, contact areas between buried contacts (formed by filling the first grooves G1 with a conductive layer in a subsequent process) and the active regions 116 may increase to reduce contact resistance values between the buried contacts and the active regions 116.

In some embodiments, the wet etch process for etching a silicon oxide layer 132 may be omitted. For example, if each of the portions of the active regions 116 exposed by the line-shaped openings (i.e., the first grooves G1) has a sufficient area, the wet etch process for etching a silicon oxide layer 132 may be omitted.

Referring to FIGS. 4A, 4B, 4C and 4D, after the silicon oxide layer 132 is etched using a wet etch process to increase the surface area of each of the exposed portions of the active regions 116, a sacrificial layer 160 may be formed on the bit line structures 140 and the multi-layered spacer 150 to fill the first grooves G1.

In some embodiments, the sacrificial layer 160 may be formed of a SOH material. The sacrificial layer 160 may be formed by coating an organic compound material with a spin coating process or another deposition process to form an organic compound layer and by curing the organic compound layer with at least one step of baking process. The organic compound material may be a hydrocarbon compound material including an aromatic ring such as phenyl, benzene or naphthalene. Alternatively, the organic compound material may be a derivative of the hydrocarbon compound material. Moreover, the organic compound material may have relatively high carbon content of about 85 wt % to about 99 wt % on the basis of a total weight thereof.

More specifically, the organic compound material may be coated on the bit line structures 140 using a spin coating process to form the organic compound layer.

Subsequently, the organic compound layer may be cured using a first baking process to form a carbon containing layer. The first baking process may be performed at a temperature of about 150 degrees Celsius to about 350 degrees Celsius for about 60 seconds. Thereafter, the carbon containing layer may be cured using a second baking process to form the sacrificial layer 160 of an SOH material. The second baking process may be performed at a temperature of about 300 degrees Celsius to about 550 degrees Celsius for about 30 seconds to about 300 seconds. Since the sacrificial layer 160 of an SOH material is formed by curing the carbon containing layer with the second baking process, the sacrificial layer 160 may not be damaged even though another layer is formed on the sacrificial layer 160 at a high temperature over 400 degrees Celsius in a subsequent process.

The sacrificial layer 160 of an SOH material may be readily removed using an ashing process or a strip process. That is, the sacrificial layer 160 of an SOH material may be readily removed using only an ashing process or a strip process even without use of an additional etch process. Thus, the portions of the active regions 116 exposed by the first grooves G1 may be readily reopened by removing the sacrificial layer 160 of an SOH material. In some embodiments, the sacrificial layer 160 may be formed of an amorphous carbon layer instead of an SOH material.

Figure 4A:
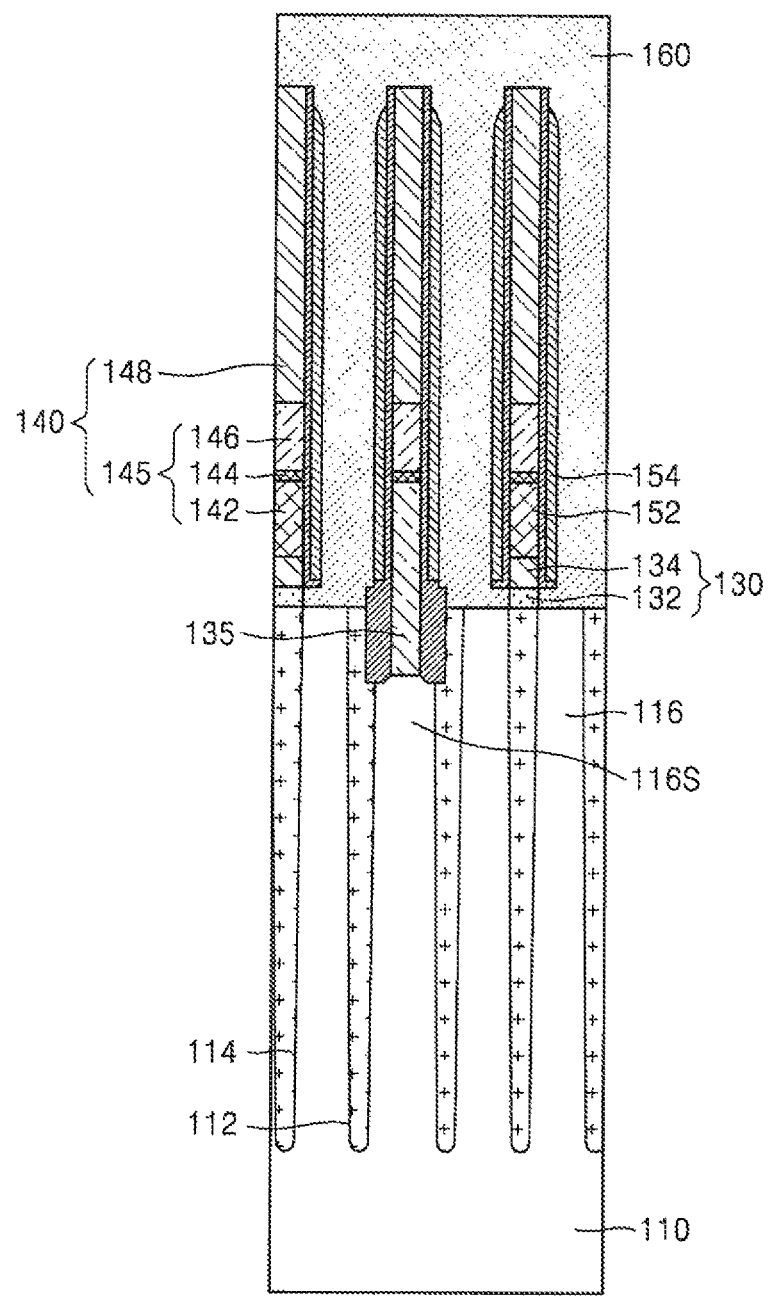
Figure 4B:
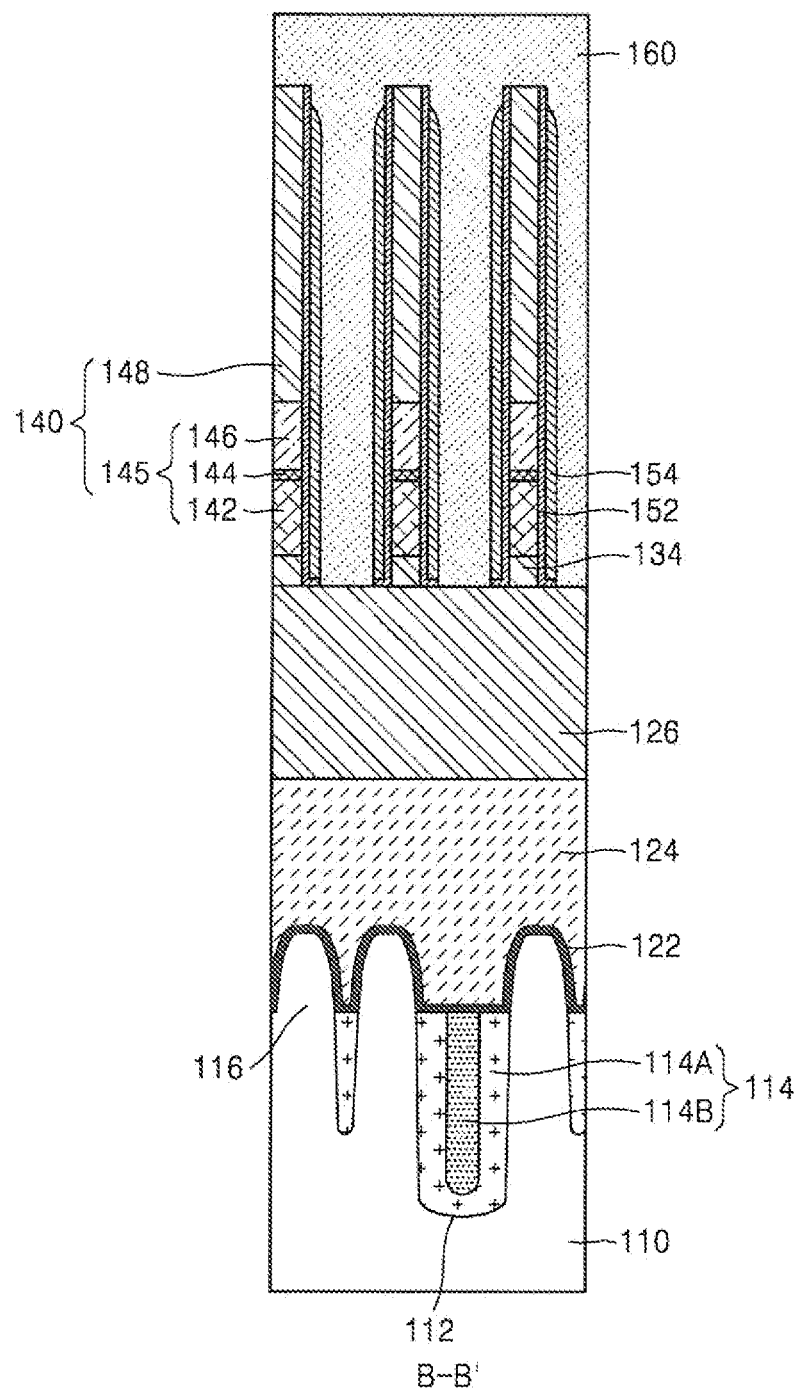
Figure 4C:
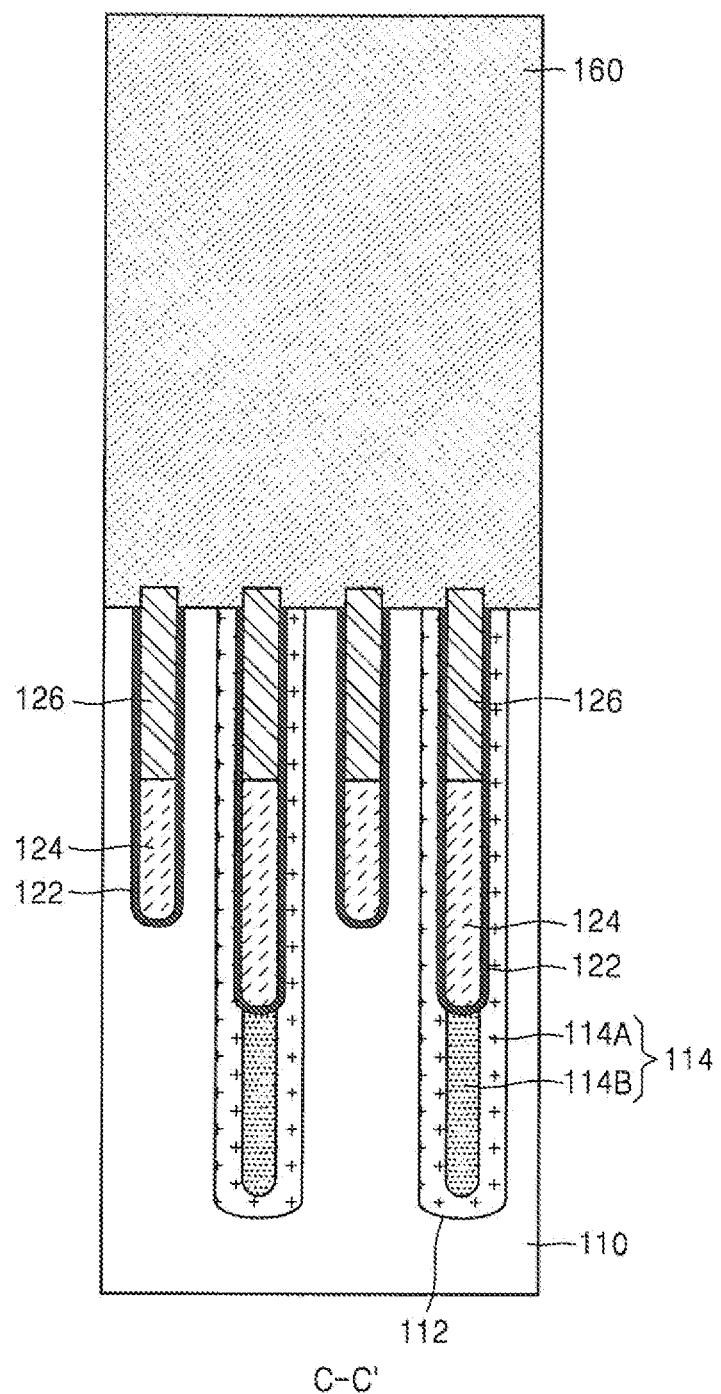
Figure 4D:
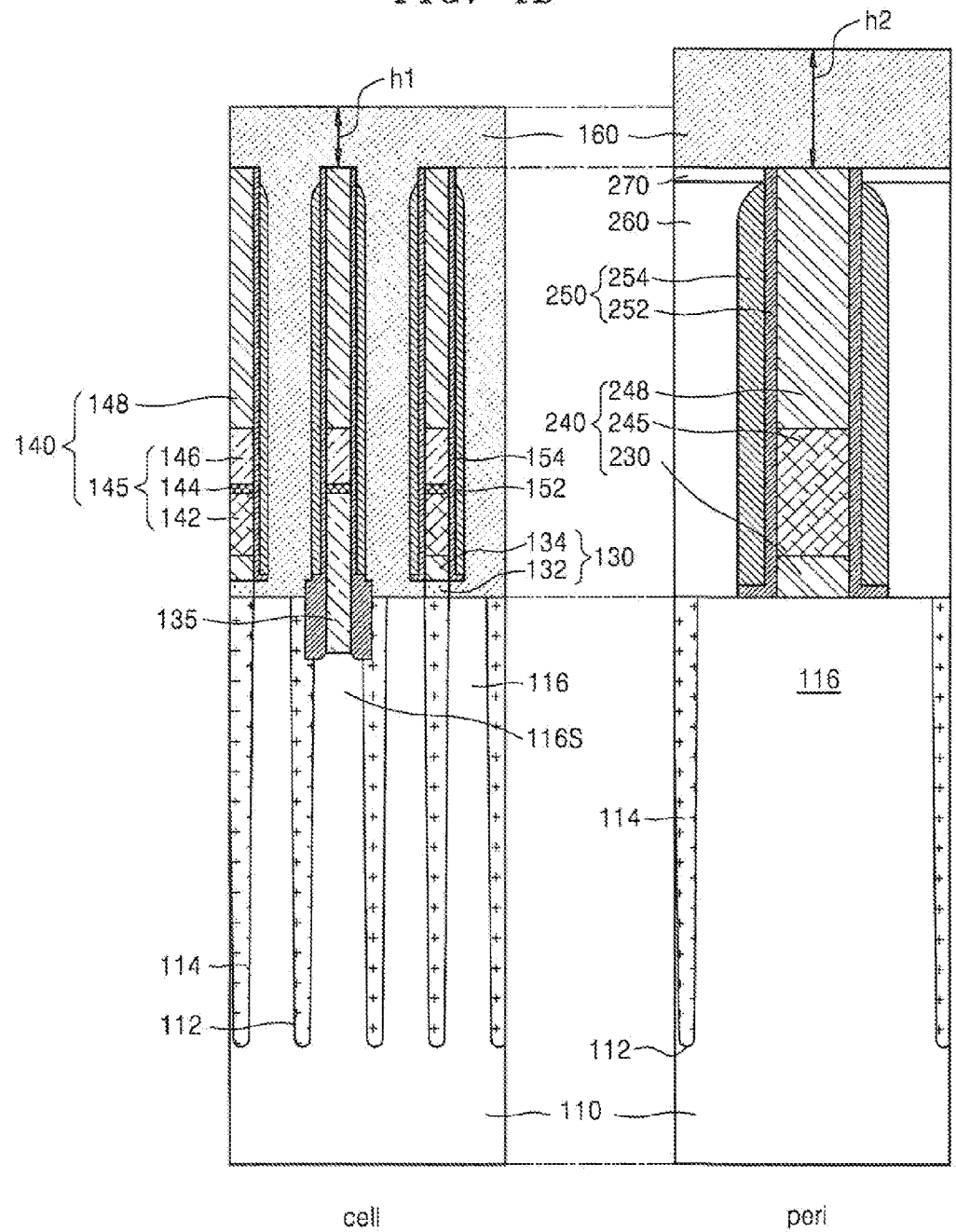

As illustrated in FIG. 4D, if the sacrificial layer 160 in the cell region is formed to have a first thickness H1 on the top surfaces of the bit line structures 140, the sacrificial layer 160 in the peripheral circuit region may be formed to have a second thickness H2, which is greater than the first thickness H1, on the top surface of the gate structure 240. Accordingly, there may be a surface level difference between the sacrificial layer 160 in the cell region and the sacrificial layer 160 in the peripheral circuit region.

For the reasons described above with respect to FIG. 17, a surface level of the sacrificial layer 160 in the cell region may be lower than a surface level of the sacrificial layer 160 in the peripheral circuit region by a difference between the first and second thicknesses H1 and H2. Even though a blanket etch process is applied to the sacrificial layer 160 using a dry etch process, the surface level difference between the cell region and the peripheral circuit region may still exist. This is because an entire surface level of the sacrificial layer 160 is uniformly lowered by the dry etch process used as the blanket etch process. In addition, if the sacrificial layer 160 remains only in the peripheral circuit region, some patterns in the cell region may be lifted in a subsequent process, which can result in the generation of abnormal patterns.

Figure 5A:
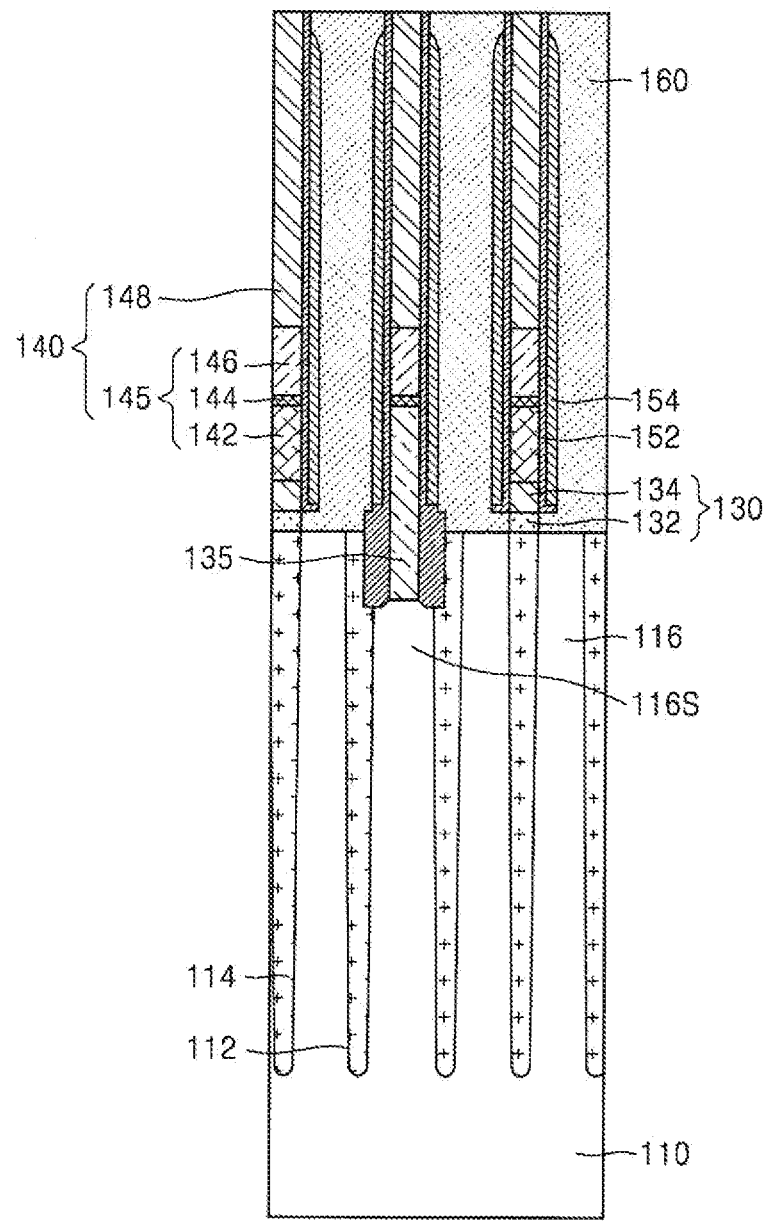
Figure 5B:
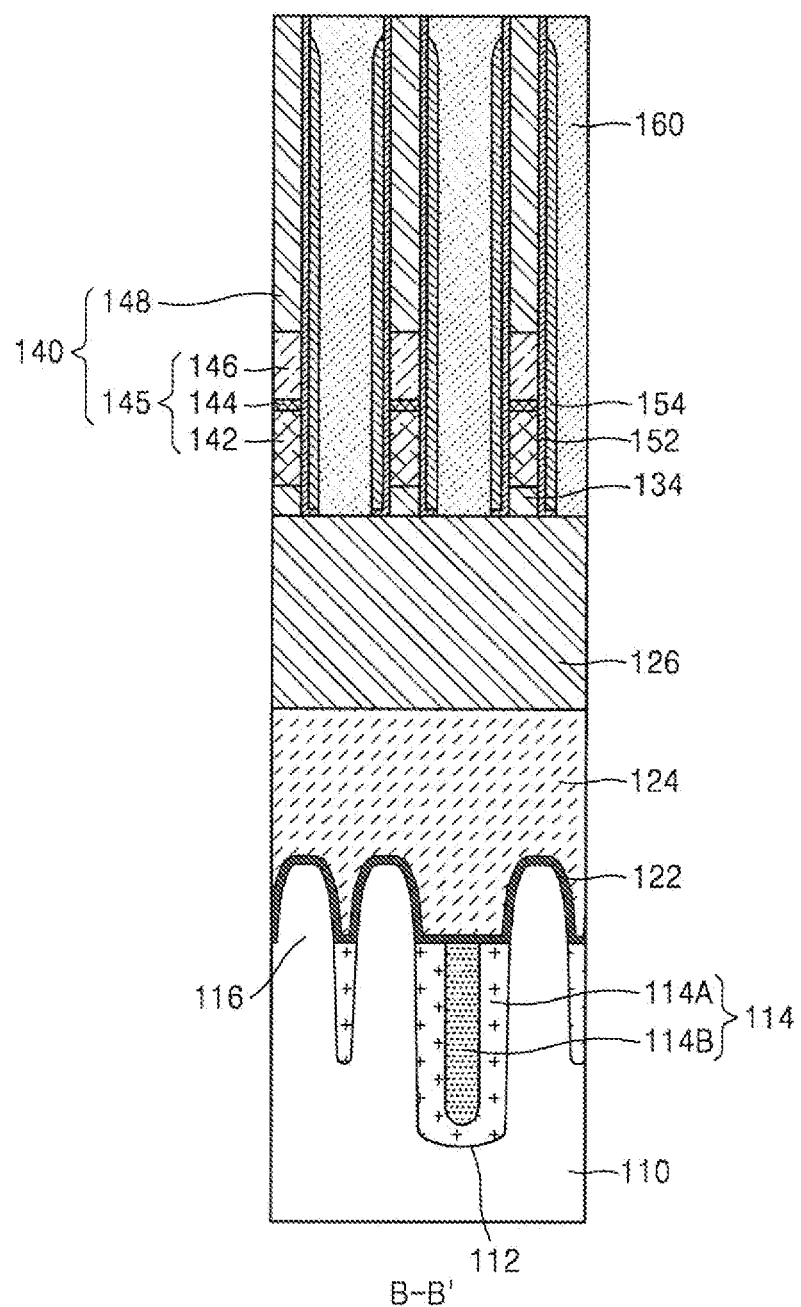
Figure 5C:
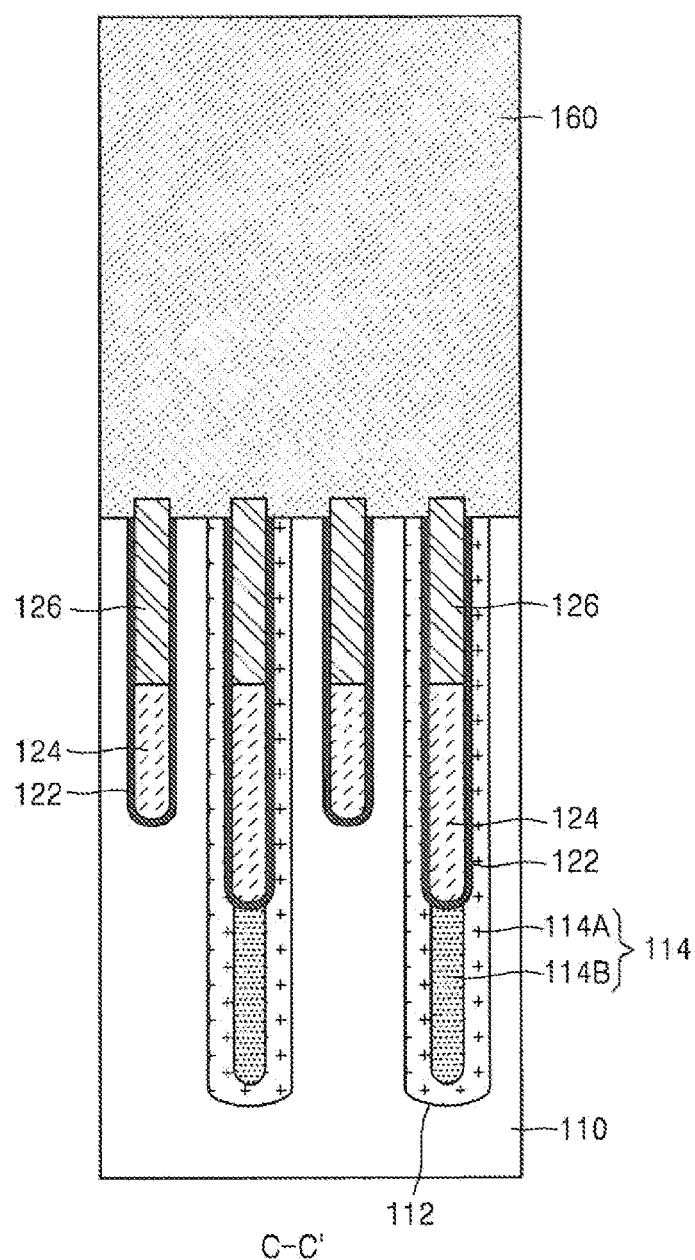
Figure 5D:
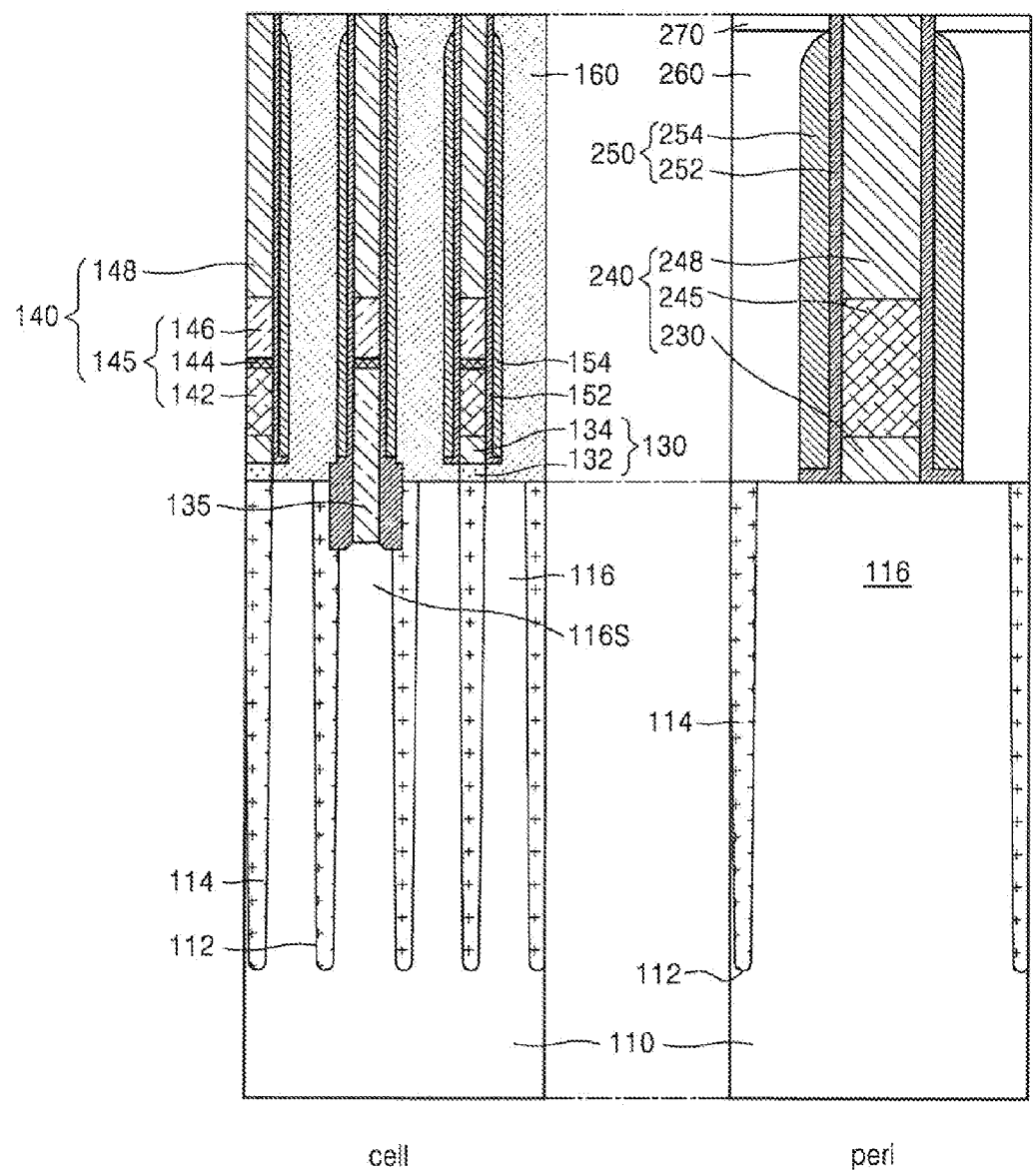

Referring to FIGS. 5A, 5B, SC and SD, the sacrificial layer 160 may be planarized using a CMP process to expose the top surfaces of the bit line structures 140 in the cell region and the top surface of the gate structure 240 in the peripheral circuit region.

As described above, the sacrificial layer 160 may be formed of an SOH material, and the SOH material may be an organic compound material containing carbon. Thus, the CMP process has to be performed with slurry which is capable of polishing the organic compound material.

The slurry used in polishing an organic material may include abrasive agent having a weight ratio of about 0.001 wt % to about 5 wt %, oxidizer having a weight ratio of about 0.1 wt % to about 5 wt %, abrasive adjuster having a weight ratio of about 0 wt % to about 5 wt %, surfactant having a weight ratio of about 0 wt % to about 3 wt %, pH adjuster having a weight ratio of about 0 wt % to about 3 wt %, and de-ionized water having a weight ratio of about 79 wt % to about 99.889 wt %.

Abrasive particles of the abrasive agent may include silica ($SiO_2$) particles, ceria ($CeO_2$) particles, alumina ($Al_2O_3$) particles, or a combination thereof. The abrasive particles may have a grain size of about 10 nanometers to about 100 nanometers. More specifically, the abrasive particles may have a grain size of about 30 nanometers to about 120 nanometers.

The oxidizer may oxidize the organic material to obtain a predetermined polishing rate. The oxidizer may include at least one selected from the group consisting of a peroxide type material, a halogen type material, a halogen compound material, a nitrate type material, a hypochlorite type material, a hypohalite type material, a chromium compound type material, a permanganate type material, a hydroperoxide compound material, a sulfate material, a perchloric acid ($HClO_4$) material, an iron nitrate ($Fe(NO)_3$) material, a sodium perborate material, a nitrous oxide material, and a 2,2'-dipyridisulfide material. In particular embodiments, the oxidizer may include a chlorite type material or a chlorate type material.

The abrasive adjuster may break carbon chains in the organic material. The abrasive adjuster may be an organic acid material or an inorganic acid material. Specifically, the abrasive adjuster may include at least one selected from the group consisting of a nitrate type material, a sulfonic type material, a carboxyl acid type material, a halogen oxoacid type material, a vinylogous carboxylic acid type material, an amino acid type material, and an inorganic acid material. In particular embodiments, the abrasive adjuster may include a carboxyl acid type material.

The surfactant may improve wettability at a surface of the organic material contacting the CMP slurry composition to increase the polishing rate. The surfactant may be an anionic surfactant or a non-ionic surfactant. Specifically, the surfactant may include a lauryl myristyl alcohol type material, a methyl-oxirane polymer type material having a hydrophile lipophile balance (HLB) value of 12 or greater, an ethylenediamine material, a C1-16 ethoxylated and propoxylated alcohol type material, a 2-methyloxirane material, an oxirane type material, a polyethylene glycol material, and a polysorbate type material.

The pH adjuster may control the potential of hydrogen (pH) of the CMP slurry composition. Since the pH adjuster includes acid, the pH adjuster may also act as the pH adjuster. The pH adjuster may be an acidic material or a basic material. Specifically, the acidic material used as the pH adjuster may be poly acrylic acid, carboxyl acid, nitric acid, sulfuric acid or sulfonic acid, and the basic material used as the pH adjuster may be potassium hydroxide, sodium hydroxide, ammonia solution, tetramethyl ammonium hydroxide, tetraethyl ammonium hydroxide or tetrabuthyl ammonium hydroxide.

The CMP slurry composition may have a pH of about 2.0 to about 5.0. If a pH of the CMP slurry composition is lower than 2.0 or higher than 5.0, a stability of the abrasive particles may be degraded. If the stability of the abrasive particles is degraded, the CMP process may exhibit a non-uniform characteristic.

The organic material may be effectively planarized using the CMP slurry composition described above.

As a result of the CMP process, the surface level difference between the cell region and the peripheral circuit region may be reduced. That is, the sacrificial layer 160 may remain in the first grooves G1, and a top surface of the planarized sacrificial layer 160 may be coplanar with the top surfaces of the bit line structures 140 and the top surface of the gate structure 240. Accordingly, the surface level difference between the cell region and the peripheral circuit region may be reduce by the CMP process to reduce or prevent abnormal patterns from being formed in a subsequent process.

Furthermore, since the sacrificial layer 160 is formed of an organic compound material containing carbon, the second spacers 154 corresponding to outer spacers of the multi-layered spacer 150 may be formed of an oxide material (e.g., a silicon oxide material) having a dielectric constant which is lower than a dielectric constant of a nitride material. Thus, parasitic capacitance values (i.e., coupling capacitance values) between the bit lines 145 may be reduced to improve electric characteristics of the semiconductor device.

In some embodiments, the spacer 150 may be formed of a single layered material, for example, a single oxide layer. In such a case, the fabrication process may be simplified to increase the throughput and to reduce the fabrication cost, as compared with a case that the spacer 150 is formed of a multi-layered material.

Referring to FIGS. 6A, 6B, 6C, 6D and 6E, the planarized sacrificial layer 160 may be patterned to form second grooves G2. The second grooves G2 may be formed to be spaced apart from each other in the first direction (i.e., the Y-axis direction) and in the second direction (i.e., the X-axis direction).

Figure 6A:
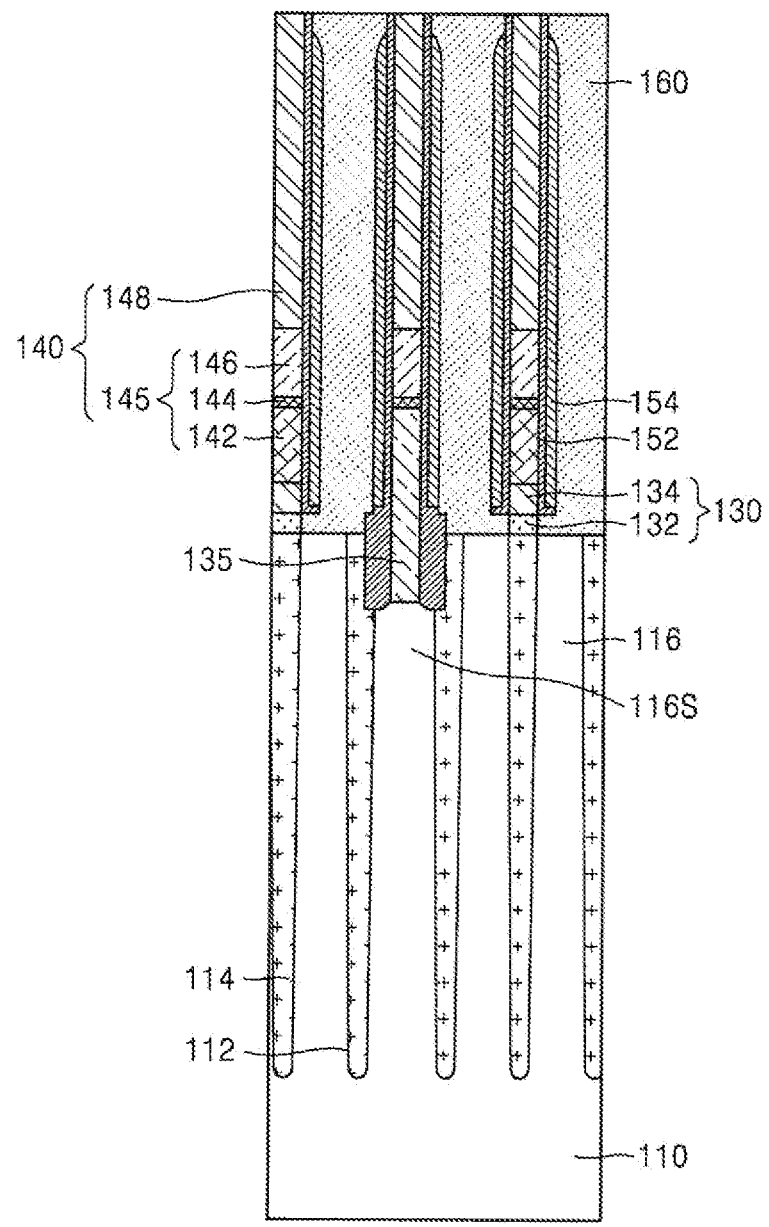
Figure 6B:
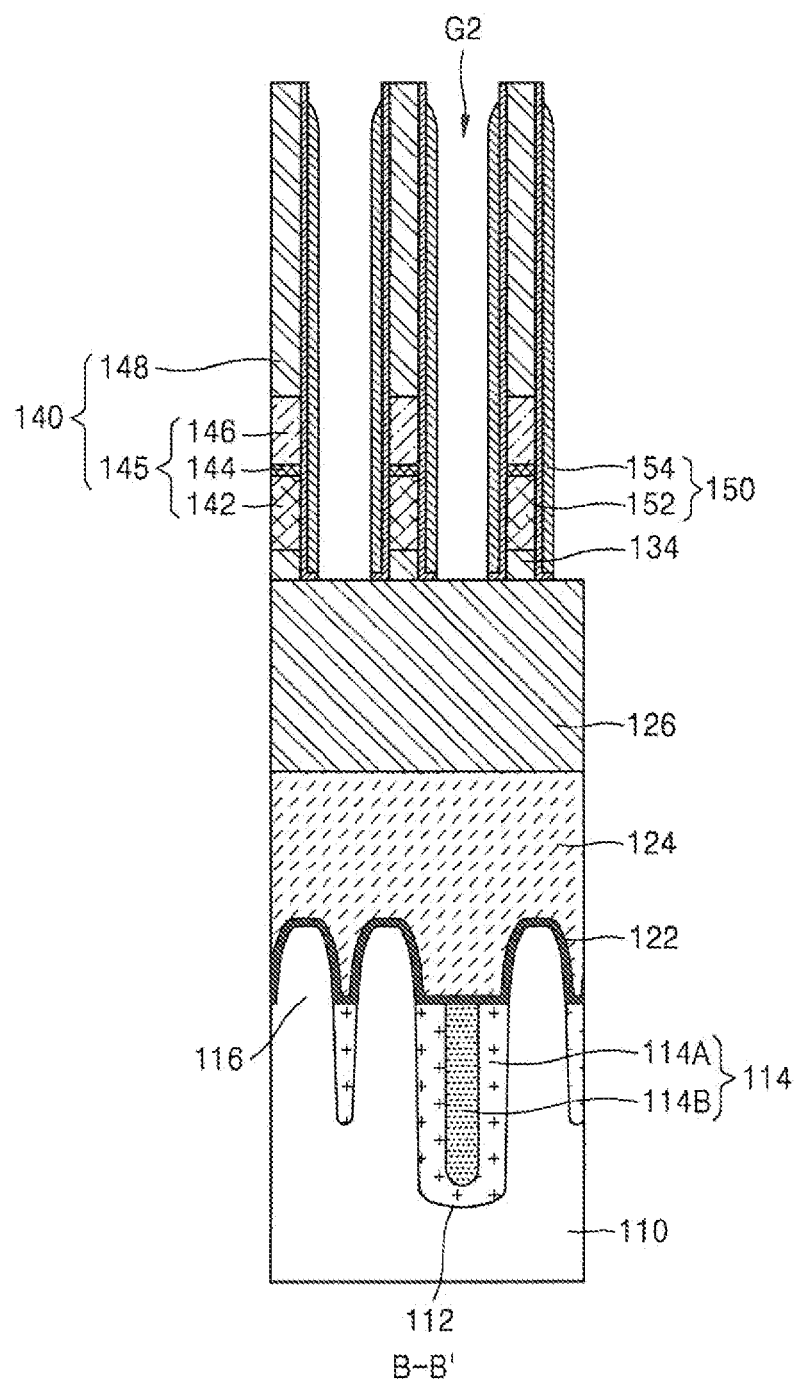
Figure 6C:
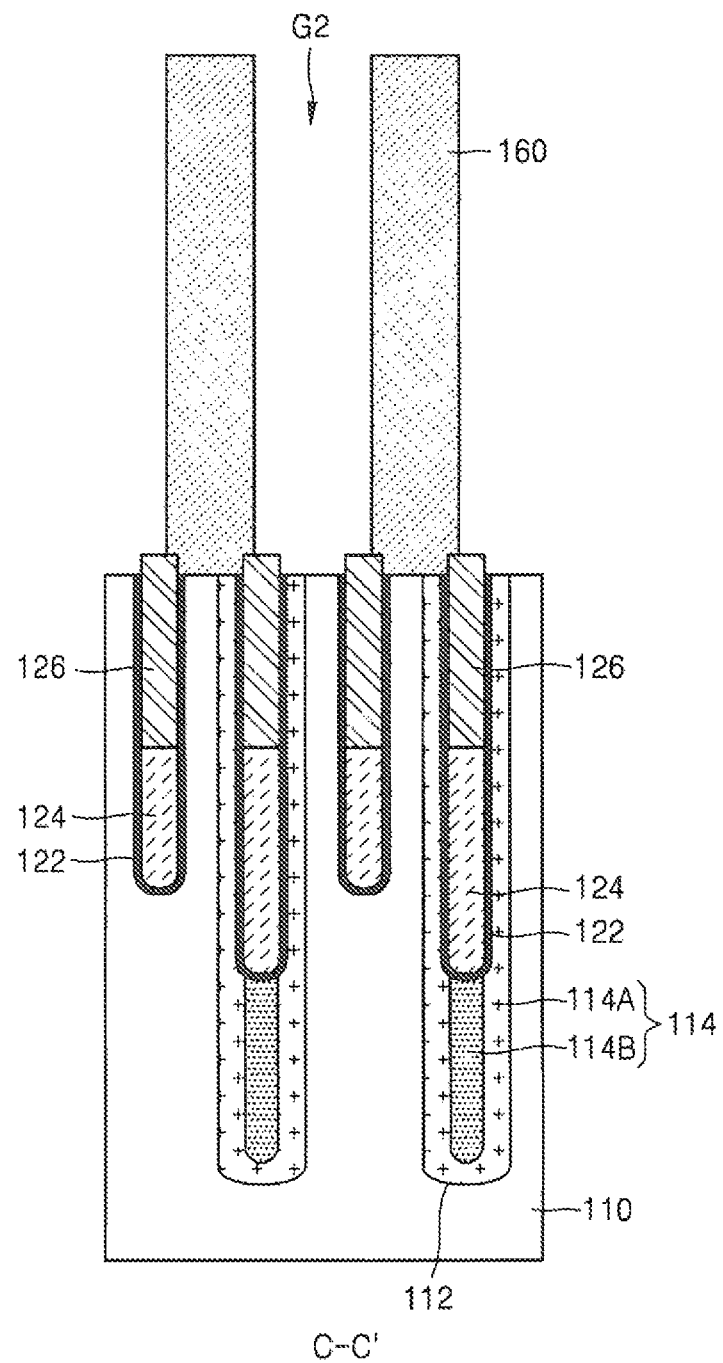
Figure 6D:
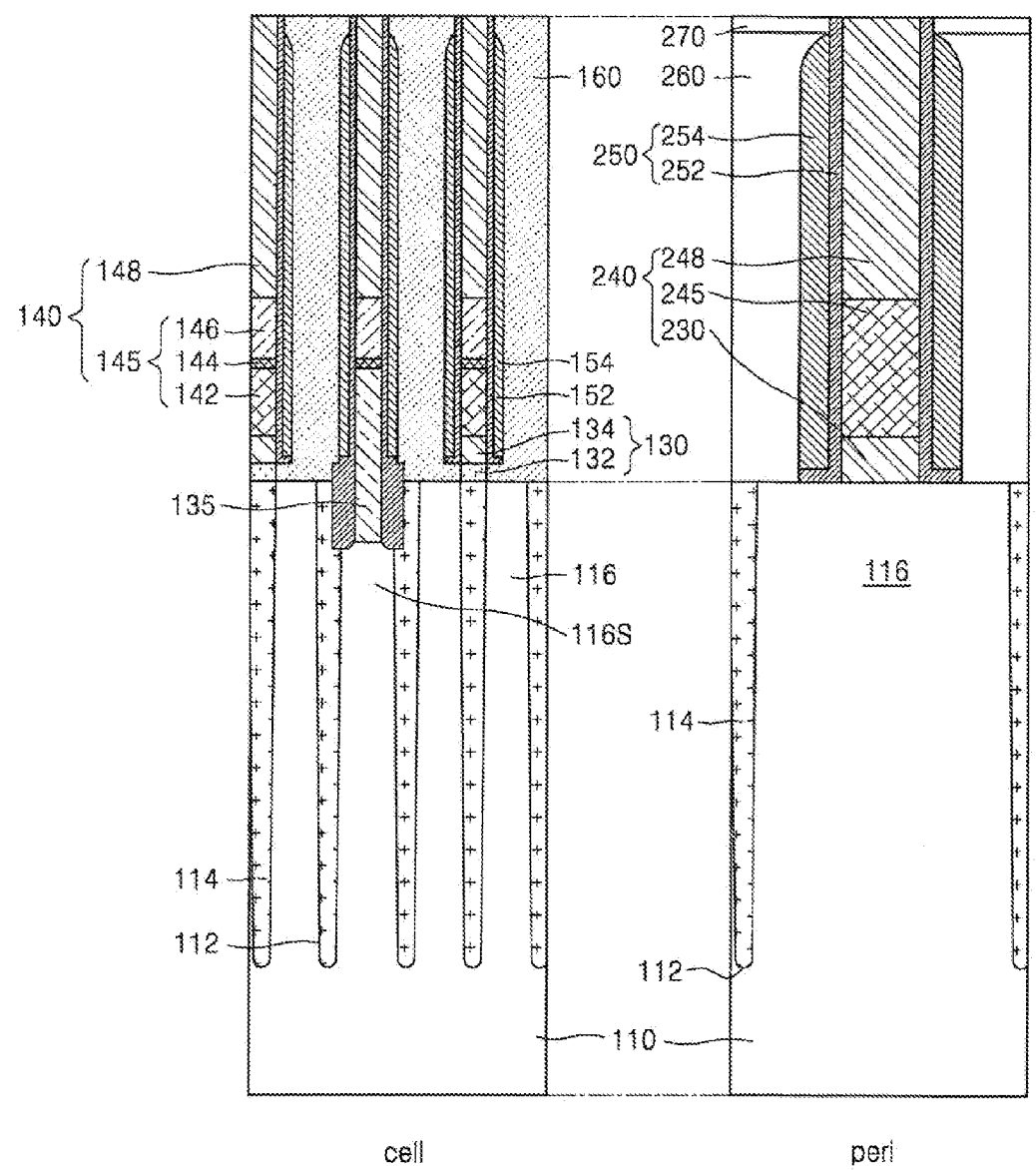
Figure 6E:
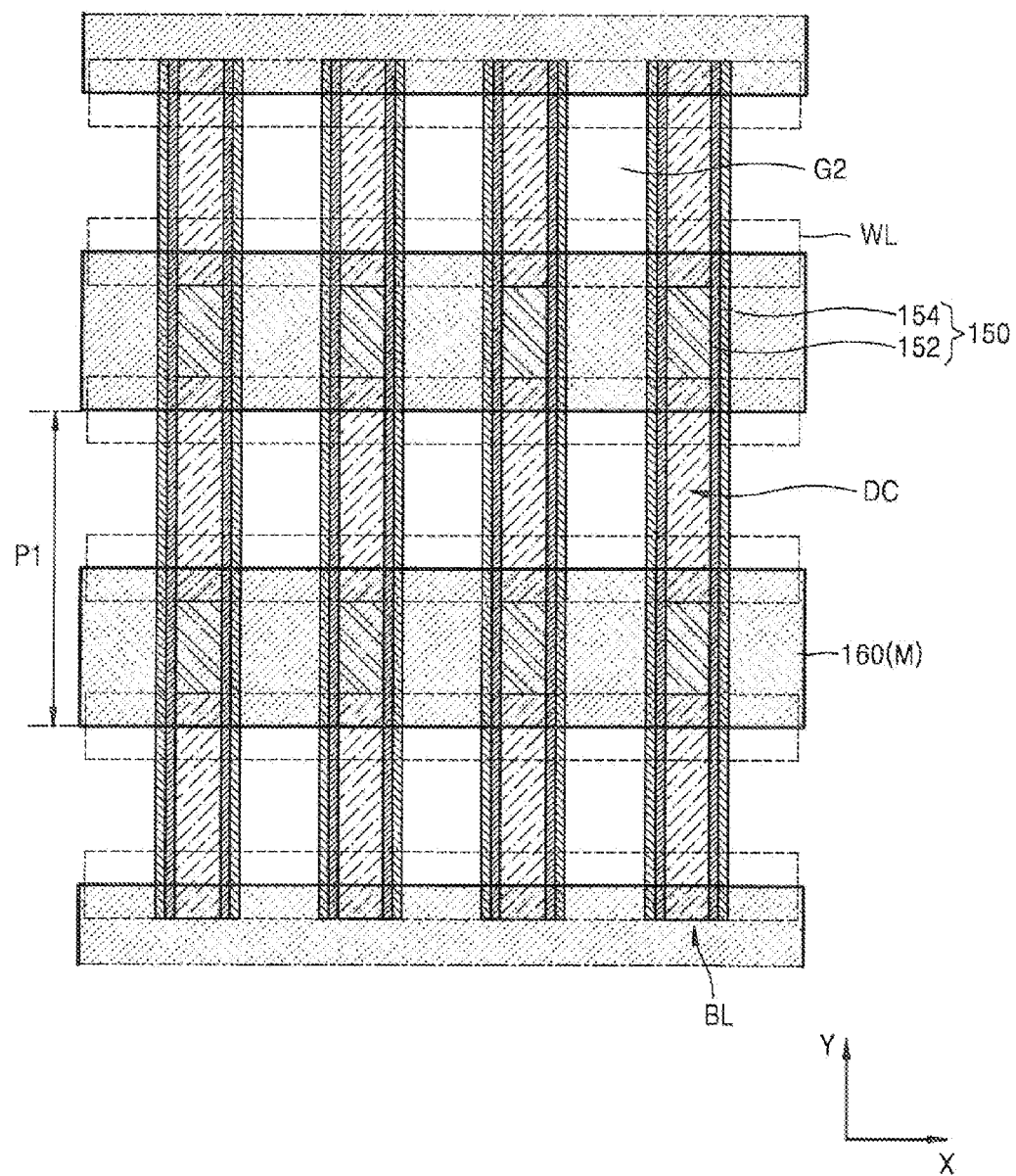
Figure 7A:
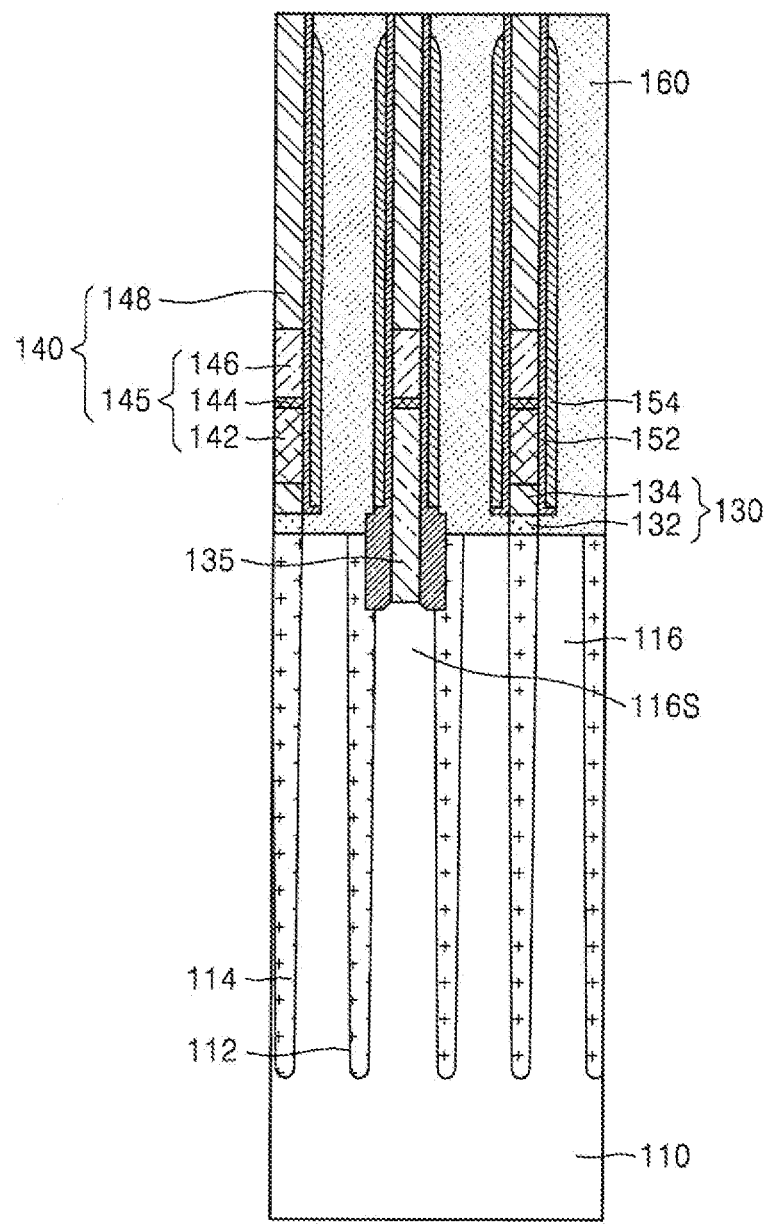
Figure 7B:
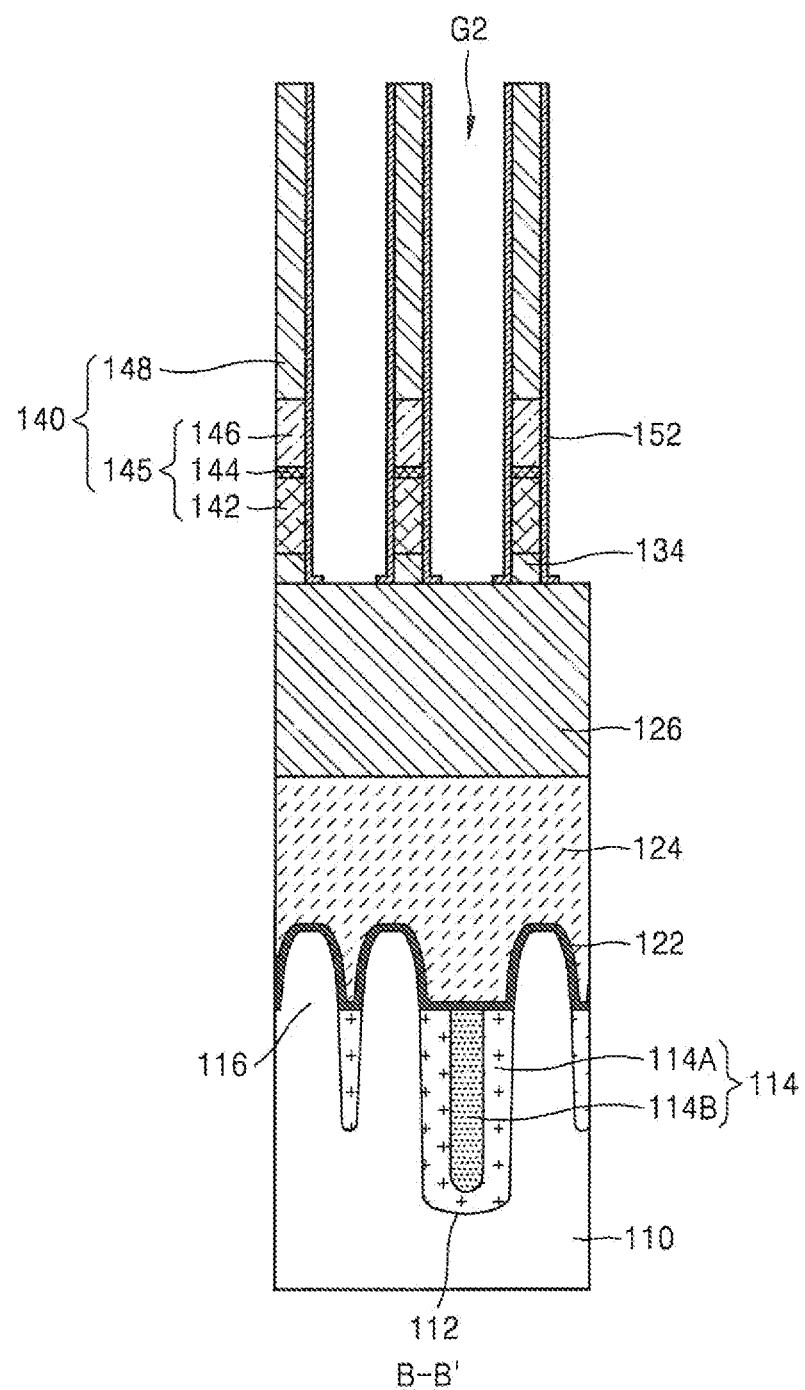
Figure 7C:
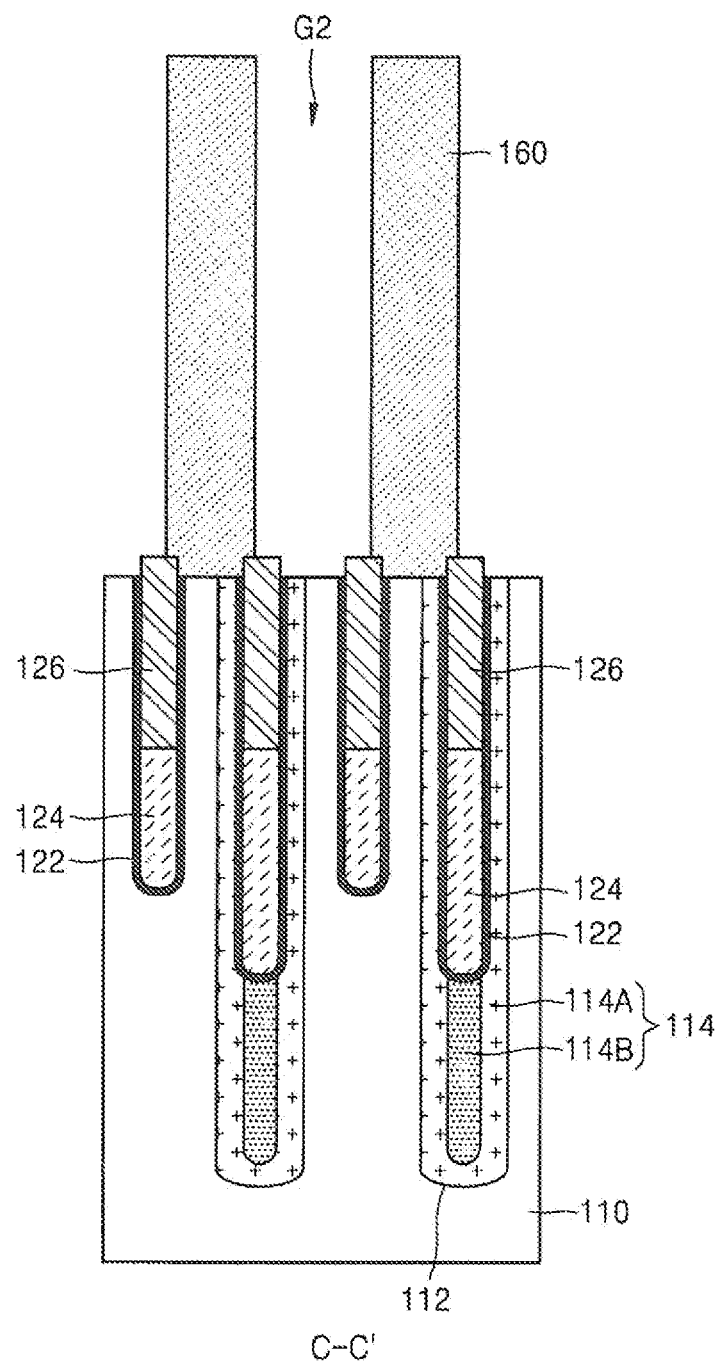
Figure 7D:
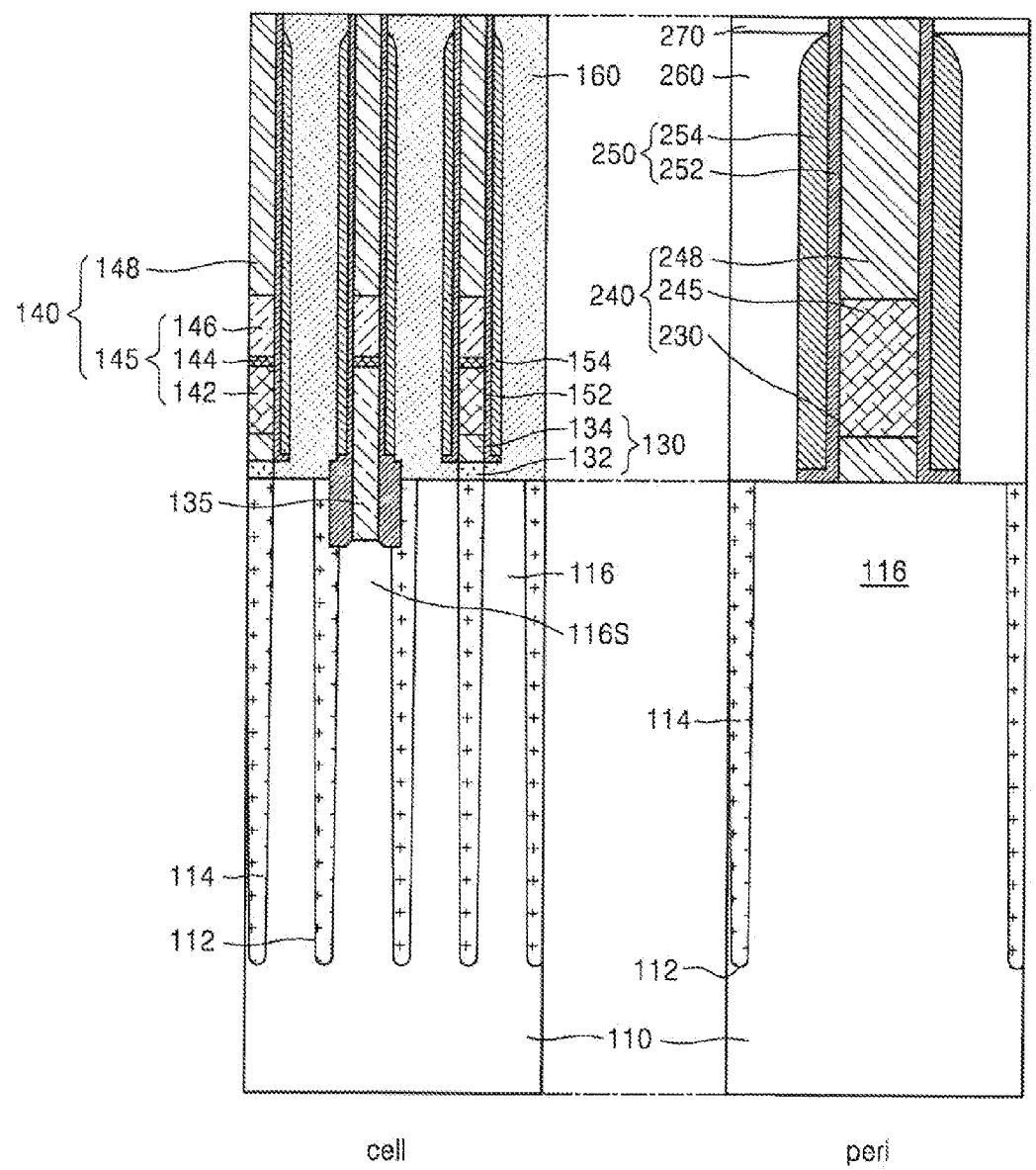
Figure 7E:
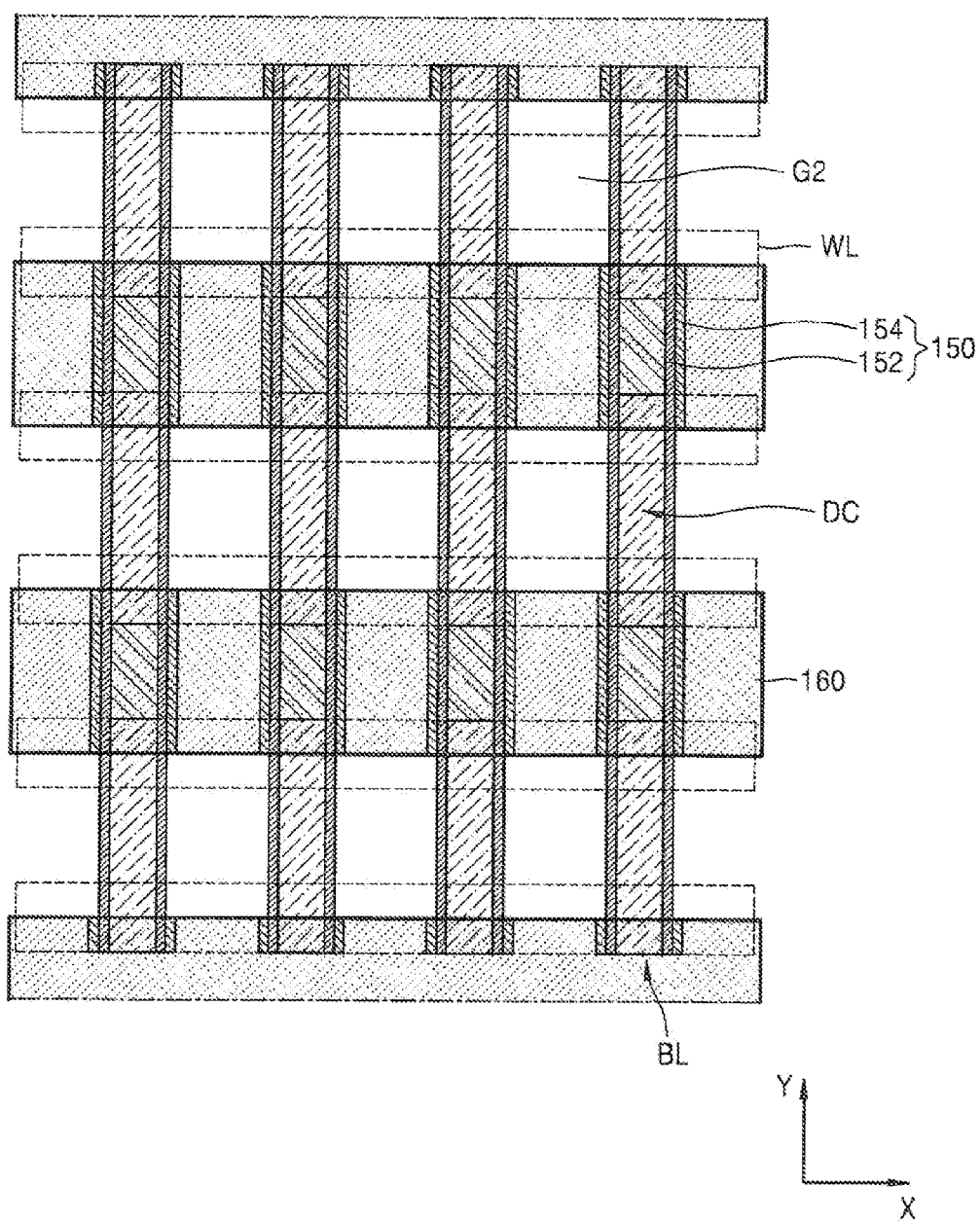
Figure 8A:
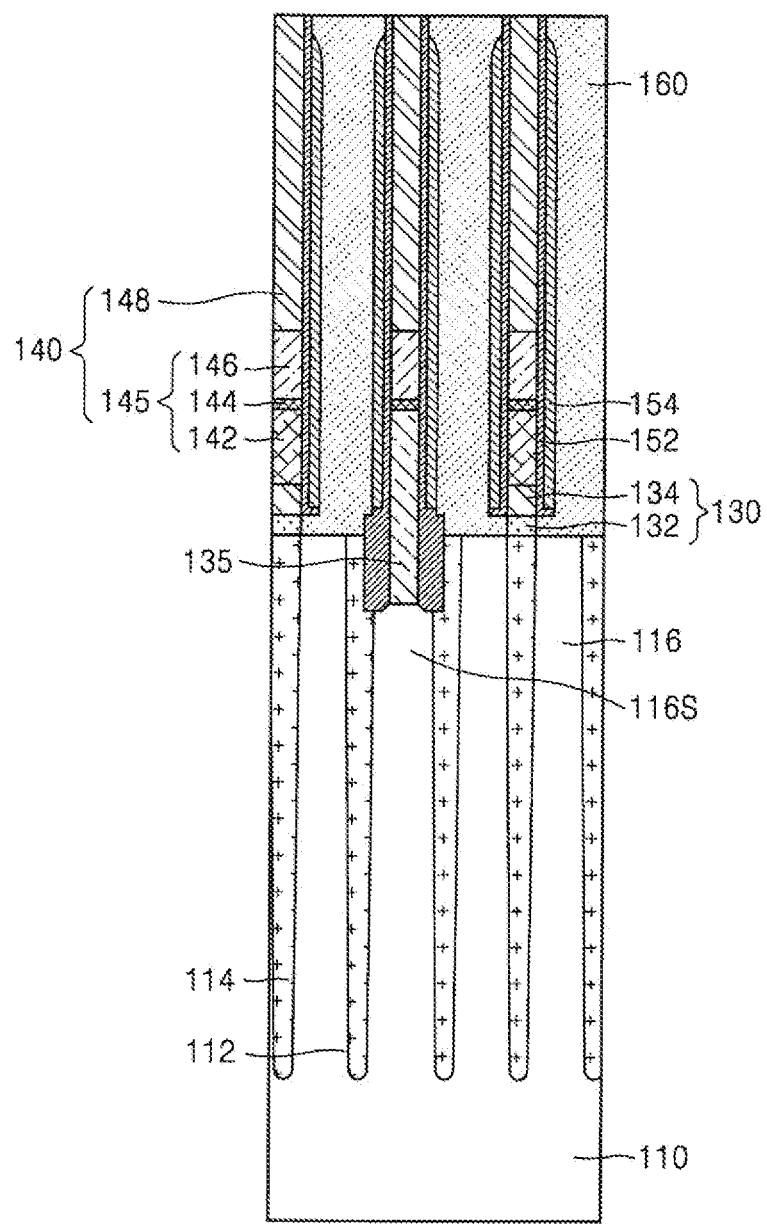
Figure 8B:
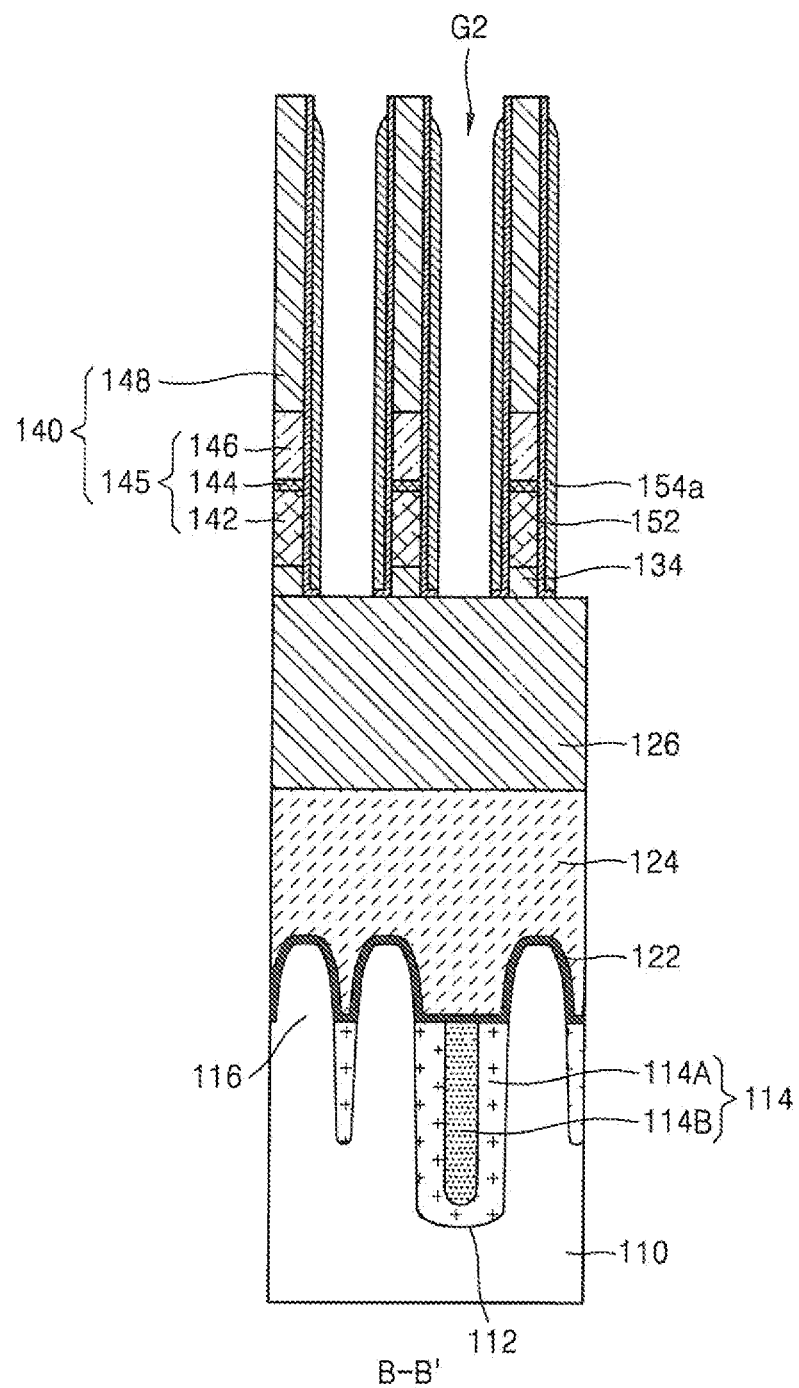
Figure 8C:
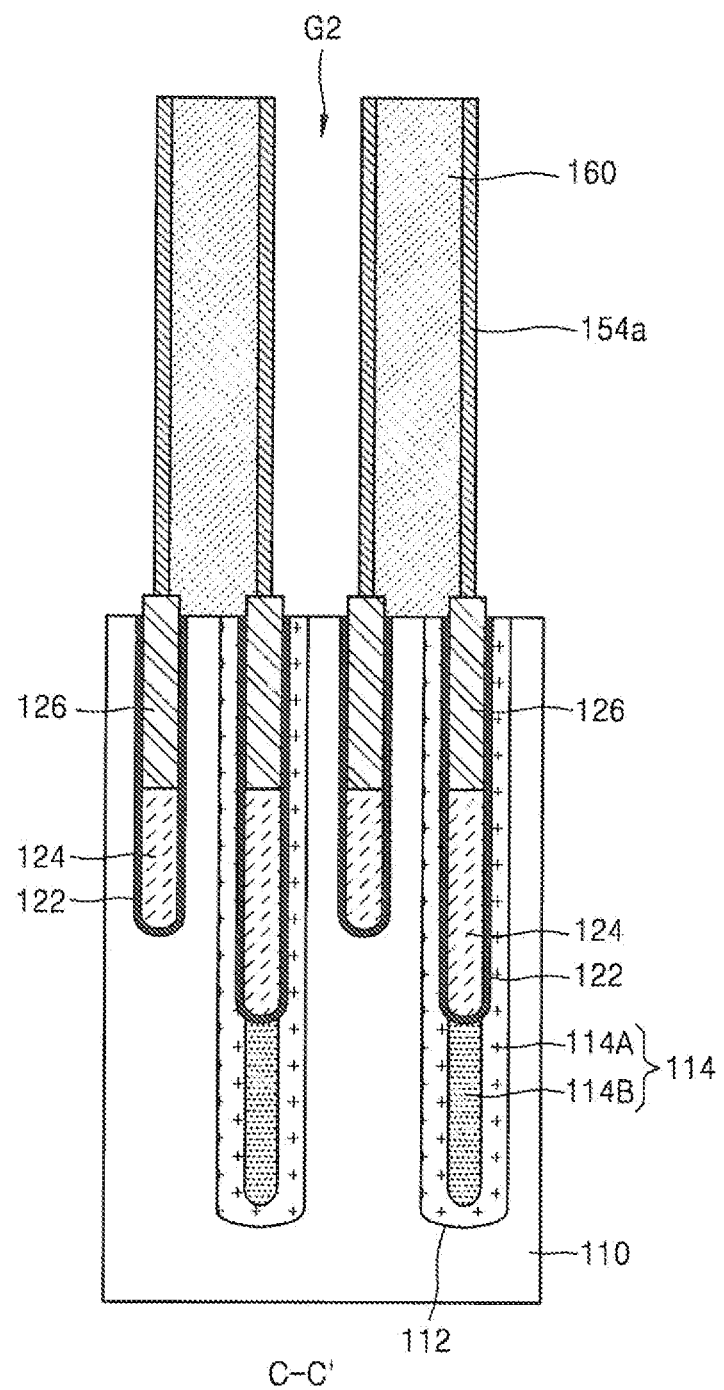
Figure 8D:
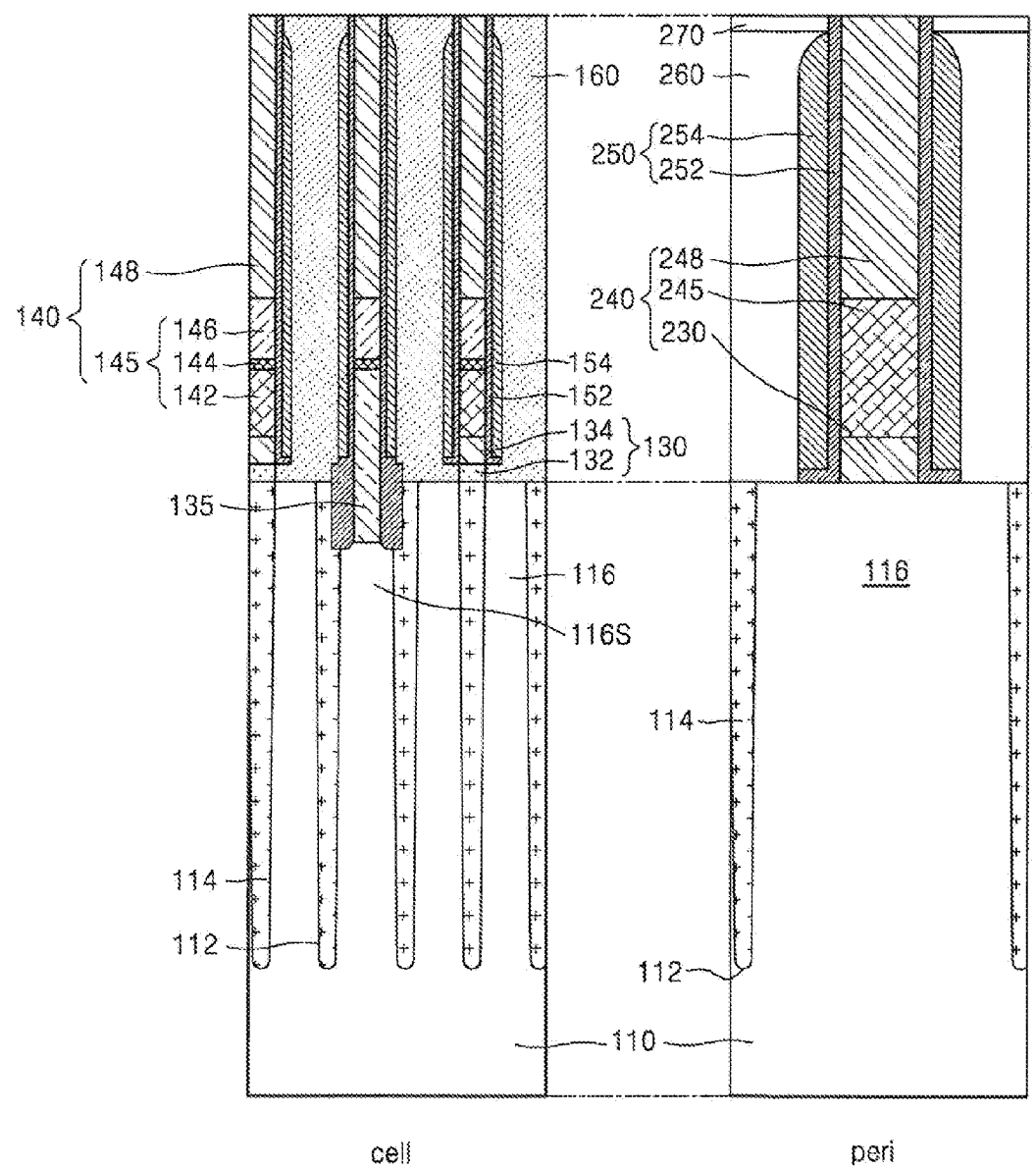
Figure 8E:
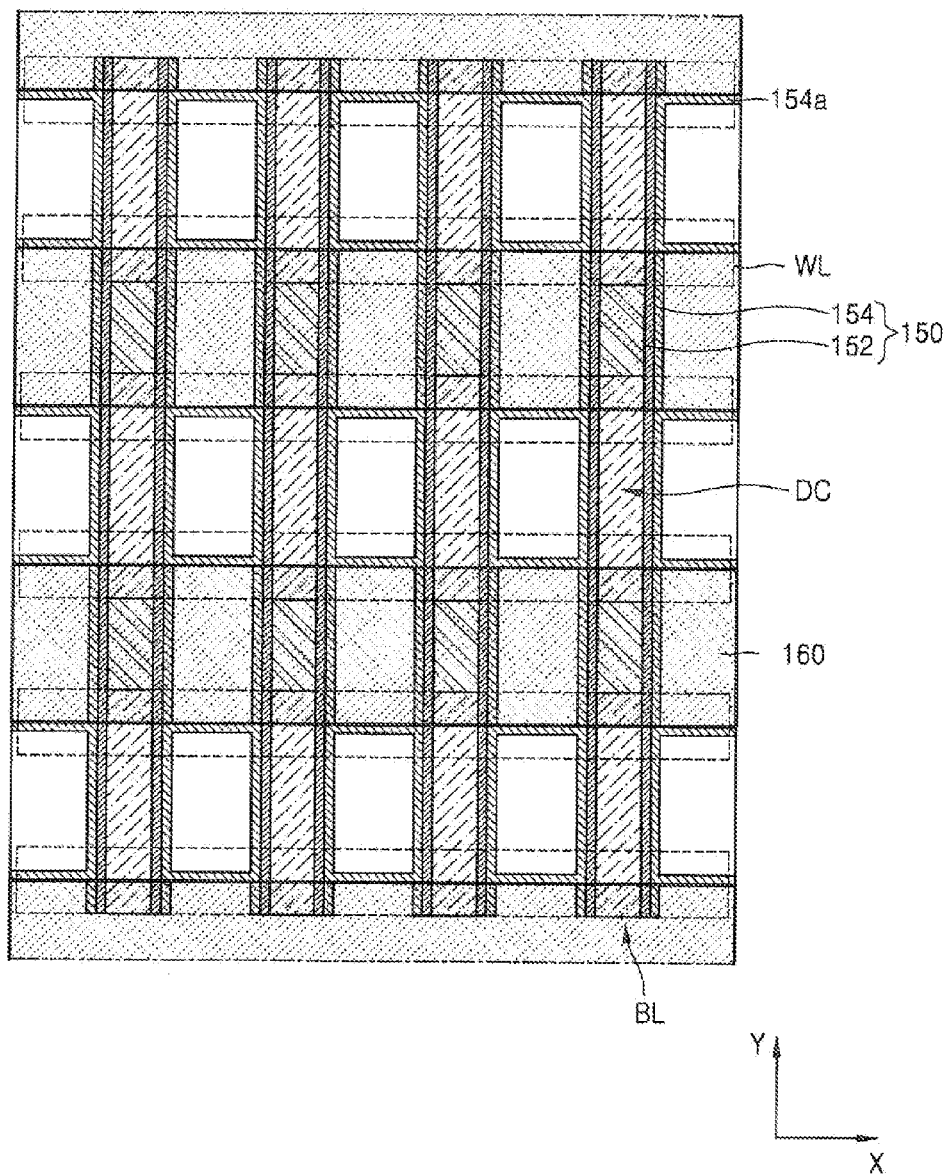
Figure 9A:
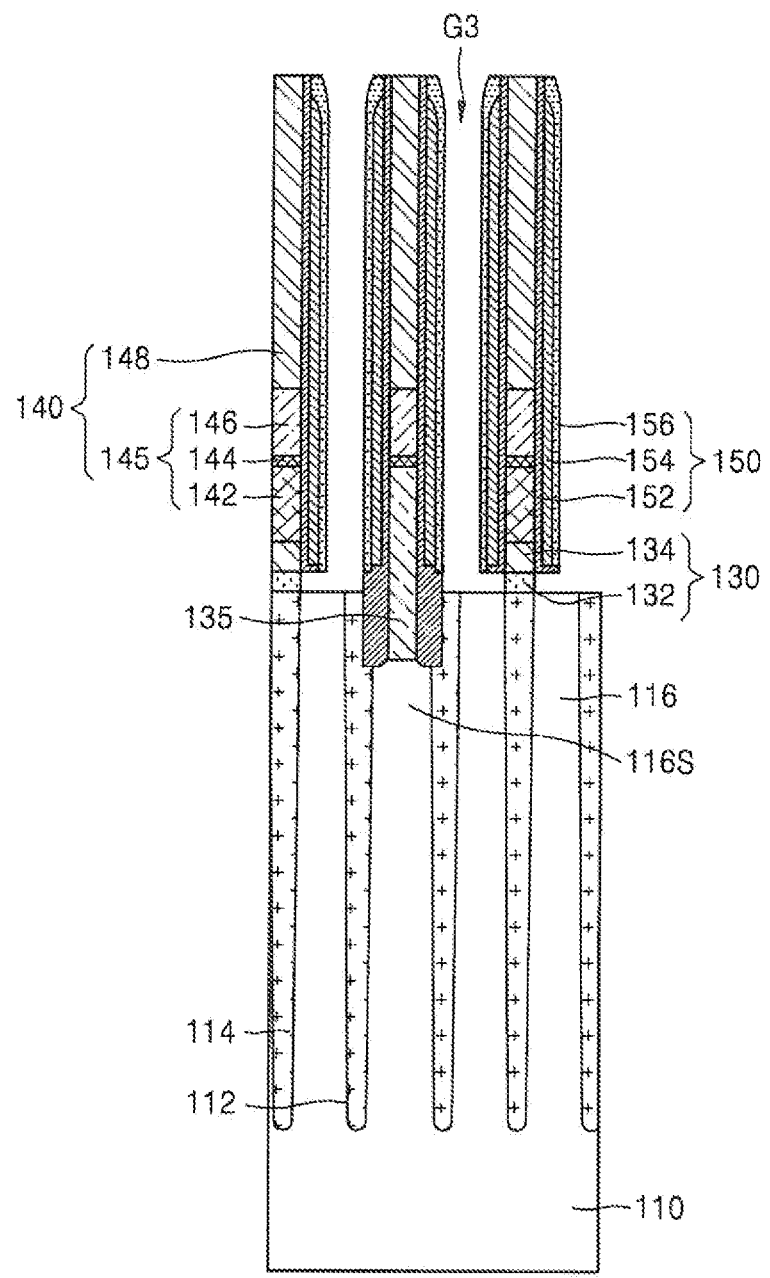
Figure 9B:
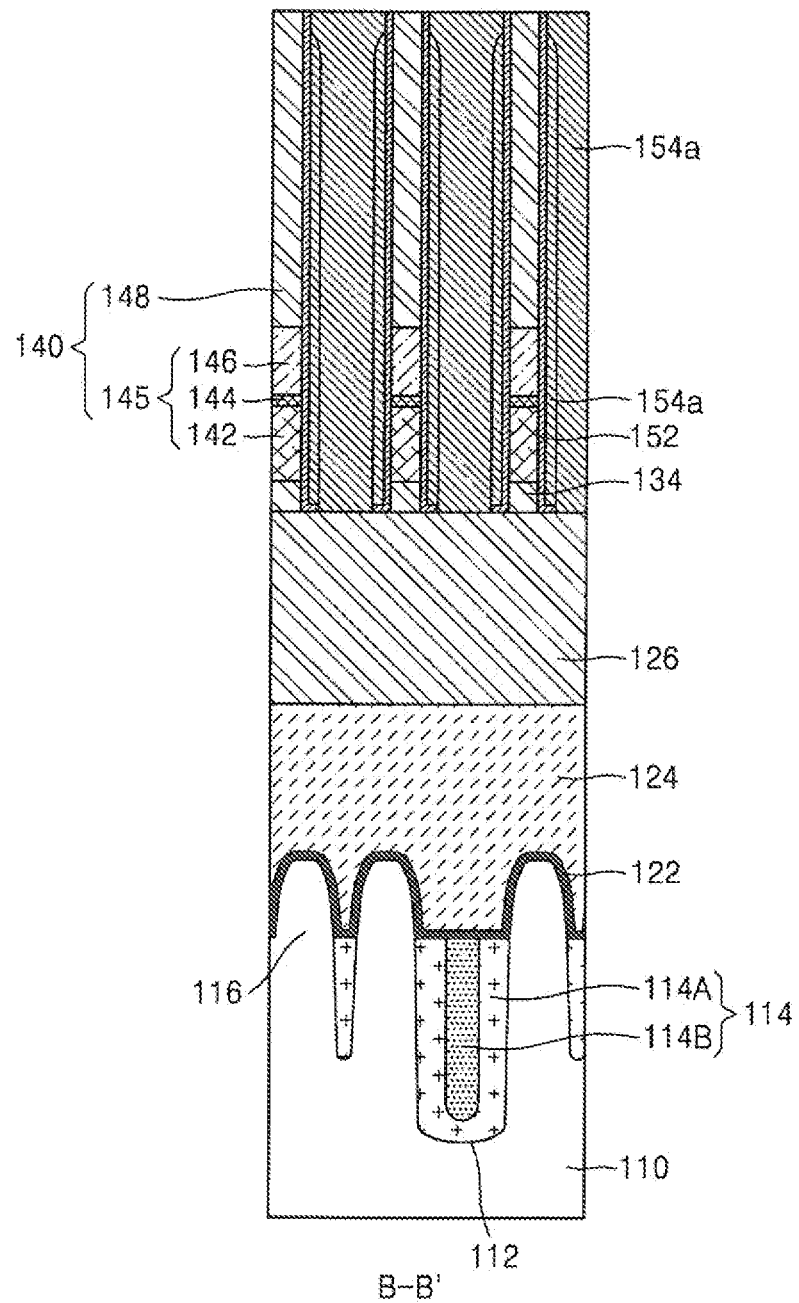
Figure 9C:
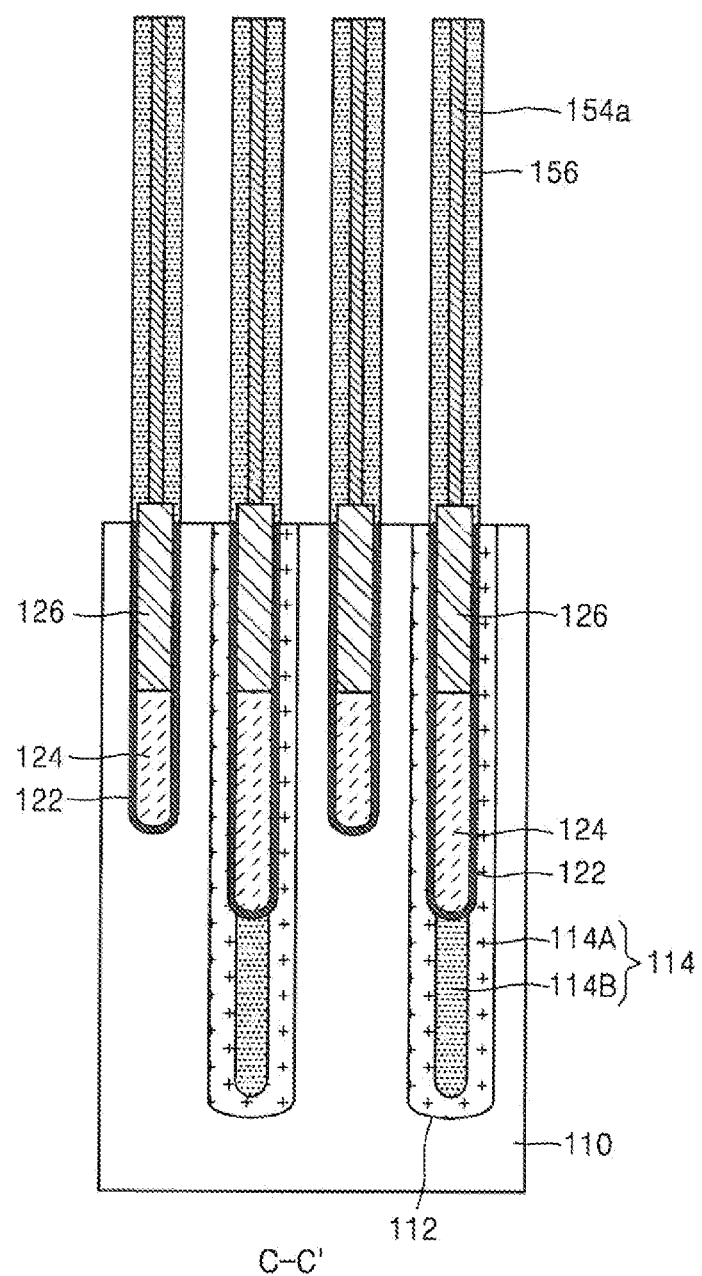
Figure 9D:
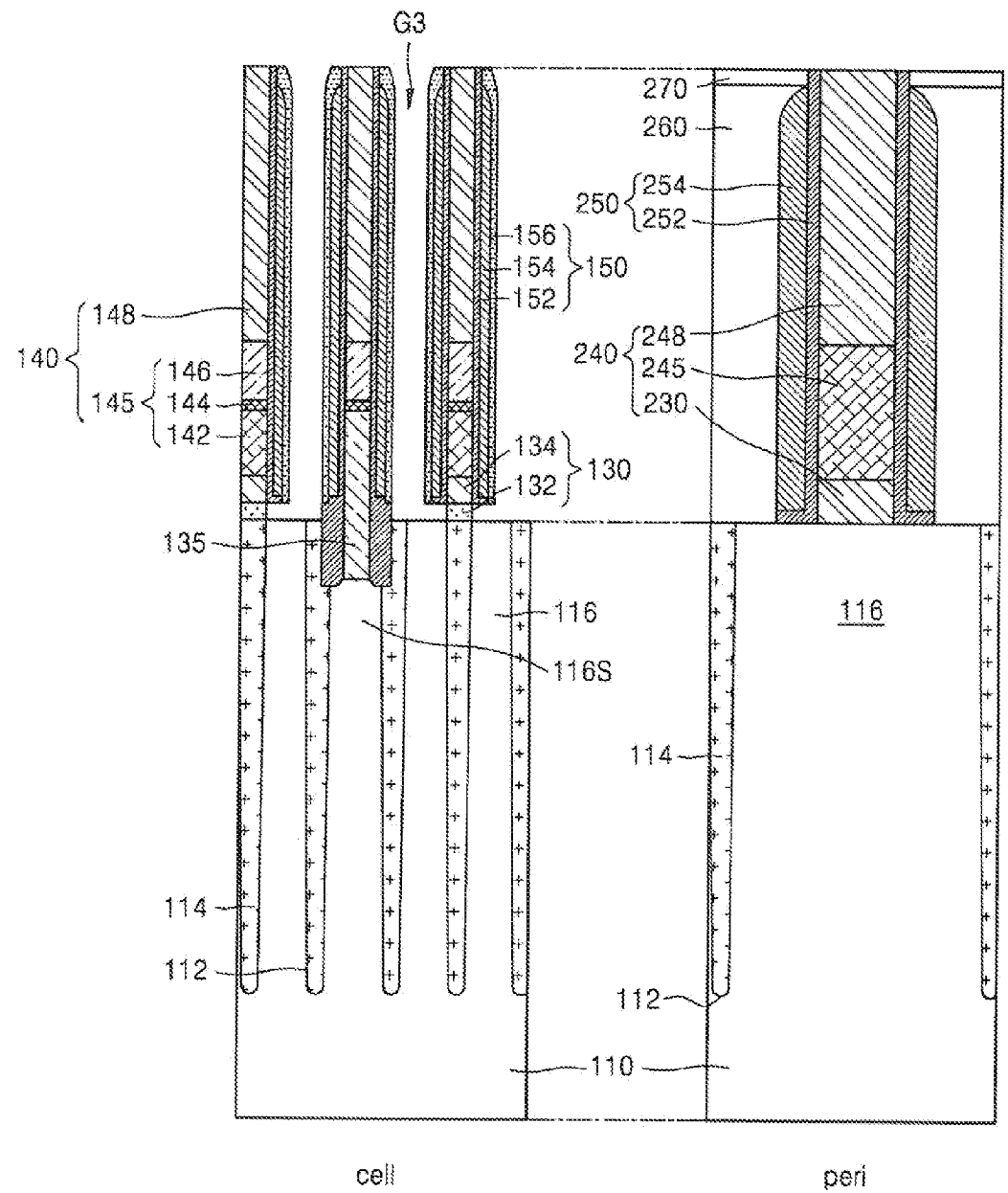
Figure 9E:
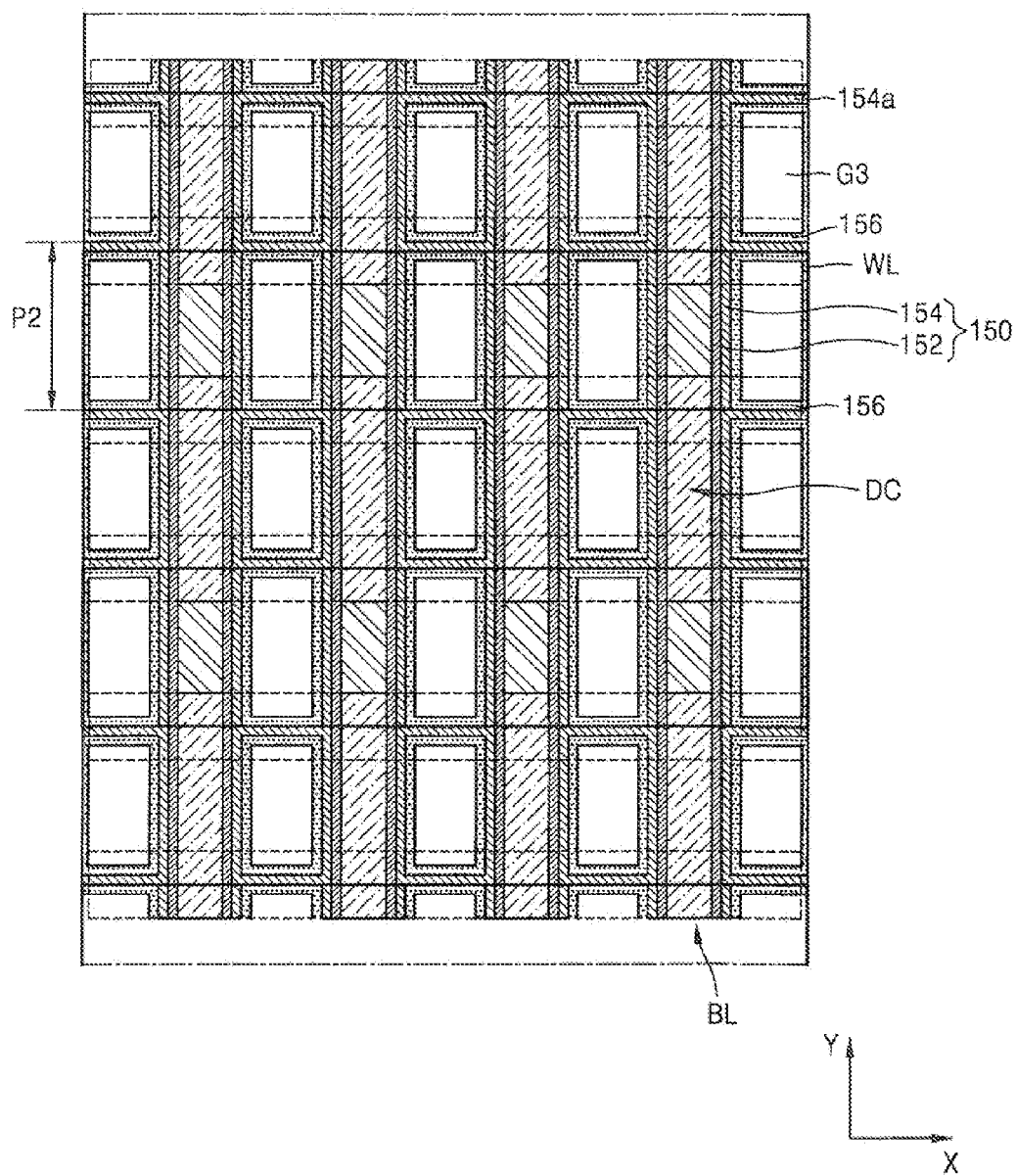

More specifically, mask patterns M (see FIG. 6E) may be formed on the planarized sacrificial layer 160, and the planarized sacrificial layer 160 may be etched using the mask patterns M and the spacer 150 to form the second grooves G2 exposing portions of the buried insulation layer 126. The mask patterns M may be formed to have line-shaped configurations so that top surfaces of portions of the planarized sacrificial layer 160 disposed over the word lines 124 are exposed. Thus, the second grooves G2 may be formed to expose top surfaces of portions of the buried insulation layer 126 over the word lines 124, as illustrated in FIG. 6C.

In particular, a pitch P1 of the mask patterns M may be approximately twice a pitch (P2 of FIG. 9E) of third grooves 03 which are formed in a subsequent process. The pitch P2 of the third grooves G3 may correspond to a pitch of buried contacts (180 of FIGS. 10A and 10C). Because the pitch P1 of the mask patterns M is greater than the pitch P2 of the third grooves G3, a photolithography process for forming the mask patterns M may be performed without any difficulties.

In the etch process for forming the second grooves G2, the bit line structures 140 and the multi-layered spacer 150 may be used as etch masks together with the mask patterns M. Accordingly, as illustrated in FIG. 6B, the second grooves G2 may be formed to expose the second spacers 154 corresponding to outer spacers of the multi-layered spacer 150 disposed on the sidewalls of the bit line structures 140.

As described above, because the bit line structures 140 and the multi-layered spacer 150 are perpendicular to the word lines 124 in a plan view, the bit line structures 140 and the multi-layered spacer 150 may also be perpendicular to the mask patterns M in a plan view. Thus, each of the second grooves G2, which are formed by an etch process employing the bit line structures 140, the multi-layered spacer 150 and the mask patterns M as etch masks, may be formed to have a rectangular shape surrounded by the multi-layered spacer 150 on the sidewalls of the bit line structures 140 and the sacrificial layer 160 in a plan view. After the second grooves G2 are formed, the mask patterns M may be removed.

The second grooves G2 may correspond to fence regions that surround buried contacts (BC of FIG. 1) which are formed in a subsequent process.

Referring to FIGS. 7A, 7B, 7C, 7D and 7E, the second spacers 154 corresponding to outer spacers of the multi-layered spacer 150 exposed by the second grooves G2 may be etched or removed to enlarge the second grooves G2 in the second direction.

If the second spacers 154 exposed by the second grooves G2 are removed, the enlarged second grooves G2 may be surrounded by the sacrificial layer 160 and the insulation liner 152. If the second spacers 154 are etched or removed to enlarge the second grooves G2, first fence insulation layers (154a of FIGS. 8B and 8C) may be uniformly deposited on sidewalls of the enlarged second grooves G2 in a subsequent process. In some embodiments, the etch process for etching or removing the second spacers 154 may be omitted.

Referring to FIGS. 8A, 8B, 8C, 8D and 8E, first fence insulation layers 154a may be formed on sidewalls of the second grooves G2. In some embodiments, the first fence insulation layers 154a may be formed by depositing an insulation layer on the resultant where the second grooves G2 or the enlarged second grooves G2 are formed and by anisotropically etching (or etching back) the insulation layer to expose at least the sacrificial layer 160. Thus, the first fence insulation layers 154a may be formed on sidewalls of the sacrificial layer 160 in the second direction (i.e., the X-axis direction) and on outer sidewalls of the multi-layered spacer 150 (or the insulation liner 152) in the first direction (i.e., the Y-axis direction). The first fence insulation layers 154a may constitute the multi-layered spacer 150 together with the insulation liner 152 and the second spacers 154. The first fence insulation layers 154a may be uniformly formed in the second grooves G2.

The first fence insulation layers 154a may be formed of the same material (e.g., an oxide material) as the second spacers 154.

Even though the etch process for removing the second spacers 154 is omitted, the first fence insulation layers 154a may be formed on the sidewalls of the sacrificial layer 160 in the second direction (i.e., the X-axis direction).

Referring to FIGS. 9A, 9B, 9C, 9D and 9E, the sacrificial layer 160 may be removed to form a plurality of third grooves G3 that expose portions of the active region 116. The third grooves G3 may be located at both sides of the first fence insulation layers 154a in the first and second directions (i.e., the Y-axis direction and the X-axis direction).

In some embodiments, if the sacrificial layer 160 is formed of an SOH material having a high etch selectivity with respect to the multi-layered spacer 150, the exposed portions of the active regions 116 illustrated in FIGS. 3A, 3B, 3C and 3D may be readily and stably reopened without any damage of the multi-layered spacer 150. That is, if the sacrificial layer 160 formed of an SOH material is removed using an ashing process or a strip process, loss of the second spacers 154 of the multi-layered spacer 150 may be suppressed and recession of the isolation layer 114 may also be suppressed.

The third grooves G3 may be formed by removing the sacrificial layer 160 using the first fence insulation layers 154a and the multi-layered spacer 150 as etch masks. Thus, the third grooves G3 may be formed by a self-aligned contact technique. As such, the second grooves G2 may be formed using the mask patterns M having a relatively large pitch, and the third grooves G3 may be formed using a self-aligned contact technique. Accordingly, a process for forming the buried contacts BC may be simplified.

Subsequently, second fence insulation layers 156 may be formed on sidewalls of the third groves G3. The first and second fence insulation layers 154a and 156 may constitute the multi-layered spacer 150 together with the insulation liner 152 (also, referred to as the first spacer) and the second spacers 154. The first and second fence insulation layers 154a and 156 may act as a fence region or a fence insulation layer that surrounds sidewalls of buried contacts which are formed in a subsequent process. The second fence insulation layers 156 may be formed of a nitride material. In some embodiments, a process for forming the second fence insulation layers 156 may be omitted.

Figure 10A:
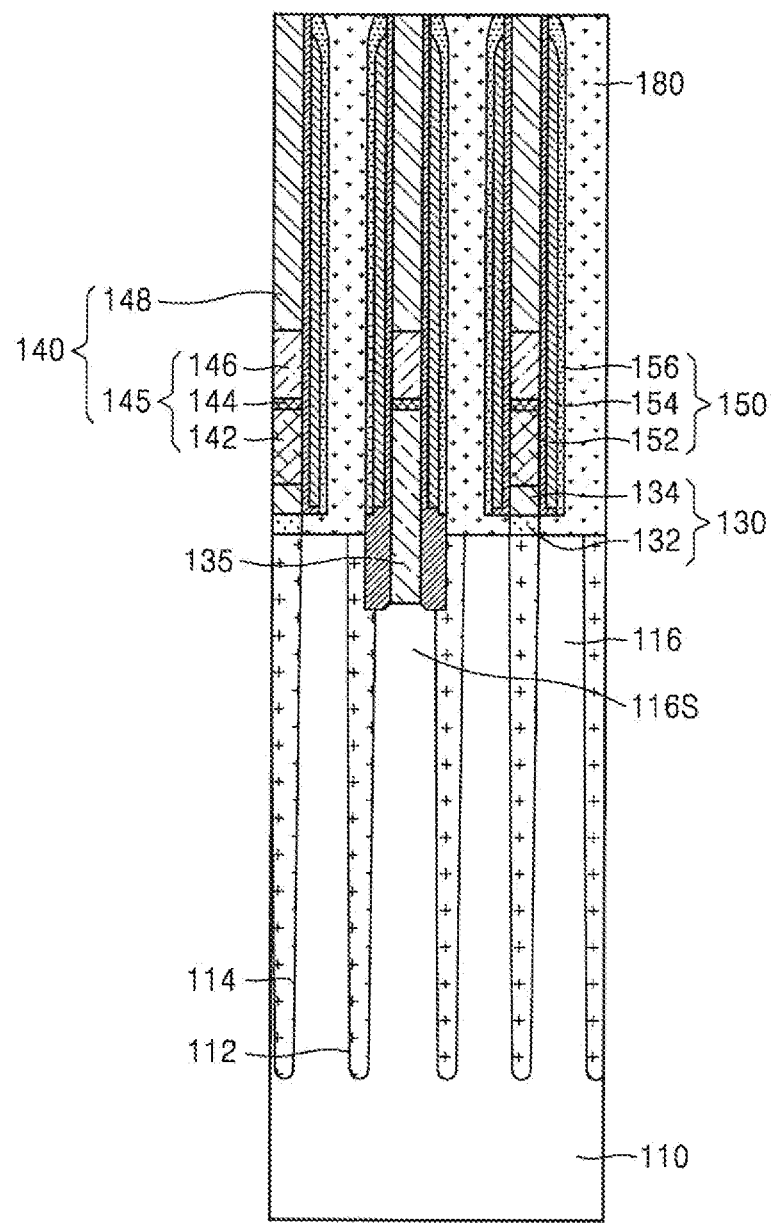
Figure 10B:
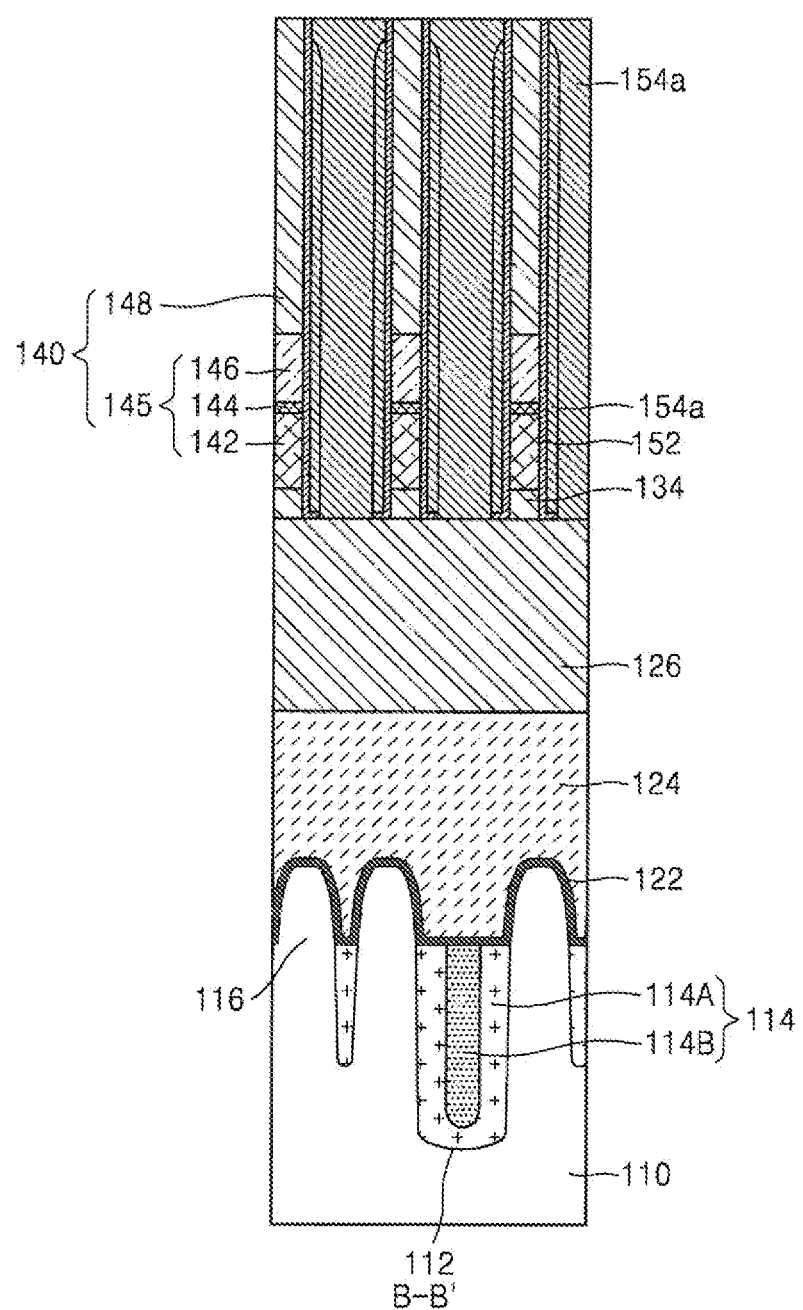
Figure 10C:
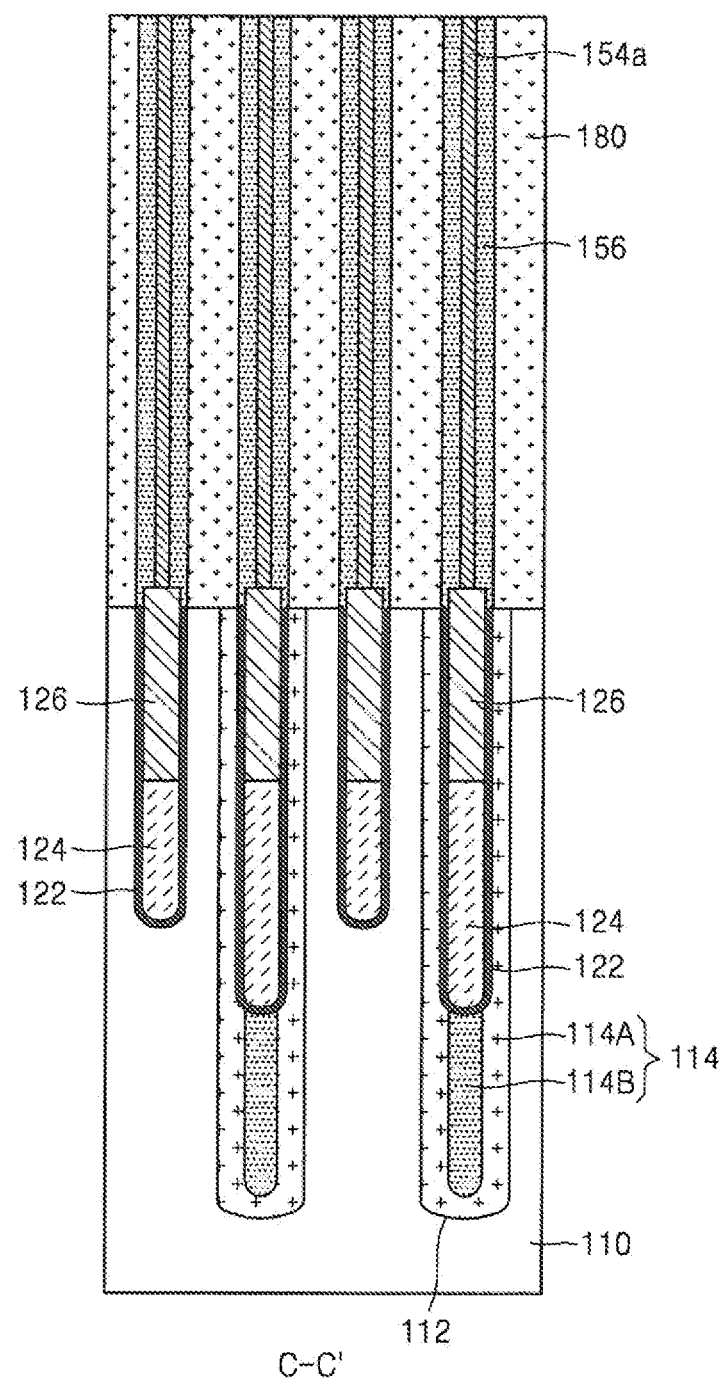

Referring to FIGS. 10A, 10B and 10C, a conductive layer may be formed to fill the third grooves G3 and to cover the bit line structures 140, the multi-layered spacer 150, and the first and second fence insulation layers 154a and 156. Thereafter, the conductive layer may be planarized using a CMP process to expose top surfaces of the bit line structures 140, the multi-layered spacer 150, and the first and second fence insulation layers 154a and 156. As a result, a plurality of buried contacts 180 may be formed in the third grooves G3.

In the present embodiment, the buried contacts 180 may be formed of a polysilicon material. The polysilicon material used in formation of the buried contacts 180 may be a doped polysilicon material. In some embodiments, the buried contacts 180 may be formed of a metal silicide material, a metal nitride material or a combination thereof.

Meanwhile, the buried contacts 180 may be formed of a metal material. In such a case, a metal silicide layer may be formed between the buried contacts 180 and the active regions 116. For example, the metal silicide layer may be a cobalt silicide layer. However, the metal silicide layer between the buried contacts 180 and the active regions 116 is not limited to a cobalt silicide layer. That is, a metal component of the metal silicide layer between the buried contacts 180 and the active regions 116 may be determined according to a metal component of the buried contacts 180.

In some embodiments, the buried contacts 180 may be formed by the following processes. First, after a surface of the resultant including the third grooves G3 is cleaned, a conductive layer may be formed on an entire surface of the cleaned resultant to fill the third grooves G3. The conductive layer may then be planarized using a CMP process until top surfaces of the bit line structures 140 are exposed, thereby forming the buried contacts 180 in the third grooves G3.

Figure 11A:
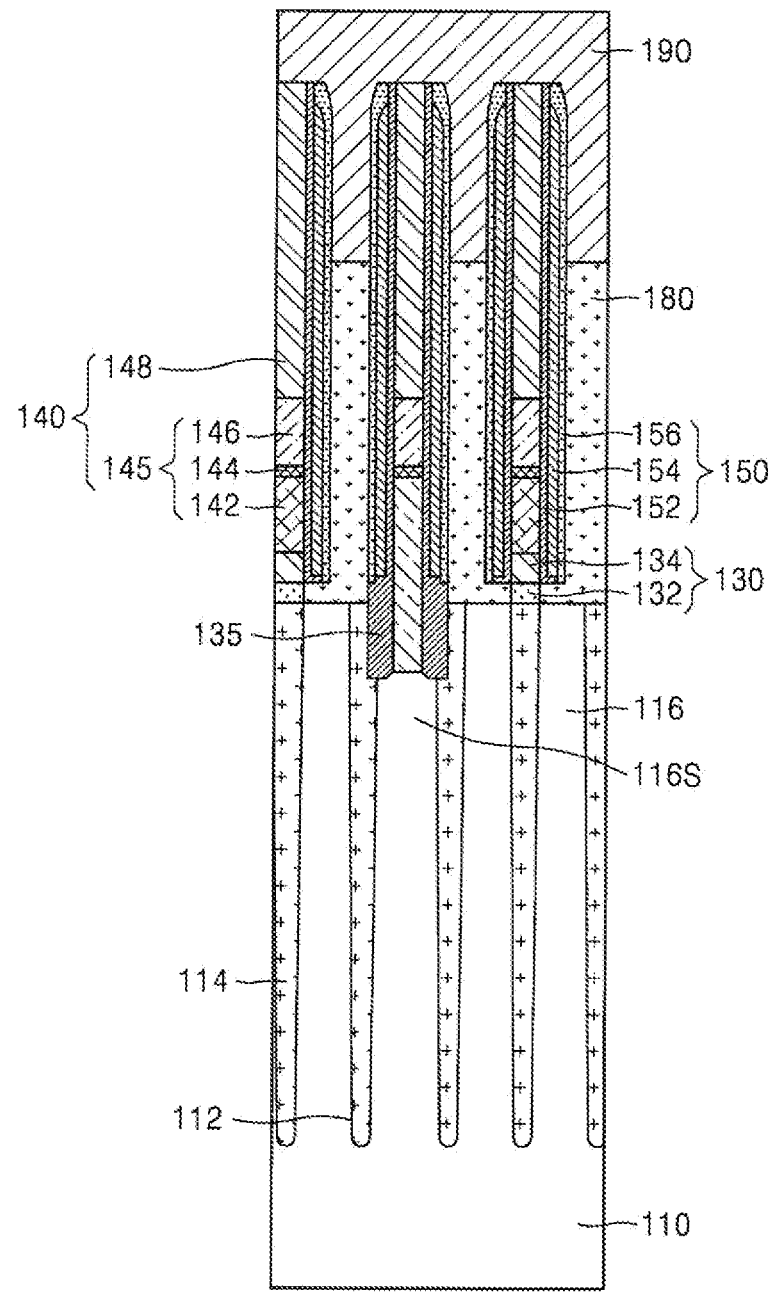
Figure 11B:
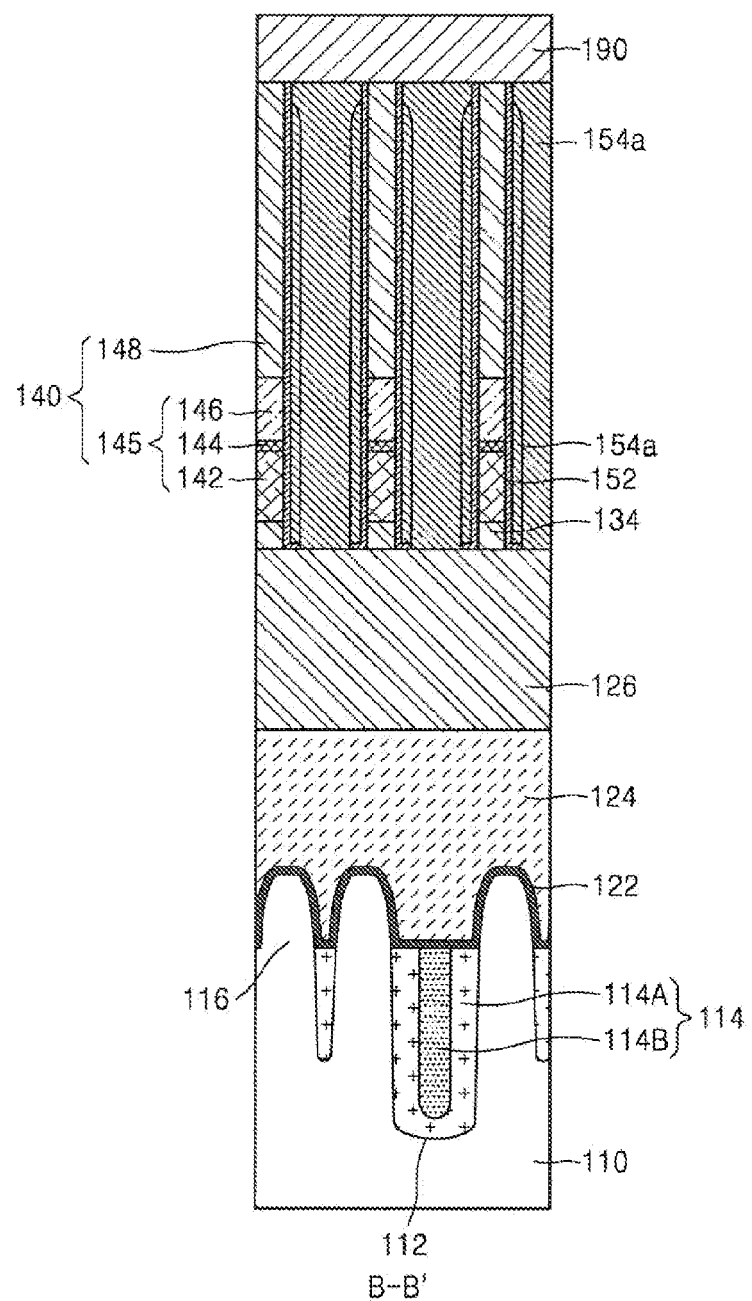
Figure 11C:
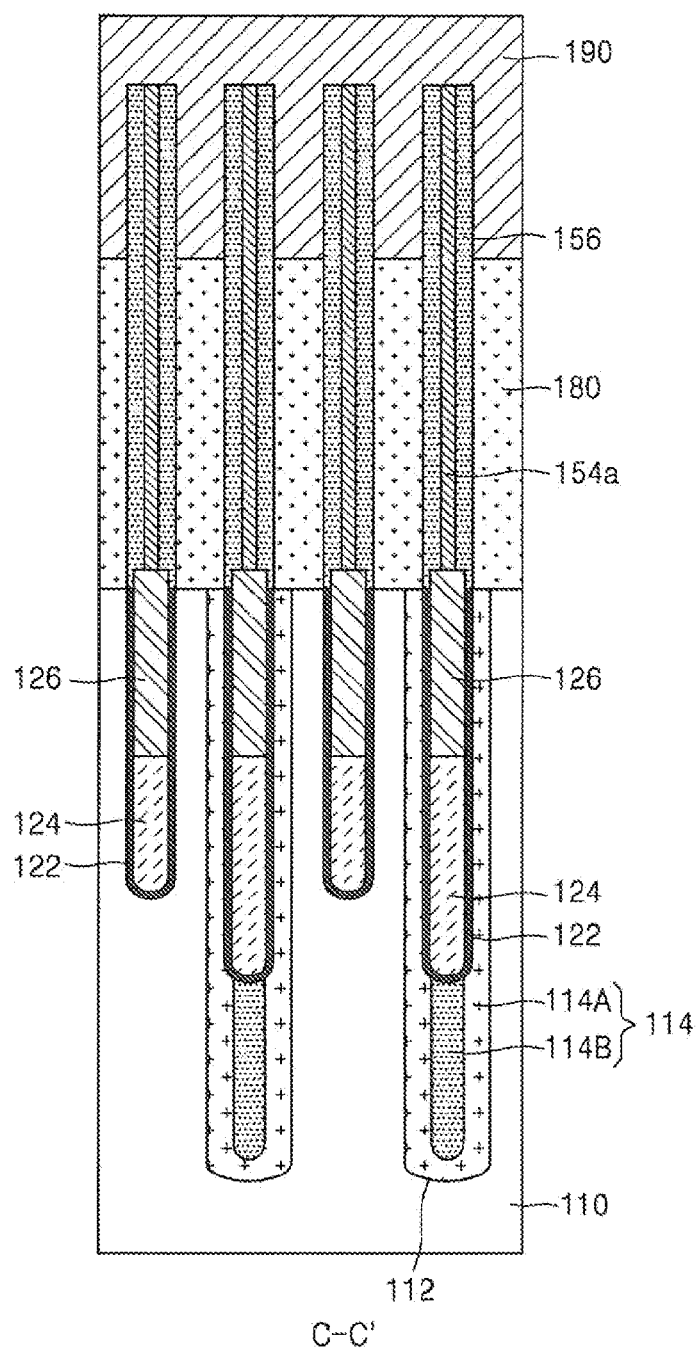

Referring to FIGS. 11A, 11B and 11C, the buried contacts 180 may be etched back to recess the buried contacts 180. Thus, grooves may be provided on the recessed buried contacts 180. A metal layer 190 may be formed to fill the grooves on the recessed buried contacts 180 and to cover the bit line structures 140, the multi-layered spacer 150, and the first and second fence insulation layers 154a and 156. Before the metal layer 190 is formed, metal silicide layers may be formed on top surfaces of the recessed buried contacts 180.

In some embodiments, the metal silicide layers on the recessed buried contacts 180 may be formed by the following processes. First, a metal material may be deposited on the recessed buried contacts 180 formed of a polysilicon material, and a first rapid thermal silicidation (RTS) process may be applied to the resultant including the metal material and the recessed buried contacts 180 to cause a chemical reaction of the metal material and the recessed buried contacts 180. The first RTS process may be performed at a temperature of about 450 degrees Celsius to about 550 degrees Celsius. Subsequently, the remaining metal material, which is unreacted with the recessed buried contacts 180 during the first RTS process, may be removed, and a second RTS process may be applied to the resultant where the unreacted metal material is removed to form the metal silicide layers on the top surfaces of the recessed buried contacts 180. The second RTS process may be performed at a temperature which is higher than a temperature at which the first RTS process is performed. For example, the second RTS process may be performed at a temperature of about 800 degrees Celsius to about 950 degrees Celsius. If the metal material is formed of a cobalt material, the metal silicide layers may be cobalt silicide layers. Even after the metal silicide layers are formed, the grooves may still exist on the metal silicide layers.

The metal layer 190 may be formed to include a barrier layer that is disposed to cover inner surfaces of the grooves on the recessed buried contacts 180 (or the metal silicide layers) and top surfaces of the bit line structures 140 and the multi-layered spacer 150, an internal metal layer that is disposed on the barrier layer to fill the grooves, and an upper metal layer that is disposed on the internal metal layer. In some embodiments, the barrier layer may be formed to have a stack structure including a titanium (Ti) layer and a titanium nitride (TiN) layer which are sequentially stacked. In some embodiments, at least one of the internal metal layer and the upper metal layer may be formed to include a tungsten layer.

In some embodiments, the metal layer 190 may be formed by the following processes. First, after the resultant including the grooves on the recessed buried contacts 180 (or the metal silicide layers) is cleaned, the barrier layer may be formed on an entire surface of the cleaned resultant. Subsequently, a multi-layered metal material may be deposited on the barrier layer to fill the grooves, and the multi-layered metal material may be planarized to form the internal metal layer and the upper metal layer. Alternatively, the internal metal layer and the upper metal layer may be separately formed. For example, a metal material layer may be formed on the barrier layer to fill the grooves, and the metal material layer may be planarized or etched back to expose the barrier layer on the top surfaces of the bit line structures 140 and to form the internal metal layers in the grooves. Thereafter, another metal material layer is formed on the exposed barrier layer and the internal metal layers, and the other metal material layer may be planarized to form the upper metal layer.

Figure 12A:
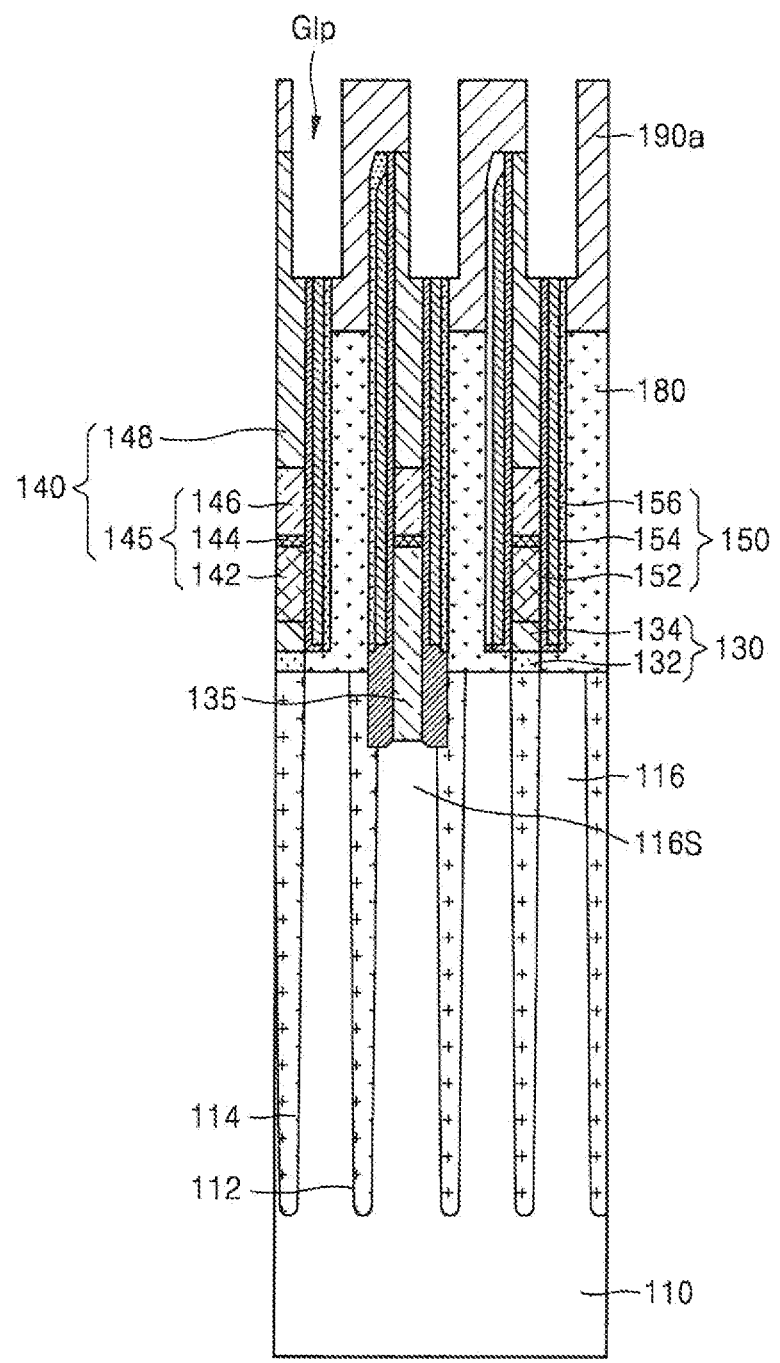
Figure 12B:
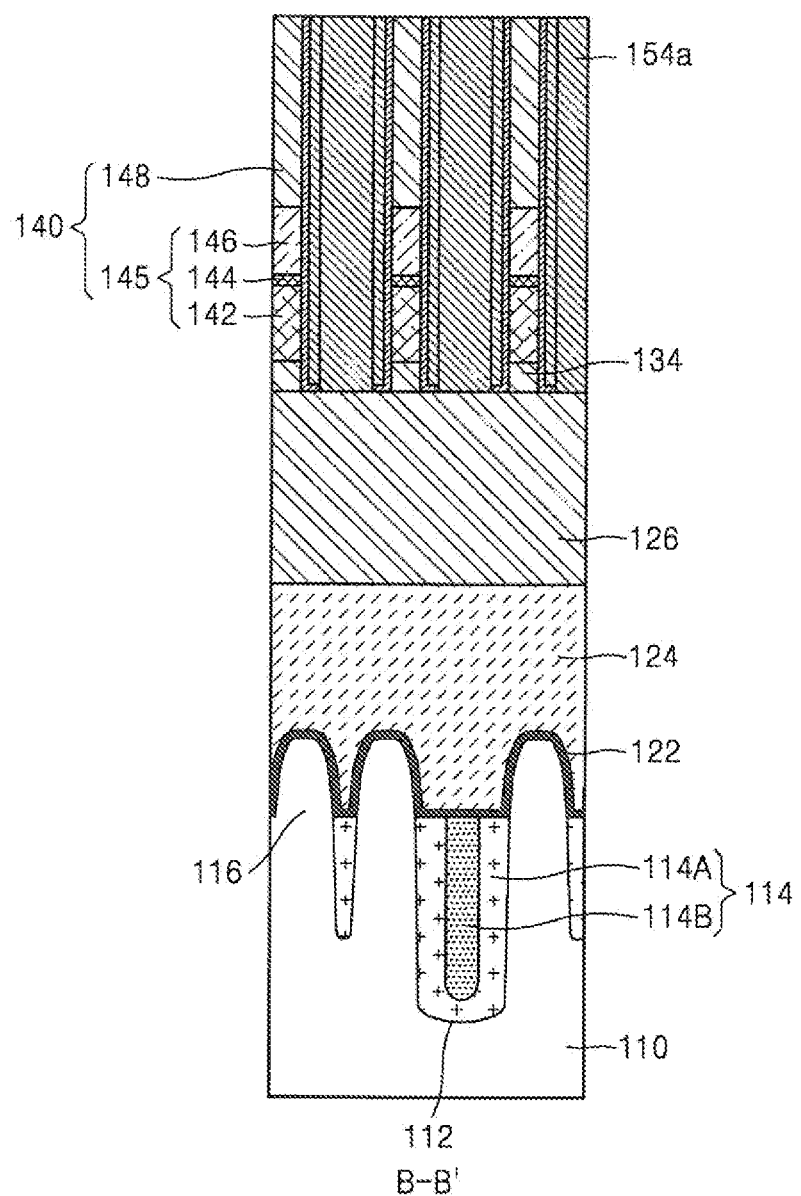
Figure 12C:
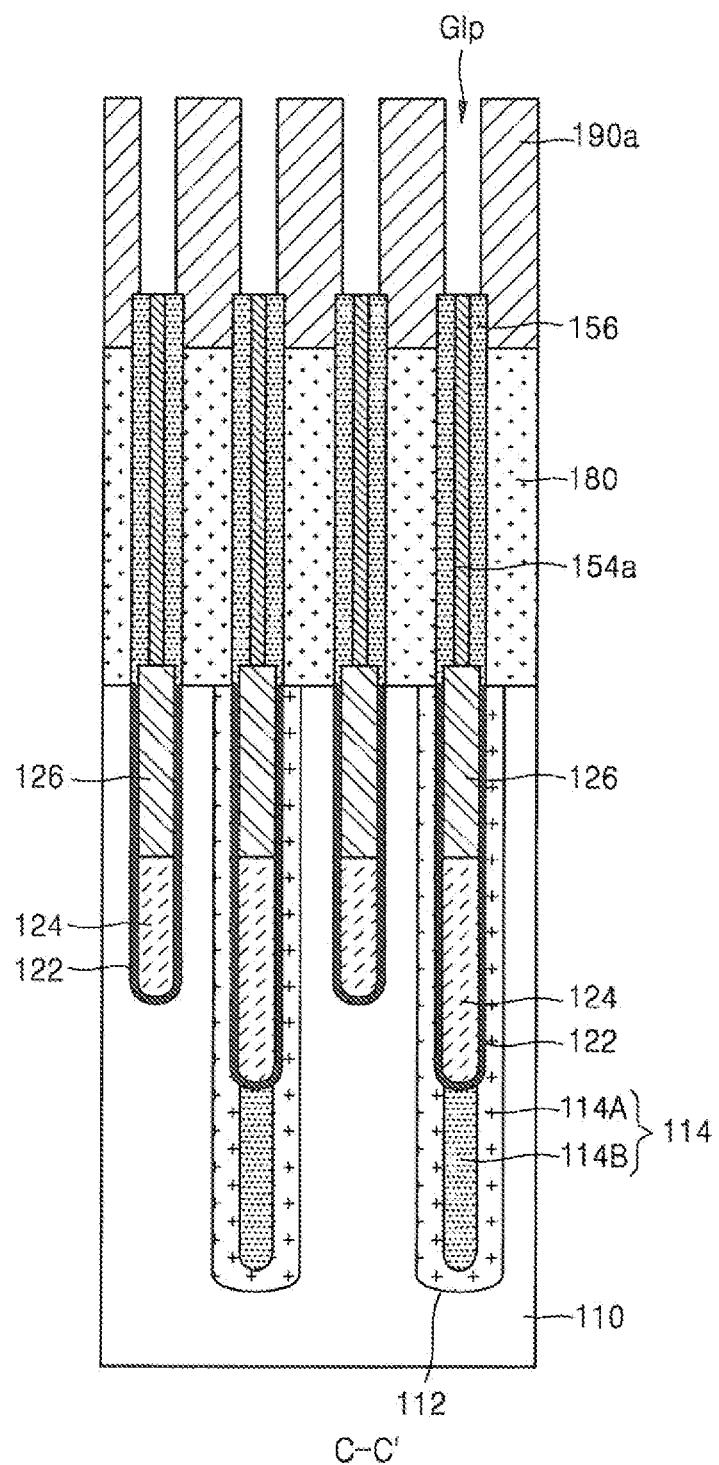

Referring to FIGS. 12A, 12B and 12C, a mask pattern may be formed on the metal layer 190. The metal layer 190, the bit line structures 140, the multi-layered spacer 150 and the first and second fence insulation layers 154a and 156 may be etched using the mask pattern as an etch mask to form a plurality of lading pads 190a which are respectively connected to the buried contacts 180.

The mask pattern may be formed to include a plurality of island-shaped patterns corresponding to the landing pads LP illustrated in FIG. 1. Thus, while the lading pads 190a are formed, a landing pad groove Glp may be formed to physically separate and electrically insulate the lading pads 190a from each other. The landing pad groove Glp may be formed to expose sidewalls of the bit line structures 140 and top surface of the etched multi-layered spacer 150.

Specifically, while the landing pad groove Glp for separating the lading pads 190a is formed, upper portions of the insulation capping lines 148 included in the bit line structures 140 and upper portions of the multi-layered spacer 150 disposed on sidewalls of the insulation capping lines 148 may be etched. Thus, the sidewalls of the insulation capping lines 148 and the top surfaces of the etched multi-layered spacer 150 may be exposed by the landing pad groove Glp.

As illustrated in FIG. 12A, while the landing pad groove Glp is formed, upper-right portions of the insulation capping lines 148 may be removed and only upper portions of the multi-layered spacer 150 on the right sidewalls of the insulation capping lines 148 may be removed. Accordingly each of the landing pads 190a may be formed to cover a top surface of a left portion of any one of the insulation capping lines 148 and to cover the multi-layered spacer 150 disposed on a left sidewall of any one of the insulation capping lines 148.

As a result, like the landing pads LP disposed along a line L1 of FIG. 1, the landing pads 190a may be arrayed in a zigzag fashion to alternately cover the multi-layered spacer 150 on the left sidewalls of the bit line structures 140 and the multi-layered spacer 150 on the right sidewalls of the bit line structures 140 along the first direction (i.e., the Y-axis direction). In addition, the landing pads 190a arrayed in each row parallel with the second direction (i.e., the X-axis direction) may be formed to cover the multi-layered spacer 150 disposed on the right sidewalls (or the left sidewalls) of the bit line structures 140. After the landing pads 190a are formed, the mask pattern may be removed.

Figure 13A:
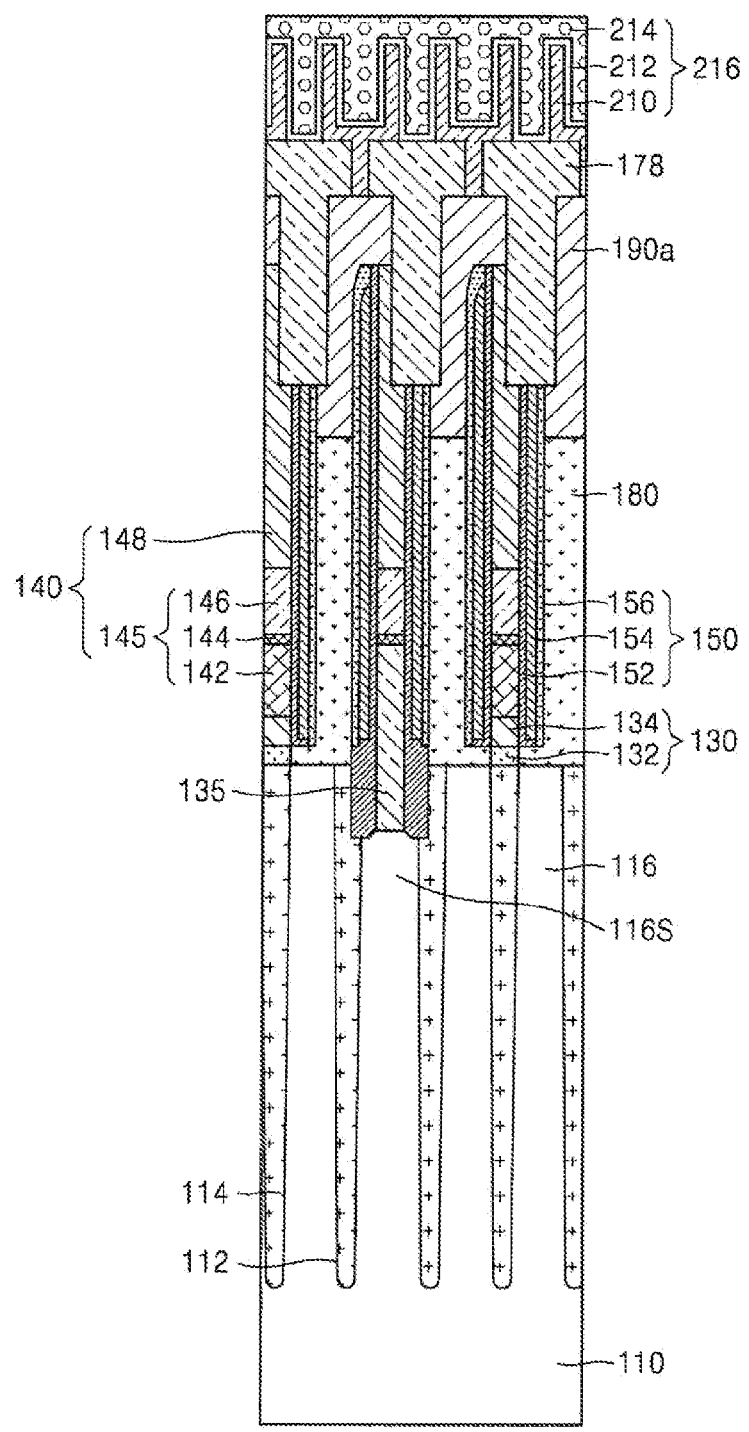
Figure 13B:
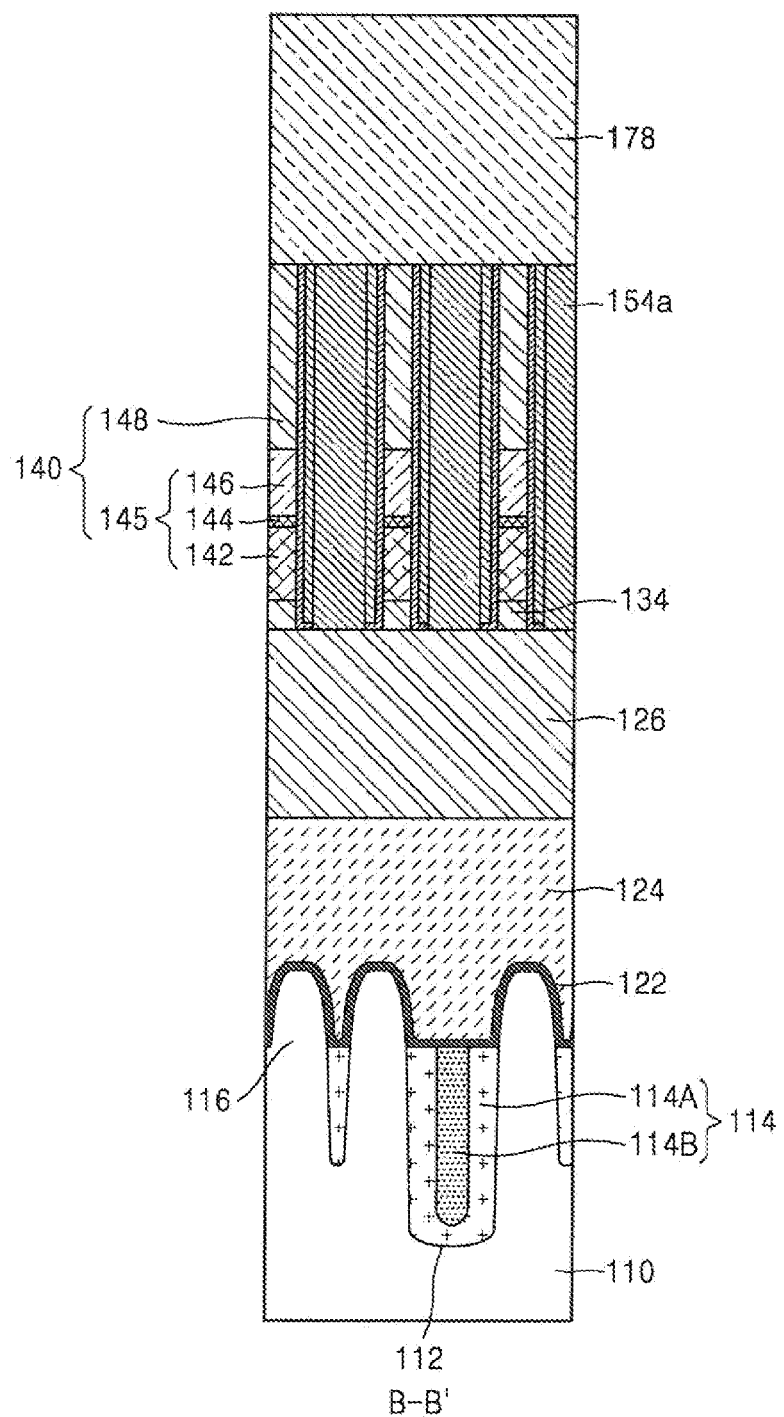
Figure 13C:
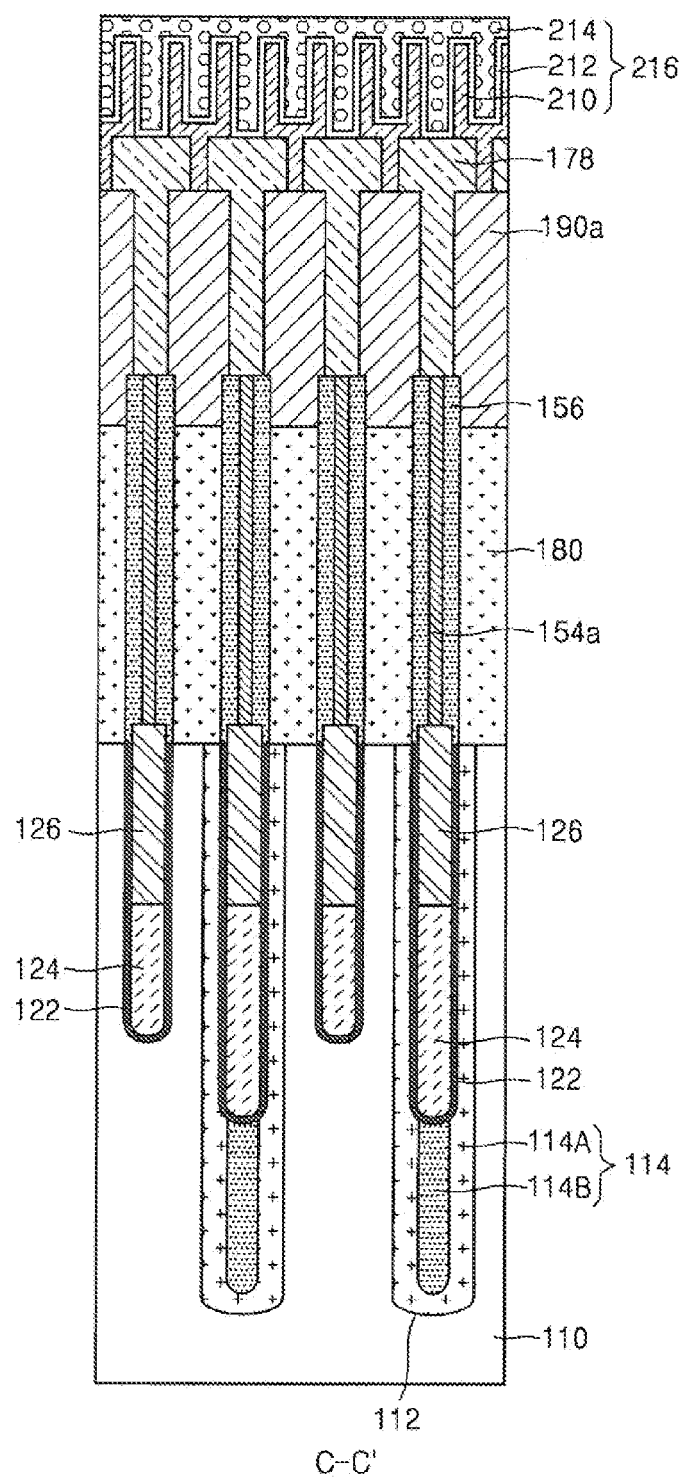

Referring to FIGS. 13A, 13B and 13C, after the mask pattern for forming the landing pads 190a is removed, a capping insulation layer 178 may be formed to fill the landing pad groove Glp and to cover the landing pads 190a. The capping insulation layer 178 may be formed of an insulation material such as an oxide material or a nitride material.

After the capping insulation layer 178 is formed, a plurality of capacitors 216 electrically connected to the landing pads 190a may be formed on the capping insulation layer 178. Each of the capacitors 216 may be formed to include a lower electrode 210 (also, referred to as a storage node), a dielectric layer 212 and an upper electrode 214 which are sequentially stacked. The lower electrodes 210 may penetrate the capping insulation layer 178 to contact the landing pads 190a.

Figure 14:
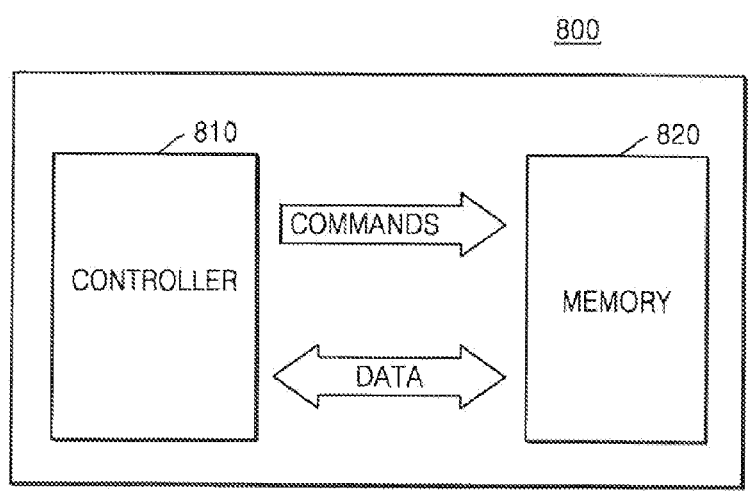
FIG. 14 is a block diagram of a memory card including a semiconductor device fabricated according to an embodiment of the inventive concept.

FIG. 14 is a block diagram of a memory card 800 including at least one of the semiconductor devices fabricated according to some embodiments of the inventive concept.

Referring to FIG. 14, the memory card 800 may include a controller 810 and a memory 820 that exchange electrical signals. For example, if the controller 810 outputs commands to the memory 820, the memory 820 may output data to the controller 810 in response to the commands. The controller 810 and/or the memory 820 may include at least one selected from the semiconductor devices fabricated according to the embodiments of the inventive concept. The memory card 800 may be any one of various cards including memory stick cards, smart media (SM) cards, secure digital (SD) cards, mini secure digital (SD) cards, and multi media cards (MMC).

Figure 15:
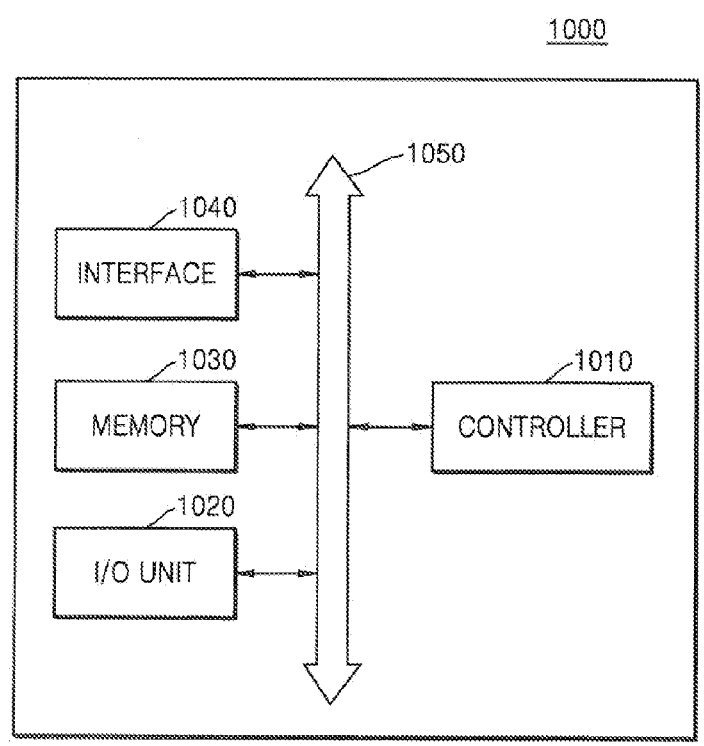
FIG. 15 is a block diagram of an electronic system including a semiconductor device fabricated according to an embodiment of the inventive concept.

FIG. 15 is a block diagram illustrating an electronic system 1000 including at least one of the semiconductor devices fabricated according to some embodiments of the inventive concept.

Referring to FIG. 15, the electronic system 1000 may include a controller 1010, an input/output (I/O) unit 1020, a memory 1030 and an interface 1040. The electronic system 1000 may be a mobile system that receives and/or outputs information data. The mobile system may include a personal digital assistant (PDA), a portable computer, a web tablet, a wireless phone, a mobile phone, a digital music player and a memory card.

The controller 1010 may execute programs and may control overall operations of the electronic system 1000. The controller 1010 may include at least one of the semiconductor devices fabricated according to some embodiments of the inventive concept. The controller 1010 may be, for example, a microprocessor, a digital signal processor (DSP), a microcontroller, or the like.

The I/O unit 1020 may be used to input data into the electronic system 1000 or to output the data stored in the electronic system 1000. The electronic system 1000 may be connected to an external device or an external system through the I/O unit 1020 to communicate with the external device or the external system. The I/O unit 1020 may be, for example, a keypad, a keyboard or a display unit.

The memory 1030 may store codes and/or data for operations of the controller 1010 or may store data that are processed by the controller 1010. The memory 1030 may include at least one of the semiconductor devices fabricated according to the embodiments of the inventive concept. The interface 1040 may provide a data transmission path between the electronic system 1000 and an external device or an external system. The controller 1010, the I/O unit 1020, the memory 1030 and the interface 1040 may communicate with each other through a bus 1050.

The electronic system 1000 may be applied to a mobile phone, an MP3 player, a navigation system, a portable multimedia player (PMP), a solid state disk (SSD) or a household appliance.

Figure 16:
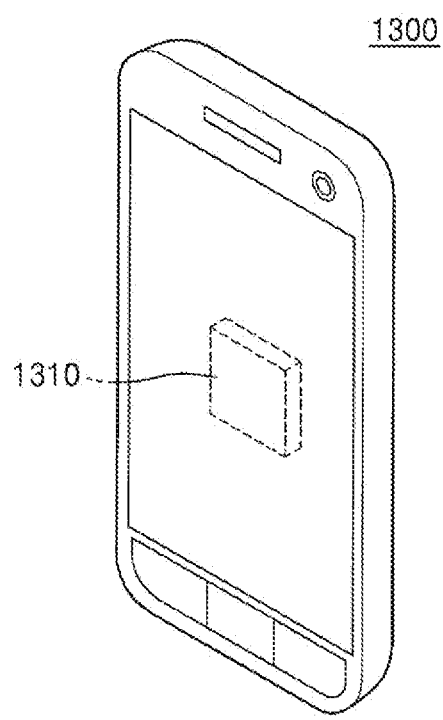
FIG. 16 illustrates an electronic device including a semiconductor device fabricated according to an embodiment of the inventive concept.

FIG. 16 is perspective view of an electronic device 1300 including at least one of the semiconductor devices fabricated according to some embodiments of the inventive concept.

Referring to FIG. 16, the electronic device 1300 may be a mobile phone to which the electronic system 1000 is applied. The mobile phone 1300 may include a system on chip 1310. The system on chip 1310 may include at least one of the semiconductor devices fabricated according to some embodiments of the inventive concept. The system on chip 1310 of the electronic device 1300 may include a high performance main function block therein. Thus, the electronic device 1300 may correspond to a high performance mobile phone.

Moreover, the system on chip 1310 may have substantially the planar area as a high performance semiconductor chip included therein. Thus, if the electronic device 1300, that is, the mobile phone is configured to include the system on chip 1310, a size of the mobile phone 1300 may be minimized and the performance of the mobile phone 1300 may be improved.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor device, comprising:
    providing a substrate having a cell region and a peripheral circuit region;
    forming a plurality of bit line structures on the substrate in the cell region and a gate structure having the same structure as each of the bit line structures on the substrate in the peripheral circuit region, the plurality of bit line structures extending in a first direction and being spaced apart from each other in a second direction that is perpendicular to the first direction by first grooves that extend in the first direction;
    forming spacers on sidewalls of the bit line structures and sidewalls of the gate structure;
    forming a sacrificial layer in the first grooves, wherein the sacrificial layer covers top surfaces of the bit line structures and the gate structure; and
    planarizing the sacrificial layer until the top surfaces of the bit line structures and the gate structure are exposed.

2. The method of claim 1, wherein the planarizing the sacrificial layer comprises performing a chemical mechanical polishing (CMP) process.

3. The method of claim 2,
    wherein the CMP process is performed with a slurry composition used to polish an organic material layer; and
    wherein the slurry composition includes an abrasive agent having a weight ratio of about 0.001 wt % to about 5 wt %, an oxidizer having a weight ratio of about 0.1 wt % to about 5 wt %, an abrasive adjuster having a weight ratio of about 0 wt % to about 5 wt %, a surfactant having a weight ratio of about 0 wt % to about 3 wt %, a pH adjuster having a weight ratio of about 0 wt % to about 3 wt %, and de-ionized water having a weight ratio of about 79 wt % to about 99.889 wt %.

4. The method of claim 3, wherein the slurry composition has a pH of about 2.0 to about 5.0.

5. The method of claim 1, wherein the sacrificial layer comprises an organic compound material that includes a hydrocarbon compound material containing an aromatic ring or that includes a derivative of the hydrocarbon compound material.

6. The method of claim 5, wherein the sacrificial layer has a carbon content of about 85 wt % to about 99 wt % on the basis of a total weight of the organic compound material.

7. The method of claim 1, wherein the forming the sacrificial layer comprises:
coating a spin-on hardmask (SOH) material using a spin coating process to form an SOH layer; and
curing the SOH layer using a baking process.

8. The method of claim 7, wherein the baking process is performed at a temperature of about 300 degrees Celsius to about 550 degrees Celsius.

9. The method of claim 1,
wherein the spacers include a first spacer formed on sidewalls of the bit line structures and a second spacer formed on the first spacer; and
wherein the first spacer comprises a nitride material and the second spacer comprises an oxide material.

10. The method of claim 1, further comprising:
patterning the planarized sacrificial layer to form a plurality of second grooves which are separated from each other in the first direction;
forming fence insulation layers on sidewalls of the second grooves; and
removing the planarized sacrificial layer to form a plurality of third grooves between the fence insulation layers,
wherein the plurality of third grooves are formed to be separate from each other in the first direction and in the second direction.

11. The method of claim 1, wherein a semiconductor device comprises a three-dimensional memory array.

12. The method of claim 10, further comprising:
forming a doped polysilicon layer on the third grooves, the doped polysilicon layer being electrically connected to the substrate;
etching back the doped polysilicon layer to form polysilicon patterns in the third grooves; and
forming a metal layer on the bit line structures, the spacer, and the fence insulation layers.

13. A method of fabricating a semiconductor device, the method comprising:
providing a substrate having a cell region and a peripheral circuit region;
forming a plurality of bit line structures on the substrate in the cell region and a gate structure having the same structure as each of the bit line structures on the substrate in the peripheral circuit region, the plurality of bit line structures extending in a first direction and being spaced apart from each other in a second direction that is perpendicular to the first direction by first grooves that extend in the first direction;
forming multi-layered spacers on sidewalls of the bit line structures and the gate structure;
forming an organic material layer in the first grooves, wherein the organic material layer covers top surfaces of the bit line structures and the gate structure; and
planarizing the organic material layer using a chemical mechanical polishing (CMP) process to reduce a level difference of the organic material layer between the cell region and the peripheral circuit region.

14. The method of claim 13, wherein the forming the organic material layer comprises:
coating a spin-on hardmask (SOH) material using a spin coating process to form an SOH layer; and
curing the SOH layer using a baking process.

15. The method of claim 13,
wherein the CMP process is performed with a slurry composition having a pH of about 2.0 to about 5.0; and
wherein the slurry composition includes an abrasive agent having a weight ratio of about 0.001 wt % to about 5 wt %, an oxidizer having a weight ratio of about 0.1 wt % to about 5 wt %, an abrasive adjuster having a weight ratio of about 0 wt % to about 5 wt %, a surfactant having a weight ratio of about 0 wt % to about 3 wt %, a pH adjuster having a weight ratio of about 0 wt % to about 3 wt %, and de-ionized water having a weight ratio of about 79 wt % to about 99.889 wt %.

16. A method of fabricating a semiconductor device, comprising:
providing a substrate having a cell region and a peripheral circuit region;
forming a plurality of bit line structures on the substrate in the cell region and a plurality of gate structures in the peripheral circuit region, wherein the plurality of bit line structures are separated by a plurality of grooves extending in a same direction as the plurality of bit line structures, and wherein the plurality of gate structures have a same height and a different pitch as the plurality of bit line structures;
forming a sacrificial layer in the plurality of grooves, wherein the sacrificial layer is on top surfaces of the bit line structures and the gate structure; and
planarizing the sacrificial layer until the top surfaces of the bit line structures and the gate structure are exposed.

17. The method of claim 16, wherein the planarizing the sacrificial layer comprises performing a chemical mechanical polishing (CMP) process.

18. The method of claim 17,
wherein the CMP process is performed with a slurry composition used to polish an organic material layer; and
wherein the slurry composition includes an abrasive agent having a weight ratio of about 0.001 wt % to about 5 wt %, an oxidizer having a weight ratio of about 0.1 wt % to about 5 wt %, an abrasive adjuster having a weight ratio of about 0 wt % to about 5 wt %, a surfactant having a weight ratio of about 0 wt % to about 3 wt %, a pH adjuster having a weight ratio of about 0 wt % to about 3 wt %, and de-ionized water having a weight ratio of about 79 wt % to about 99.889 wt %.

19. The method of claim 18, wherein the slurry composition has a pH of about 2.0 to about 5.0.

20. The method of claim 16, wherein the sacrificial layer comprises an organic compound material that includes a hydrocarbon compound material containing an aromatic ring or that includes a derivative of the hydrocarbon compound material, wherein the sacrificial layer has a carbon content of about 85 wt % to about 99 wt % on the basis of a total weight of the organic compound material.

* * * * *